(12) United States Patent
Calafiore et al.

(10) Patent No.: US 11,543,584 B2
(45) Date of Patent: Jan. 3, 2023

(54) INORGANIC MATRIX NANOIMPRINT LITHOGRAPHS AND METHODS OF MAKING THEREOF WITH REDUCED CARBON

(71) Applicant: META PLATFORMS TECHNOLOGIES, LLC, Menlo Park, CA (US)

(72) Inventors: Giuseppe Calafiore, Woodinville, WA (US); Tingling Rao, Bellevue, WA (US); Ankit Vora, Bothell, WA (US); Peter Topalian, Seattle, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 3 days.

(21) Appl. No.: 17/364,678

(22) Filed: Jun. 30, 2021

(65) Prior Publication Data
US 2022/0019015 A1 Jan. 20, 2022

Related U.S. Application Data

(60) Provisional application No. 63/051,761, filed on Jul. 14, 2020.

(51) Int. Cl.
*G03F 7/00* (2006.01)
*F21V 8/00* (2006.01)

(52) U.S. Cl.
CPC ......... *G02B 6/0065* (2013.01); *G02B 6/0016* (2013.01); *G02B 6/0038* (2013.01); *G03F 7/001* (2013.01); *G03F 7/0002* (2013.01)

(58) Field of Classification Search
CPC .. G02B 6/0016; G02B 6/0038; G02B 6/0065; G02B 5/1852; G02B 5/1866; G02B 5/18; G02B 2027/0174; G02B 27/0172; G03F 7/0002; G03F 7/001; G03F 7/0047; G03F 7/027; G03F 7/038
See application file for complete search history.

(56) References Cited

U.S. PATENT DOCUMENTS 7,050,233 B2 * 5/2006 Nikolov ............... G02B 5/1809
359/489.06
7,114,938 B2 * 10/2006 Chou ................... B29C 59/022
425/150
7,211,214 B2 * 5/2007 Chou ................... B29C 59/022
264/293

(Continued)

OTHER PUBLICATIONS

Carlos P.H., et al., "A Route for Fabricating Printable Photonic Devices with Sub-10 nm Resolution," Nanotechnology, Institute of Physics Publishing, vol. 24, No. 6, Jan. 22, 2013, 6 pages.

(Continued)

*Primary Examiner* — Andrew Jordan
(74) *Attorney, Agent, or Firm* — Morgan, Lewis & Bockius LLP

(57) ABSTRACT

The disclosure provides high refractive index ceramic material nanoimprint lithography (NIL) gratings having a relatively lower amount of carbon compared to traditional NIL gratings, and methods of making and using thereof, and devices including such gratings. The ceramic material includes one or more of titanium oxide, zirconium oxide, hafnium oxide, tungsten oxide, zinc tellurium, gallium phosphide, or any combination or derivative thereof.

20 Claims, 25 Drawing Sheets

(56) References Cited

U.S. PATENT DOCUMENTS

| | | | | |
|---|---|---|---|---|
| 7,283,571 | B2* | 10/2007 | Wang | H04B 10/503 372/32 |
| 7,670,770 | B2* | 3/2010 | Chou | G01N 21/6428 435/6.12 |
| 7,758,794 | B2* | 7/2010 | Chou | G03F 9/7053 264/2.7 |
| 7,961,393 | B2* | 6/2011 | Perkins | G02B 5/3058 359/485.05 |
| 8,389,048 | B2* | 3/2013 | Fukushima | G11B 5/855 427/131 |
| 8,410,353 | B2* | 4/2013 | Petti | H01L 31/02167 136/258 |
| 8,611,007 | B2* | 12/2013 | Davis | B82Y 20/00 359/485.05 |
| 8,652,828 | B2* | 2/2014 | Austin | B81C 1/00071 536/23.1 |
| 8,722,327 | B2* | 5/2014 | Cao | C12Q 1/6874 536/23.1 |
| 8,755,113 | B2* | 6/2014 | Gardner | G02B 5/3075 359/485.05 |
| 8,822,260 | B2* | 9/2014 | Petti | H01L 31/02168 438/71 |
| 8,913,320 | B2* | 12/2014 | Davis | G02B 5/3058 359/485.05 |
| 9,224,414 | B2* | 12/2015 | Fukushima | G11B 5/855 |
| 9,389,217 | B2* | 7/2016 | Austin | G01N 33/48721 |
| 9,523,805 | B2* | 12/2016 | Davis | B82Y 20/00 |
| 9,678,038 | B2* | 6/2017 | Austin | B01L 3/502707 |
| 10,161,001 | B2* | 12/2018 | Austin | G01N 27/44791 |
| 10,274,461 | B2* | 4/2019 | Austin | G01N 21/6428 |
| 10,649,119 | B2* | 5/2020 | Mohanty | G02B 6/00 |
| 10,768,142 | B2* | 9/2020 | Austin | G01N 21/648 |
| 10,809,448 | B1* | 10/2020 | Calafiore | G03F 7/0002 |
| 10,845,596 | B2* | 11/2020 | Lee | G02B 6/0016 |
| 10,962,703 | B1* | 3/2021 | Lane | G02B 6/0065 |
| 11,137,603 | B2* | 10/2021 | Zhang | G02B 6/0035 |
| 11,150,394 | B2* | 10/2021 | Mohanty | G02B 27/0172 |
| 11,249,230 | B2* | 2/2022 | Mohanty | G03F 7/0002 |
| 11,391,950 | B2* | 7/2022 | Calafiore | G02B 27/0172 |
| 2004/0156108 | A1* | 8/2004 | Chou | B29C 59/022 359/566 |
| 2008/0135914 | A1* | 6/2008 | Krishna | H01L 29/40114 257/E29.302 |
| 2008/0230947 | A1* | 9/2008 | Chou | B82Y 40/00 264/225 |
| 2019/0227316 | A1* | 7/2019 | Lee | G02B 5/1857 |
| 2019/0243237 | A1* | 8/2019 | Watkins | C09D 11/52 |
| 2020/0018875 | A1* | 1/2020 | Mohanty | H01L 21/3065 |
| 2020/0247016 | A1* | 8/2020 | Calafiore | C23C 16/40 |
| 2020/0247073 | A1* | 8/2020 | Rao | G02B 1/04 |
| 2020/0249568 | A1* | 8/2020 | Rao | C09D 163/00 |
| 2020/0264353 | A1* | 8/2020 | Mohanty | G02B 6/0016 |
| 2020/0333527 | A1* | 10/2020 | Calafiore | B81C 1/00103 |
| 2020/0400951 | A1* | 12/2020 | Zhang | G02B 6/0035 |
| 2020/0408970 | A1* | 12/2020 | Calafiore | G02B 6/0016 |
| 2020/0409151 | A1* | 12/2020 | Calafiore | G02B 27/4272 |
| 2021/0397009 | A1* | 12/2021 | Zhang | G02B 6/0016 |
| 2022/0019015 | A1* | 1/2022 | Calafiore | G02B 6/0038 |
| 2022/0075109 | A1* | 3/2022 | Mohanty | G02B 5/1857 |
| 2022/0194954 | A1* | 6/2022 | Takeda | H01L 51/0072 |

OTHER PUBLICATIONS

European Search Report for European Application No. 21184777.7, dated Dec. 9, 2021, 7 pages.

Ganesan R., et al., "Direct Patterning of TiO2 Using Step-and-Flash Imprint Lithography," ACS NANO, vol. 6, No. 2, Feb. 28, 2012, pp. 1494-1502.

Guo L.J., et al., "Topical Review; Recent Progress in Nanoimprint Technology and its Applications," Journal of Physics D: Applied Physics, Institute of Physics Publishing, vol. 37, No. 11, Jun. 7, 2004, pp. R123-R141.

Solmaz M., et al., "Patterning Chalcogenide Glass by Direct Resist-Free Thermal Nanoimprint" Journal of Vacuum Science and Technology: Part B, AVS/AIP, Mar. 28, 2008, pp. 606-610.

Verschuuren A.M., et al., "Substrate Conformal Imprint Lithography: Functional Resists, Overlay Performance, and Volume Production Results," Proceedings of SPIE, vol. 10958, Mar. 26, 2019, 9 pages.

Weiss D., et al., "All-Inorganic Thermal Nanoimprint Process," Journal of Vacuum Science and Technology: Part B, AVS/AIP, vol. 28, No. 4, Jul. 16, 2010, pp. 823-828.

Yang K.Y., et al., "Direct Indium Tin Oxide Patterning using Thermal Nanoimprint Lithography for Highly Efficient Optoelectronic Devices," Journal of Vacuum Science and Technology: Part B, AVS / AIP, Melville, vol. 27, No. 6, Dec. 3, 2009 pp. 2786-2789.

Yu C.C., et al., "Nanoimprint Technology for Patterning Functional Materials and its Applications," Microelectronic Engineering, Elsevier Publishers, vol. 132, Oct. 23, 2014, pp. 98-119.

Zhang P., et al., "Fabrication and Characterization of Ge_20As_20Se_15Te_45 Chalcogenide Glass for Photonic Crystal by Nanoimprint Lithography," Optical Materials Express, vol. 6, No. 6, Jun. 1, 2016, 8 pages.

* cited by examiner

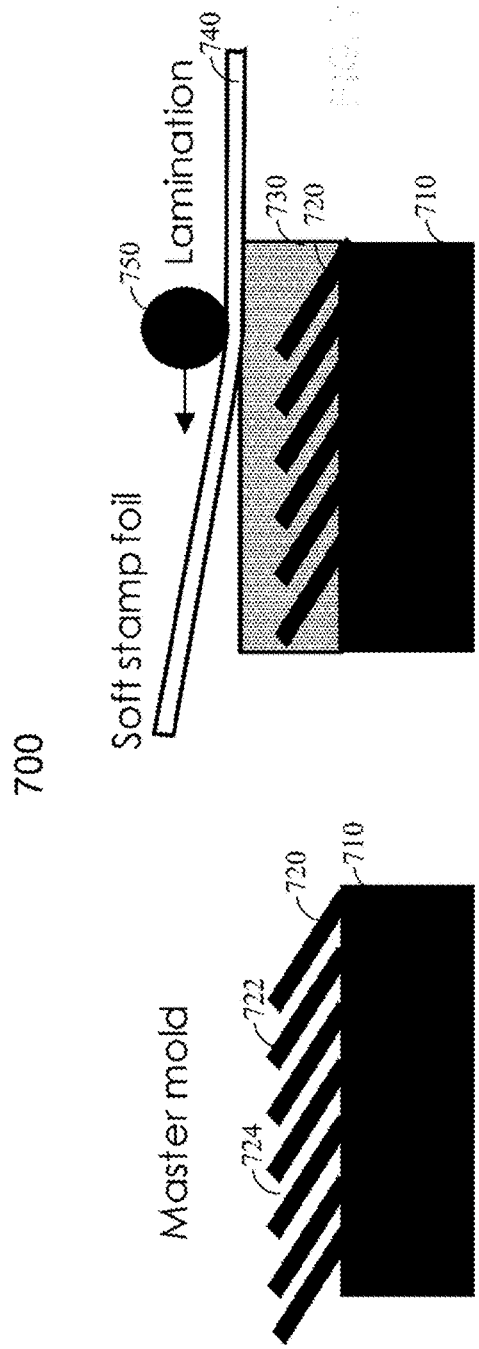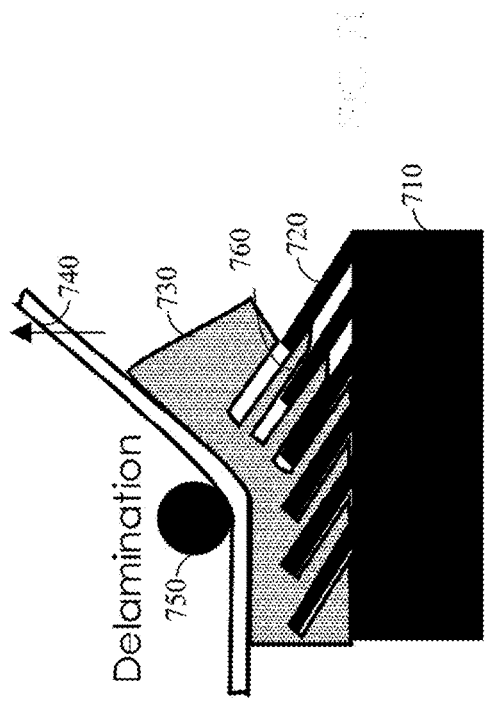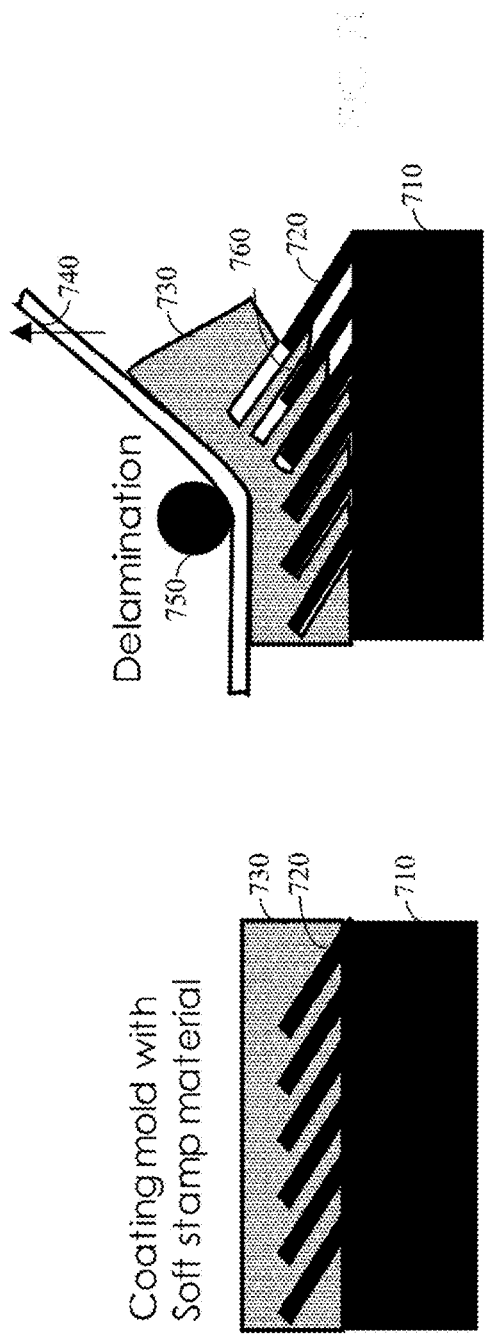

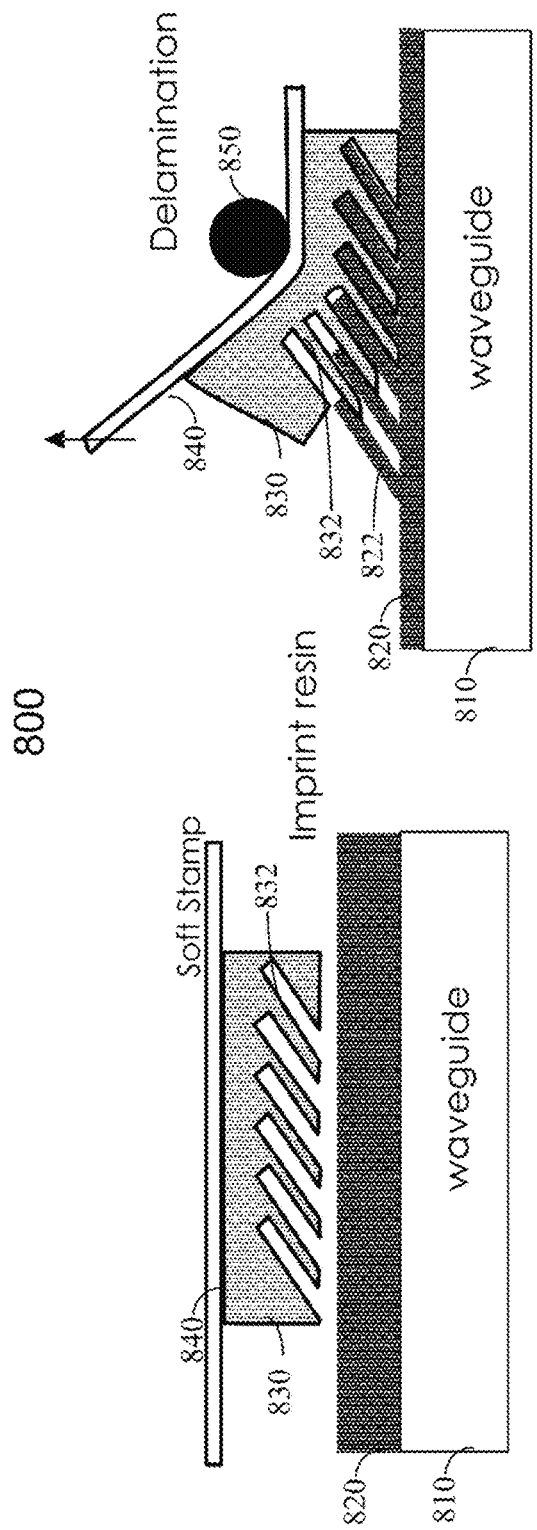
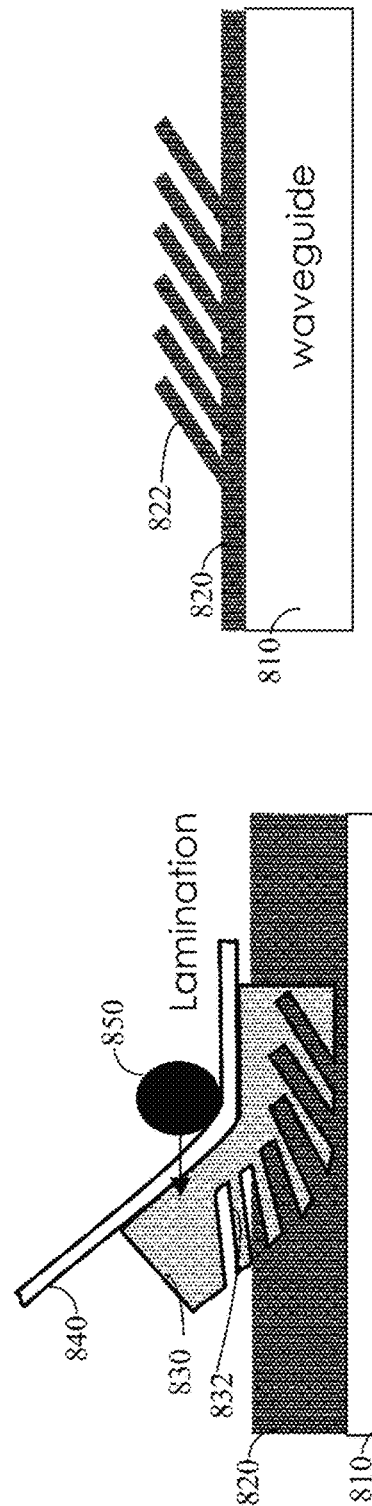
FIG. 8A
FIG. 8B
FIG. 8C
FIG. 8D

Estimated RI of TiOx NPs film, 100% loading (no resin)
Random packing density
$\gamma_{NP} = 0.64$   $\gamma_{air} = 0.36$
$n_{film} = \sqrt{0.64 \cdot 2.21^2 + 0.36 \cdot 1^2} = 1.87$
Perfect packing density
$\gamma_{NP} = 0.74$   $\gamma_{air} = 0.26$
$n_{film} = \sqrt{0.74 \cdot 2.21^2 + 0.26 \cdot 1^2} = 1.97$
FIG. 19B

| Model inputs | Value | Notes |
|---|---|---|
| ZrO2 NP radius | 2.36 nm | Measured (TEM) |
| Ligands length | ~0.35 ± 0.08 nm | Rytov model fit from RI measurements on NP film |
| ZrO2 Core RI | 2.17 | Found in literature for crystalline $ZrO_2$ NPs |
| Ligands RI | 1.5 | Best guess (little effect on final RI) |
| Density core | 5.68 gr/cm³ | Crystalline $ZrO_2$ |
| Density ligands | 1 gr/cm³ | Best guess (little effect on final RI) |
| Pure UVA2 RI | 1.50 | Ellipsometer fit |
| Inorganic in UVA2 backbone | ~40% | Extracted from shrinkage tests |
| Vol shrinkage UVA2+NPs | 33% | Extracted from xSEM |
| RI of ALD TiO2 | 2.2 | Ellipsometer fit on pure ALD TiOx film |
| ZrO2 NP loading | ~66 wt% | 80 wt% of 50% PGMEA and 50% $ZrO_2$ PCPR |

FIG. 22

INORGANIC MATRIX NANOIMPRINT LITHOGRAPHS AND METHODS OF MAKING THEREOF WITH REDUCED CARBON

RELATED APPLICATIONS

This application claims the benefit of, and priority to, U.S. Provisional Patent Application Ser. No. 63/051,761, filed on Jul. 14, 2020, incorporated by reference herein in its entirety.

BACKGROUND

An artificial reality system, such as a head-mounted display (HMD) or heads-up display (HUD) system, generally includes a near-eye display (e.g., a headset or a pair of glasses) configured to present content to a user via an electronic or optic display within, for example, about 10-20 mm in front of the user's eyes. The near-eye display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted surface-relief grating. To achieve desired performance, such as high efficiency, low artifact, and angular selectivity, deep surface-relief gratings with large slanted angles and wide ranges of grating duty cycles may be used. However, fabricating the slanted surface-relief grating with the desired profile at a high fabrication speed and high yield remains a challenging task.

SUMMARY

This disclosure relates generally to waveguide-based near-eye display system. More specifically, this disclosure relates to curable formulation with high refractive index and its application in nanoimprint lithographic (NIL) techniques, including but not limited to UV-NIL techniques, for manufacturing surface-relief structures, such as slanted or non-slanted surface-relief gratings used in a near-eye display system.

The disclosure provides a nanoimprint lithography (NIL) grating comprising a ceramic material having a relative amount of carbon of about 10% or less. In some embodiments, the relative amount of carbon in the ceramic material is about 9% or less, about 8% or less, about 7% or less, about 6% or less, about 5% or less, about 4% or less, about 3% or less, about 2% or less, or about 1% or less. In some embodiments, the ceramic material is substantially free of organic material. In some embodiments, the ceramic material comprises one or more of titanium oxide, zirconium oxide, hafnium oxide, tungsten oxide, zinc tellurium, gallium phosphide, or any combination or derivative thereof. In some embodiments, the grating has a duty cycle ranging from 10% to 90%. In some embodiments, the grating has a duty cycle ranging from 30% to 90%. In some embodiments, the grating has a duty cycle ranging from 35% to 90%. In some embodiments, the grating is a non-slanted grating. In some embodiments, the grating is a slanted grating. In some embodiments, a slant angle ranges from more than 0° to about 70°. In some embodiments, a slant angle is greater than 30°. In some embodiments, a slant angle is greater than 35°. In some embodiments, the grating has a depth from 30 nm to 450 nm. In some embodiments, the grating has a depth from 50 nm to 350 nm. In some embodiments, the grating has a depth from 75 nm to 250 nm. In some embodiments, the grating has a depth greater than 100 nm and lower than 500 nm. In some embodiments, the grating has an aspect ratio from 0.5:1 to 6:1. In some embodiments, the grating has an aspect ratio from 1:1 to 5:1. In some embodiments, the grating has an aspect ratio greater than 3:1 and lower than 8:1. In some embodiments, the ceramic material has a refractive index ranging from 1.90 to 2.25. In some embodiments, the refractive index is measured at 460 nm.

The disclosure also provides a process for making an NIL grating described herein, comprising: providing a precursor material comprising a base resin component and a plurality of nanoparticles; imprinting the precursor material into a first precursor NIL grating; optionally subjecting the first precursor NIL grating to additional processing steps to generate one or more subsequent precursor NIL gratings; and subjecting the first precursor NIL grating or the one or more subsequent precursor NIL gratings to at least an increased temperature. In some embodiments, the base resin component is UV curable. In some embodiments, the base resin component is light-sensitive. In some embodiments, the base resin component comprises an organic material. In some embodiments, the base resin component comprises one or more crosslinkable monomers, one or more polymerizable monomers, or both. In some embodiments, the crosslinkable monomers or the polymerizable monomers comprise one or more crosslinkable or polymerizable moieties. In some embodiments, the crosslinkable or polymerizable moieties are selected from an ethylenically unsaturated group, an oxirane ring, and a heterocyclic group. In some embodiments, the crosslinkable or polymerizable moieties are selected from vinyl, allyl, epoxide, acrylate, and methacrylate. In some embodiments, the crosslinkable or polymerizable moieties are selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate. In some embodiments, the crosslinkable monomers or the polymerizable monomers comprise one or more linking groups selected from —$C_{1-10}$ alkyl-, —O—$C_{1-10}$ alkyl-, —$C_{1-10}$ alkenyl-, —O—$C_{1-10}$ alkenyl-, —$C_{1-10}$ cycloalkenyl-, —O—$C_{1-10}$ cycloalkenyl-, —$C_{1-10}$ alkynyl-, —O—$C_{1-10}$ alkynyl-, —$C_{1-10}$ aryl-, —O—$C_{1-10}$—, -aryl-, —O—, —S—, —C(O)—, C(O)O—, —OC(O)—, —OC(O)O—, —N($R_b$)—, —C(O)N($R_b$)—, —N($R_b$)C(O)—, —OC(O)N($R_b$)—, —N($R_b$)C(O)O—, —SC(O)N($R_b$)—, —N($R_b$)C(O)S—, N($R_b$)C(O)N($R_b$)—, —N($R_b$)C(N$R_b$)N($R_b$)—, —N($R_b$)S(O)$_w$—, S(O)$_w$N($R_b$)—, —S(O)$_w$O—, —OS(O)$_w$—, —OS(O)$_w$O—, —O(O)P(O$R_b$)O—, (O)P(O—)$_3$, —O(S)P(O$R_b$)O—, and (S)P(O—)$_3$, wherein w is 1 or 2, and $R_b$ is independently hydrogen, optionally substituted alkyl, or optionally substituted aryl. In some embodiments, the base resin component comprises one or more fluorinated compounds. In some embodiments, the base resin component further comprises one or more solvents. In some embodiments, the one or more solvents are selected from 2-(1-methoxy)propyl acetate, propylene glycol monomethyl ether acetate, propylene glycol methyl ether, ethyl acetate, xylene, and toluene. In some embodiments, the one or more solvents is ethyl lactate. In some embodiments, the base resin component further comprises one or more of a photo radical generator, a photo acid generator, or both. In some embodiments, the base resin component further comprises one or more inhibitors. In some embodiments, the base resin component includes silicon. In some embodiments, the plurality of nanoparticles comprises one or more of titanium oxide, zirconium oxide, hafnium oxide, tungsten oxide, zinc tellurium, gallium phosphide, or any combination or derivative thereof. In some embodiments, the plurality of nanoparticles comprises titanium oxide nanoparticles. In some embodiments, the plurality of nanoparticles comprises zirconium oxide nanoparticles. In some embodiments, the plurality of nanoparticles comprises a mixture of titanium oxide nanoparticles and zirconium oxide nanoparticles. In some embodiments, the plurality of nanoparticles comprises a plurality of surface-modified nanoparticles, a plurality of capped nanoparticles, or both. In some embodiments, the surface-modified nanoparticles, the capped nanoparticles, or both, comprise a substantially inorganic core, and a substantially organic shell. In some embodiments, the substantially organic shell comprises one or more crosslinkable or polymerizable moieties. In some embodiments, the one or more crosslinkable or polymerizable moieties are linked to the substantially inorganic core. In some embodiments, the crosslinkable or polymerizable moieties comprise one or more of an ethylenically unsaturated group, an oxirane ring, or a heterocyclic group. In some embodiments, the crosslinkable or polymerizable moieties comprise one or more of vinyl, allyl, epoxide, acrylate, and methacrylate. In some embodiments, the crosslinkable or polymerizable moieties comprise one or more of optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate. In some embodiments, the crosslinkable or polymerizable moieties comprise one or more linking groups selected from —Si(—O—)$_3$, —C$_{1-10}$ alkyl-, —O—C$_{1-10}$ alkyl-, —C$_{1-10}$ alkenyl-, —O—C$_{1-10}$ alkenyl-, —C$_{1-10}$ cycloalkenyl-, —O—C$_{1-10}$ cycloalkenyl-, —C$_{1-10}$ alkynyl-, —O—C$_{1-10}$ alkynyl-, —C$_{1-10}$ aryl-, —O—C$_{1-10}$-, -aryl-, —O—, —S—, —C(O)—, C(O)O—, —OC(O)—, —OC(O)O—, —N(R$_b$)—, —C(O)N(R$_b$)—, —N(R$_b$)C(O)—, —OC(O)N(R$_b$)—, —N(R$_b$)C(O)O—, —SC(O)N(R$_b$)—, —N(R$_b$)C(O)S—, —N(R$_b$)C(O)N(R$_b$)—, —N(R$_b$)C(NR$_b$)N(R$_b$)—, —N(R$_b$)S(O)$_w$—, S(O)$_w$N(R$_b$)—, —S(O)$_w$O—, —OS(O)$_w$—, —OS(O)$_w$O—, —O(O)P(OR$_b$)O—, (O)P(O—)$_3$, —O(S)P(OR$_b$)O—, and (S)P(O—)$_3$, wherein w is 1 or 2, and R$_b$ is independently hydrogen, optionally substituted alkyl, or optionally substituted aryl. In some embodiments, the substantially organic shell comprises one or more of an organosilane or a corresponding organosilanyl substituent, an organoalcohol or a corresponding organoalkoxy substituent, or an organocarboxylic acid or a corresponding organocarboxylate substituent. In some embodiments, the organosilane is selected from n-propyltrimethoxysilane, n-propyltriethoxysilane, n-octyltrimethoxysilane, n-octyltriethoxysilane, phenyltrimethoxysilane, 2-methoxy(polyethyleneoxy)propyltrimethoxysilane, methoxy(triethyleneoxy)propyltrimethoxysilane, 3-aminopropyltrimethoxysilane, 3-mercaptopropyltrimethoxysilane, 3-(methacryloyloxy)propyl trimethoxysilane, 3-isocyanatopropyltriethoxysilane, 3-isocyanatopropyltrimethoxysilane, and glycidoxypropyltrimethoxysilane. In some embodiments, the organoalcohol is selected from heptanol, hexanol, octanol, benzyl alcohol, phenol, ethanol, propanol, butanol, oleylalcohol, dodecylalcohol, octadecanol and triethylene glycol monomethyl ether. In some embodiments, the organocarboxylic acid is selected from octanoic acid, acetic acid, propionic acid, 2-2-(2-methoxyethoxy)ethoxyacetic acid, oleic acid, and benzoic acid. In some embodiments, the substantially organic shell comprises one or more of 3-(methacryloyloxy)propyl trimethoxysilane, 3-(methacryloyloxy)propyl dimethoxysilyl, or 3-(methacryloyloxy)propyl methoxysiloxyl. In some embodiments, the diameter of a substantially inorganic core ranges from about 1 nm to about 25 nm. In some embodiments, the diameter of a substantially inorganic core is selected from about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm. In some embodiments, the diameter of a substantially inorganic core is measured by transmission electron microscopy (TEM). In some embodiments, the diameter of a surface-modified nanoparticle, a capped nanoparticle, or both, including a substantially organic shell, ranges from about 5 nm to about 100 nm. In some embodiments, the diameter of a surface-modified nanoparticle, a capped nanoparticle, or both, including a substantially organic shell, ranges from about 10 nm to about 50 nm. In some embodiments, the diameter of a surface-modified nanoparticle, a capped nanoparticle, or both, including a substantially organic shell, is selected from about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm, about 26 nm, about 27 nm, about 28 nm, about 29 nm, about 30 nm, about 31 nm, about 32 nm, about 33 nm, about 34 nm, about 35 nm, about 36 nm, about 37 nm, about 38 nm, about 39 nm, about 40 nm, about 41 nm, about 42 nm, about 43 nm, about 44 nm, about 45 nm, about 46 nm, about 47 nm, about 48 nm, about 49 nm, about 50 nm, about 51 nm, about 52 nm, about 53 nm, about 54 nm, about 55 nm, about 56 nm, about 57 nm, about 58 nm, about 59 nm, about 60 nm, about 61 nm, about 62 nm, about 63 nm, about 64 nm, about 65 nm, about 66 nm, about 67 nm, about 68 nm, about 69 nm, about 70 nm, about 71 nm, about 72 nm, about 73 nm, about 74 nm, about 75 nm, about 76 nm, about 77 nm, about 78 nm, about 79 nm, about 80 nm, about 81 nm, about 82 nm, about 83 nm, about 84 nm, about 85 nm, about 86 nm, about 87 nm, about 88 nm, about 89 nm, about 90 nm, about 91 nm, about 92 nm, about 93 nm, about 94 nm, about 95 nm, about 96 nm, about 97 nm, about 98 nm, about 99 nm, and about 100 nm. In some embodiments, the diameter of a surface-modified nanoparticle, a capped nanoparticle, or both, including a substantially organic shell, is measured by dynamic light scattering (DLS). In some embodiments, the volume fraction of the substantially inorganic core in the surface-modified nanoparticles, the capped nanoparticles, or both, ranges from about 60% to about 90%. In some embodiments, the volume fraction of the substantially inorganic core in the surface-modified nanoparticles, the capped nanoparticles, or both, is selected from about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, and about 90%. In some embodiments, the volume fraction of the substantially organic shell in the surface-modified nanoparticles, the capped nanoparticles, or both, ranges from about 10% to about 40%. In some embodiments, the volume fraction of the substantially organic shell in the surface-modified nanoparticles, the capped nanoparticles, or both, is selected from about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, and about 40%. In some embodiments, the refractive index of the plurality of nanoparticles ranges from 2.00 to 2.61. In some embodiments, the refractive index of the plurality of nanoparticles is selected from about 2.00, about 2.01, about 2.02, about 2.03, about 2.04, about 2.05, about 2.06, about 2.07, about 2.08, about 2.09, about 2.10, about 2.11, about 2.12, about 2.13, about 2.14, about 2.15, about 2.16, about 2.17, about 2.18, 2.19, about 2.20, about 2.21, about 2.22, about 2.23, about 2.24, about 2.25, about 2.26, about 2.27, about 2.28, about 2.29, about 2.30, about 2.31, about 2.32, about 2.33, about 2.34, about 2.35, about 2.36, about 2.37, about 2.38, about 2.39, about 2.40, about 2.41, about 2.42, about 2.43, about 2.44, about 2.45, about 2.46, about 2.47, about 2.48, about 2.49, about 2.50, about 2.51, about 2.52, about 2.53, about 2.54, about 2.55, about 2.56, about 2.57, about 2.58, about 2.59, about 2.60, and about 2.61. In some embodiments, the volume fraction of the plurality of nanoparticles in the precursor material ranges from about 50% to about 90%. In some embodiments, the volume fraction of the plurality of nanoparticles in the precursor material ranges from about 60% to about 80%.

The disclosure also provides a process described herein, for making an NIL grating described herein, the process further comprising a precursor material curing step after the imprinting step, wherein the curing step comprises subjecting the first precursor NIL grating to a light source to generate a second precursor NIL grating. In some embodiments, the process further comprises subjecting the first precursor NIL grating or the second precursor NIL grating to oxidative conditions. In some embodiments, the process further comprises subjecting the first precursor NIL grating or the second precursor NIL grating to a plasma source. In some embodiments, the process further comprises subjecting the first precursor NIL grating or the second precursor NIL grating to oxygen plasma. In some embodiments, the subjecting the first precursor NIL grating or the second precursor NIL grating to oxidative conditions, a plasma source, or oxygen plasma, removes all or a portion of an organic material from the precursor NIL grating. In some embodiments, substantially all of the organic material is removed from the precursor NIL grating. In some embodiments, the subjecting the first precursor NIL grating or the second precursor NIL grating to oxidative conditions, a plasma source, or oxygen plasma, is performed for between about 1 and about 10 minutes. In some embodiments, the subjecting the first precursor NIL grating or the second precursor NIL grating to oxidative conditions, a plasma source, or oxygen plasma, is performed for between about 2 and about 5 minutes. In some embodiments, the subjecting the first precursor NIL grating or the second precursor NIL grating to oxidative conditions, a plasma source, or oxygen plasma, generates a third precursor NIL grating comprising a plurality of micro- or nanovoids. The disclosure also provides a process described herein, for making an NIL grating described herein, the process further comprising a metal oxide infiltration step. The disclosure also provides a process described herein, for making an NIL grating described herein, the process further comprising an atomic layer deposition (ALD) step. In some embodiments, the ALD step is a thermal reaction. The disclosure also provides a process described herein, for making an NIL grating described herein, the process further comprising a plasma reaction process step. In some embodiments, a portion of the plurality of micro- or nanovoids is infiltrated with titanium oxide, zirconium oxide, hafnium oxide, tungsten oxide, zinc tellurium, gallium phosphide, or any combination or derivative thereof. In some embodiments, the infiltration is performed at a temperature ranging from 30° C. to 500° C. In some embodiments, the infiltration is performed at a temperature ranging from 40° C. to 70° C. In some embodiments, the metal oxide infiltration step, the atomic layer deposition step, and/or the plasma reaction process step, are each independently performed for a number of cycles ranging between 1 and 20. In some embodiments, the metal oxide infiltration step, the atomic layer deposition step, and/or the plasma reaction process step, are each independently performed for a number of cycles ranging between 5 and 10.

The disclosure also provides an optical component comprising any NIL grating described herein.

BRIEF DESCRIPTION OF THE DRAWINGS

Illustrative embodiments are described in detail below with reference to the following figures.

FIG. 6A shows a molding process. FIG. 6B shows a demolding process.

FIGS. 7A-7D illustrate an example process for fabricating a soft stamp used to make a slanted surface-relief grating according to certain embodiments. FIG. 7A shows a master mold. FIG. 7B illustrates the master mold coated with a soft stamp material layer.

FIG. 7C illustrates a lamination process for laminating a soft stamp foil onto the soft stamp material layer. FIG. 7D illustrates a delamination process, where the soft stamp including the soft stamp foil and the attached soft stamp material layer is detached from the master mold.

FIGS. 8A-8D illustrate an example process for fabricating a slanted surface-relief grating using a soft stamp according to certain embodiments. FIG. 8A shows a waveguide coated with an imprint resin layer. FIG. 8B shows the lamination of the soft stamp onto the imprint resin layer. FIG. 8C shows the delamination of the soft stamp from the imprint resin layer. FIG. 8D shows an example of an imprinted slanted grating formed on the waveguide.

In FIG. 11A, cross-sectional images illustrate an imprinted surface-relief structure before (left panel) and after (right panel) a 5 minute $O_2$ ASH step. The structure was prepared using a mixture of UVA2 and 66% by weight zirconium oxide nanoparticles, diluted to 20% in an ethyl lactate solvent prior to lamination. This dilution step allows for the preparation of a thinner film during the lamination step, such that the film can be easily imprinted leaving only a thin residual layer close to the substrate (e.g., a waveguide glass). The refractive index of the film, after evaporation of the solvent but before the $O_2$ ASH step, was 1.64.

Figure 11A:
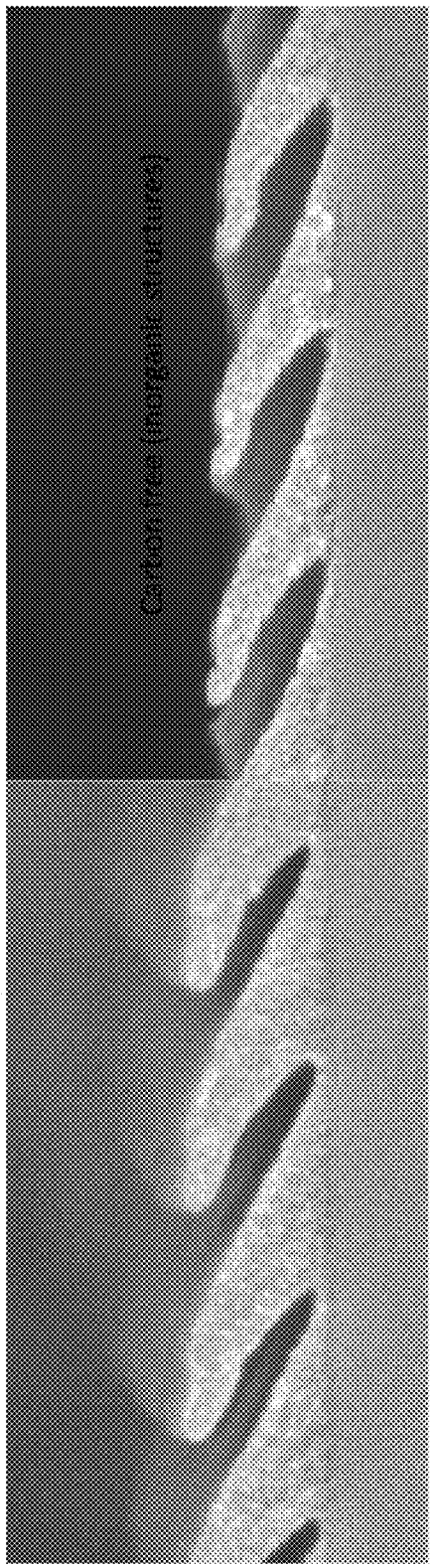
FIGS. 11A and 11B collectively illustrate an example of a surface-relief structure after removal of organic matrix material by oxygen plasma ($O_2$ ASH) and subsequent infiltration by inorganic matrix material, according to certain embodiments.

The right panel of FIG. 11A illustrates a carbon-free, inorganic structure following a 5 minute $O_2$ ASH step. Whereas the longer burn step removes the organic matrix material throughout the interior of the nanostructure, the burn also results in shrinkage of the nanostructure that result from the introduction of nanovoids between the nanoparticles. Volumetric shrinkage was calculated by measuring the line width ("LW"), or the measurement of the width at the midpoint of the nanostructure, and the height of the nanostructure. LW and height measurements were taken before (LW: 190 nm (65%); height=167 nm) and after (LW: 144 nm (49%); height=148 nm) $O_2$ ASH, with a final shrinkage of 33%. In some embodiments, shrinkage of nanostructures can be modulated depending on the ratio of nanoparticles to matrix in the final resin composition.

Figure 11B:
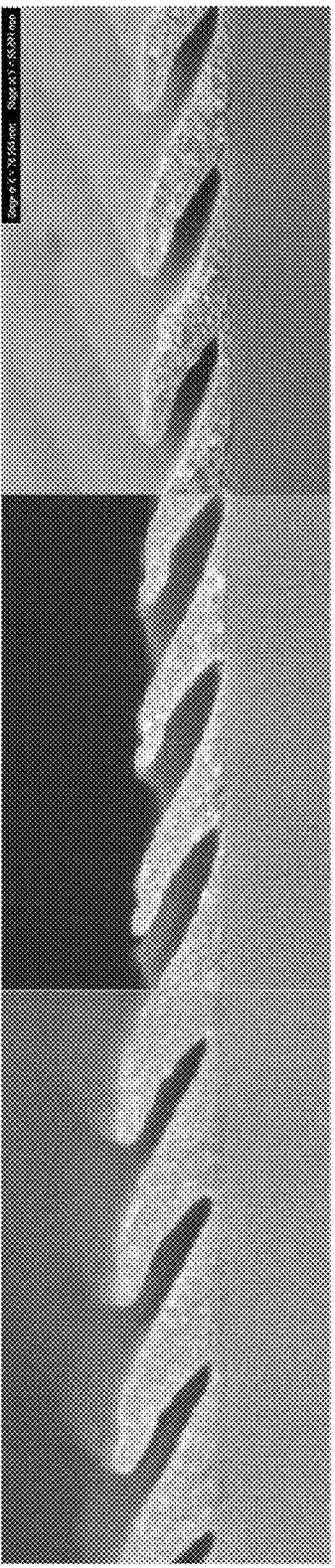

In FIG. 11B, cross-sectional images illustrate the results of titanium oxide infiltration by ALD for nanostructures prepared by $O_2$ ASH as illustrated in FIG. 11A. Notably, a visual side-by-side comparison is inconclusive as to the extent of titanium oxide infiltration into the etched nanostructures. Other methods, such as elemental inspections, can be used to determine the extent of infiltration, assess the performance of the method and validate the results.

Figure 12A:
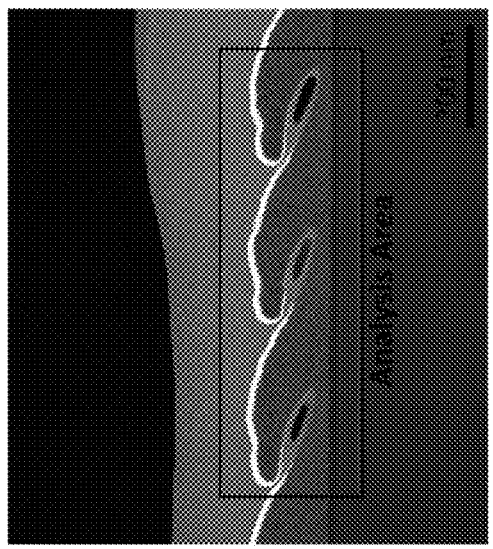
Figure 12B:
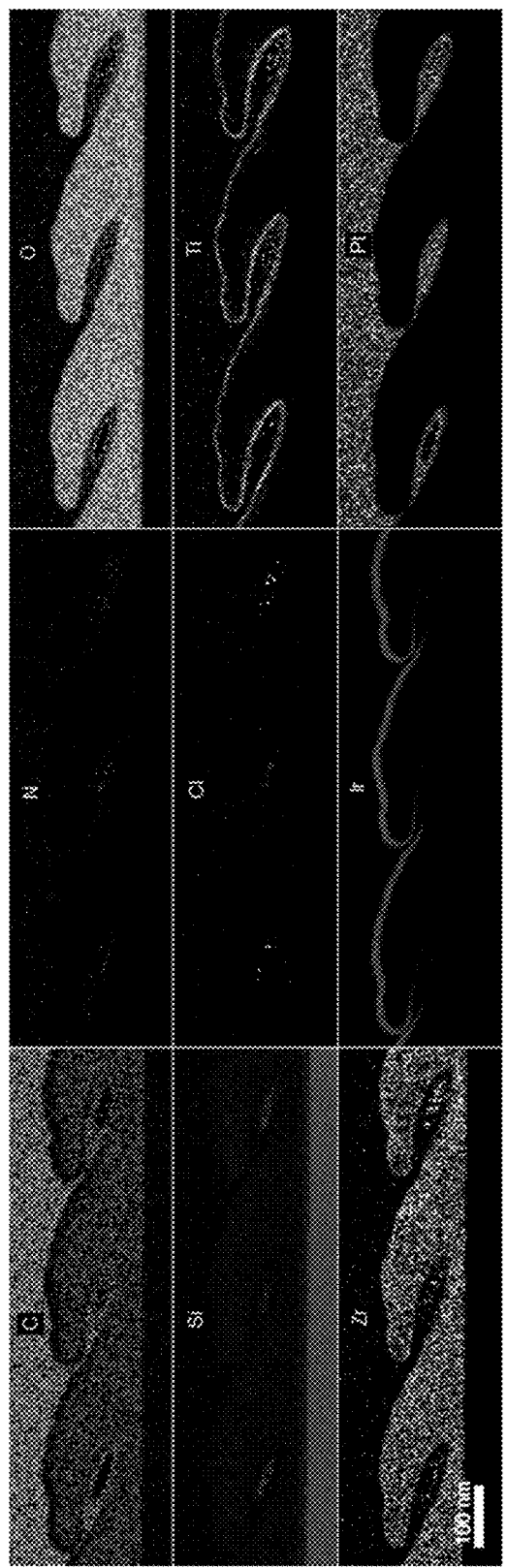

FIGS. 12A and 12B collectively illustrate the performance of an example method of fabricating a surface-relief structure according to certain embodiments. FIG. 12A is a transmission electron microscopy (TEM) image showing the cross-section of a surface-relief structure used for elemental analysis. The surface-relief structure was prepared using a mixture of UVA2 (comprising, e.g., an organic component comprising carbon and oxygen, and an inorganic component comprising silicon and oxygen) and zirconium oxide nanoparticles (comprising, e.g., an inorganic shell comprising zirconium and oxygen, and a ligand shell comprising carbon). The mixture was laminated, imprinted, and subjected to a titanium oxide infiltration step at approximately 50° C. without a prior $O_2$ ASH step (e.g., no burn step). The top and bottom layers (light gray/white and black, respectively) indicate deposits resulting from sample preparation for cross-sectioning and imaging.

FIG. 12B illustrates the cross-section of the surface-relief structure prepared and post-processed as in FIG. 12A, analyzed for a variety of elemental compositions. As described above for FIG. 12A, the mixture used for the surface-relief structure comprised an organic matrix component comprising carbon, oxygen, and silicon, and a nanoparticles component comprising zirconium, oxygen, and carbon. Elemental analysis revealed that the surface-relief structure comprised carbon (top left panel) and silicon (middle left panel) throughout the structure, indicating the presence of organic matrix. Oxygen (top right panel), provided by both the organic matrix and the nanoparticles, was also abundantly present. Finally, zirconium (bottom left panel) was abundantly present due to the high concentration of nanoparticles. Additional elements nitrogen and chlorine were measured as a control to detect noise, while elements iridium and platinum were also measured as a control. Titanium deposits were observed only on the surface of nanostructures, but not in the interior, which may suggest, without wishing to be bound by any particular theory, that the lack of a $O_2$ ASH burn step inhibited the efficacy of titanium oxide infiltration.

Figure 13A:
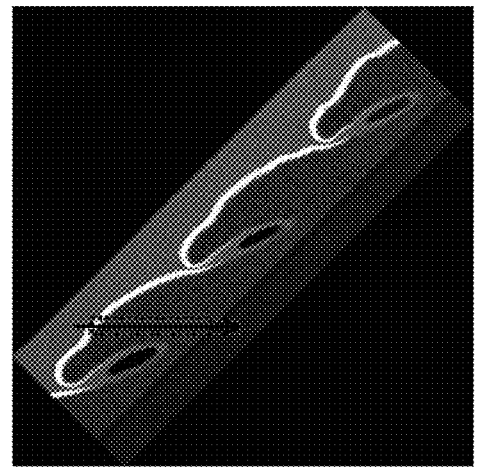
Figure 13B:
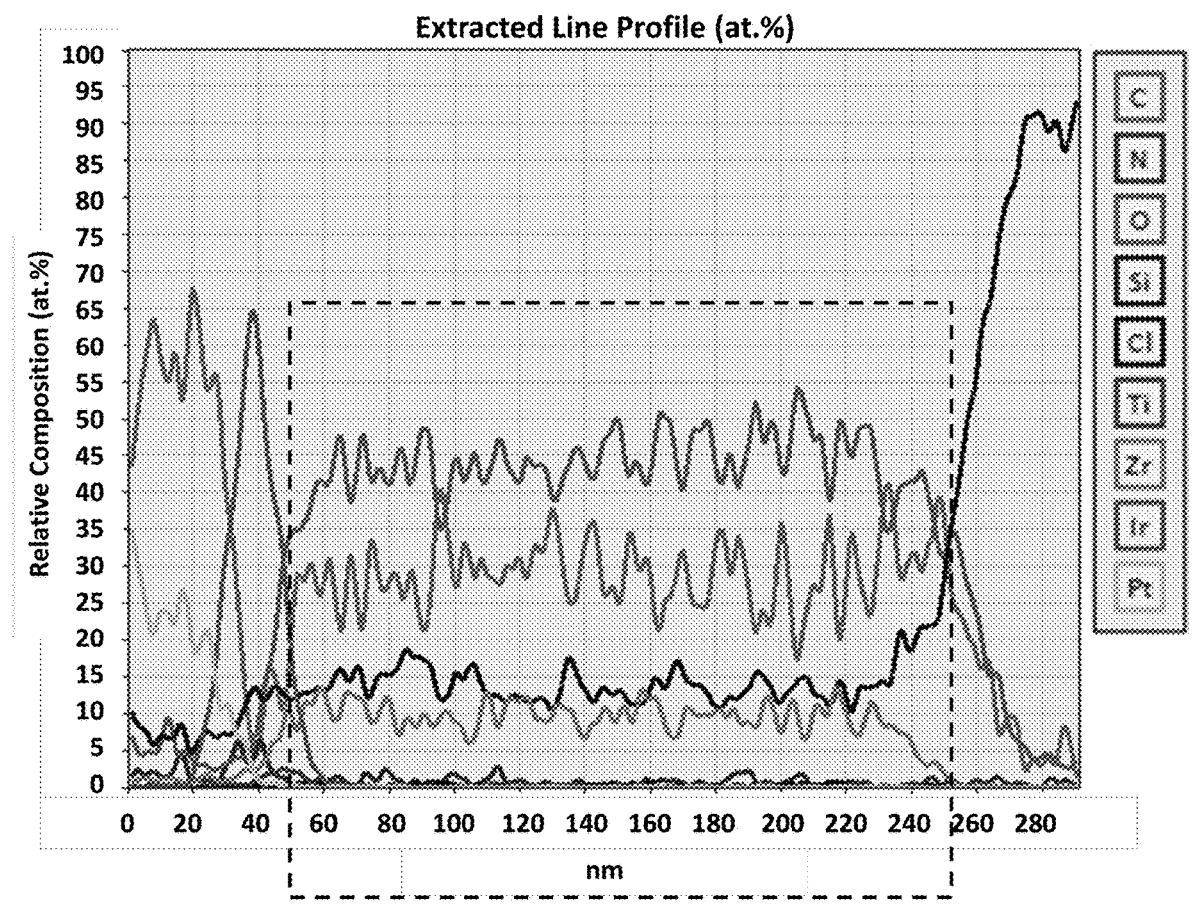

FIGS. 13A and 13B collectively illustrate the performance of an example method of fabricating a surface-relief structure according to certain embodiments. The elemental analysis performed in FIGS. 12A and 12B was plotted as an extracted line profile as percent relative composition across a demarcated cross-sectional region. FIG. 13A illustrates a rotated image of the slanted grating (e.g., the surface-relief structure) from FIG. 12A. The downward arrow denotes the region across which elemental analysis was performed, while the white dotted box denotes the region corresponding to the respective surface-relief structure. Notably, for comparison, elemental analysis was performed for regions both within and extending beyond the surface-relief structure.

FIG. 13B is a plot showing the elemental compositions for regions within (black dotted box, between approximately 50 nm and 250 nm) and extending beyond the nanostructure, corresponding to the regions denoted in FIG. 13A (white dotted box and arrow, respectively). The nanostructure comprises high levels of oxygen and carbon (approximately 45% and 30%, respectively), moderate levels of silicon and zirconium (approximately 15% and 10%, respectively), and negligible levels of titanium. These results indicate the presence of organic material and the lack of titanium oxide infiltration.

Figure 14:
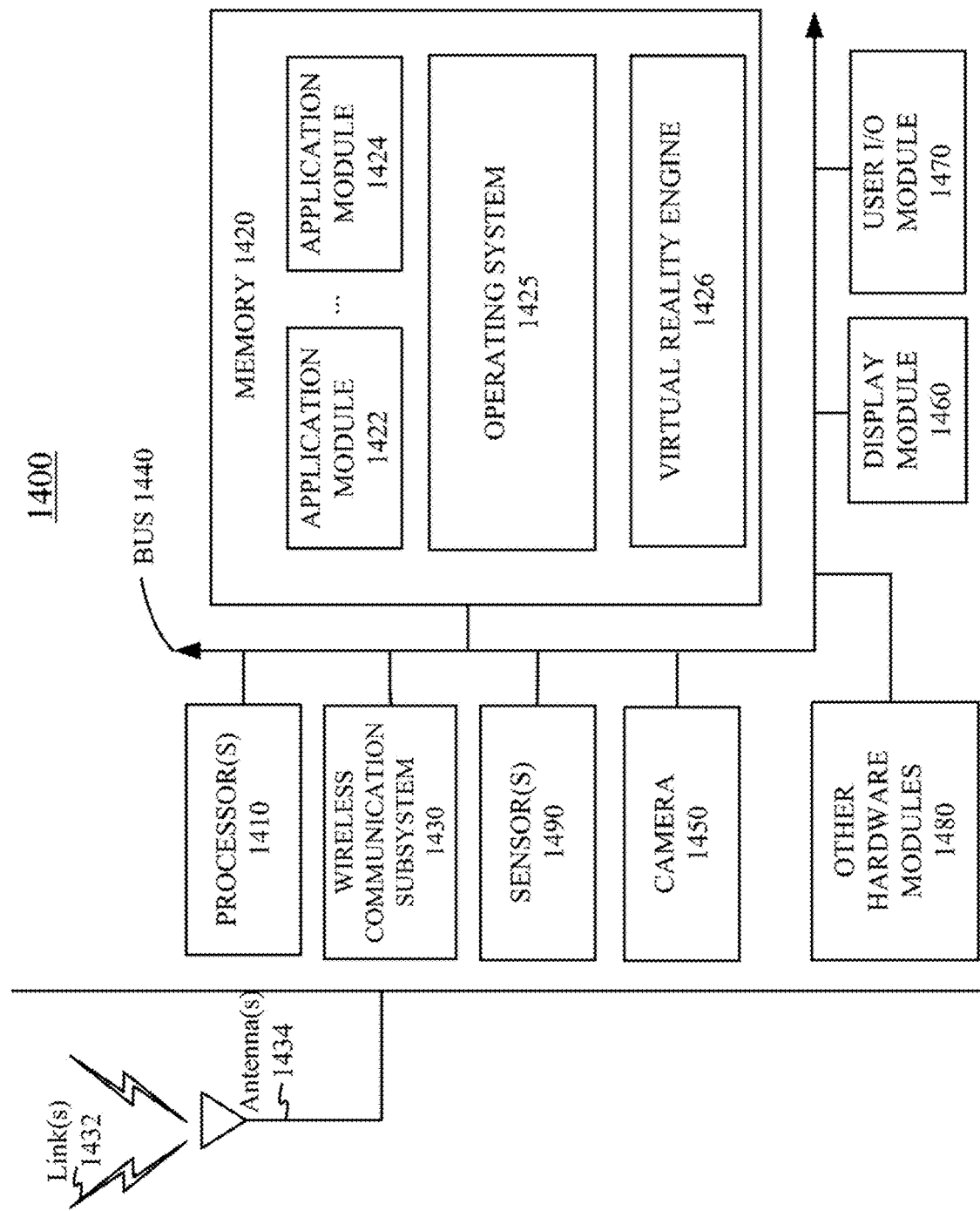

FIG. 14 is a simplified block diagram of an example electronic system of an example near-eye display according to certain embodiments.

Figure 15:
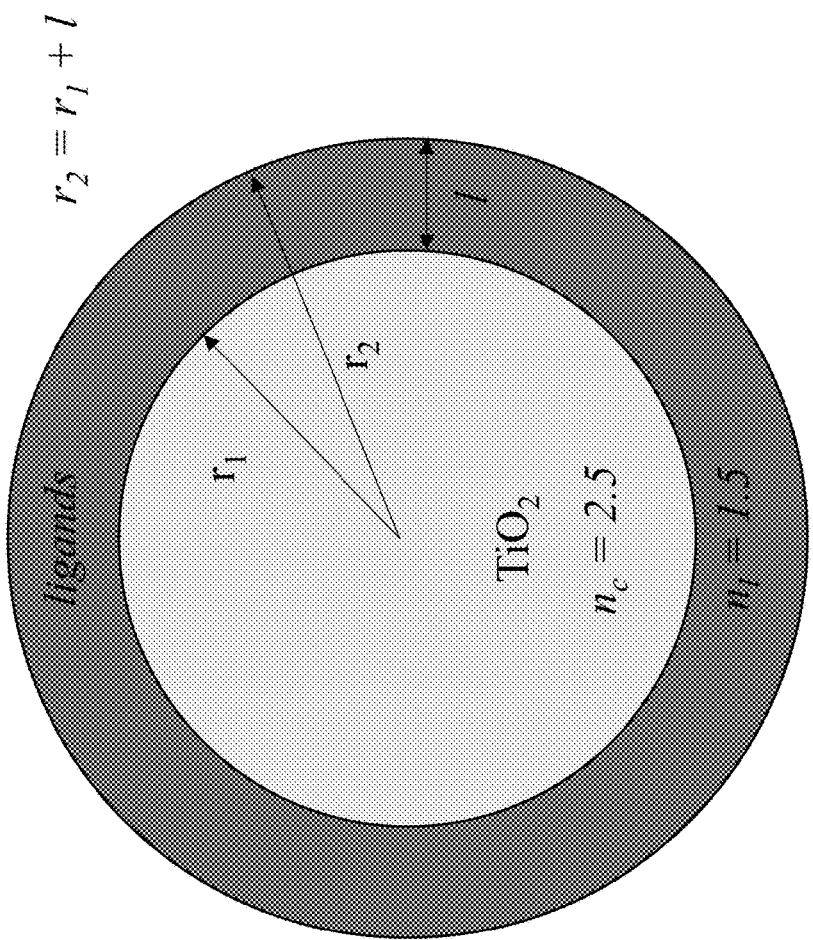

FIG. 15 illustrates a cross-sectional view of an example nanoparticle, showing the structure of the nanoparticle in accordance with some embodiments. The inner sphere (light gray) represents a substantially inorganic core of the nanoparticle, having a radius indicated by $r_1$. The substantially inorganic core may be comprised of any inorganic material, including titanium oxide and/or zirconium oxide. The outer layer of the sphere (dark gray) represents a substantially organic shell, comprising one or more substantially organic ligands (e.g., crosslinkable or polymerizable moieties). The crosslinkable or polymerizable moieties may be covalently bonded to the substantially organic shell or linked to the substantially inorganic core of the nanoparticle. The radius of the nanoparticle, including both the substantially inorganic core and the substantially organic shell is represented by $r_2=r_1+l$. The refractive index of a composite nanoparticle as illustrated in FIG. 15 can be estimated using the values for $r_1$, $r_2$ and the refractive indices of each component part of the nanoparticles applied to Rytov's formula $n_{NP}=\sqrt{\gamma_c n_c^2 + \gamma_l n_l^2}$, where $n_{NP}$ is the refractive index of the composite nanoparticle, $\gamma_c$ is the volume fraction of the substantially inorganic core $$\gamma_c = \frac{r_1^3}{(r_1+l)^3},$$

$\gamma_l$ is the volume fraction of the substantially organic shell $$\gamma_l = \frac{l(l^2 + 3r_1 l + 3r_1^2)}{(r_1+l)^3},$$

$n_c$ is the refractive index of the substantially inorganic core, and $n_l$ is the refractive index of the substantially organic shell.

Figure 16A:
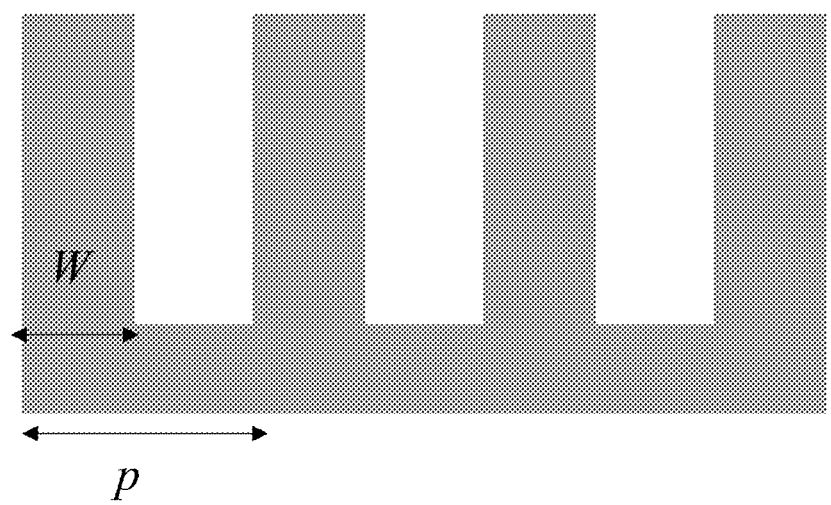
Figure 16B:
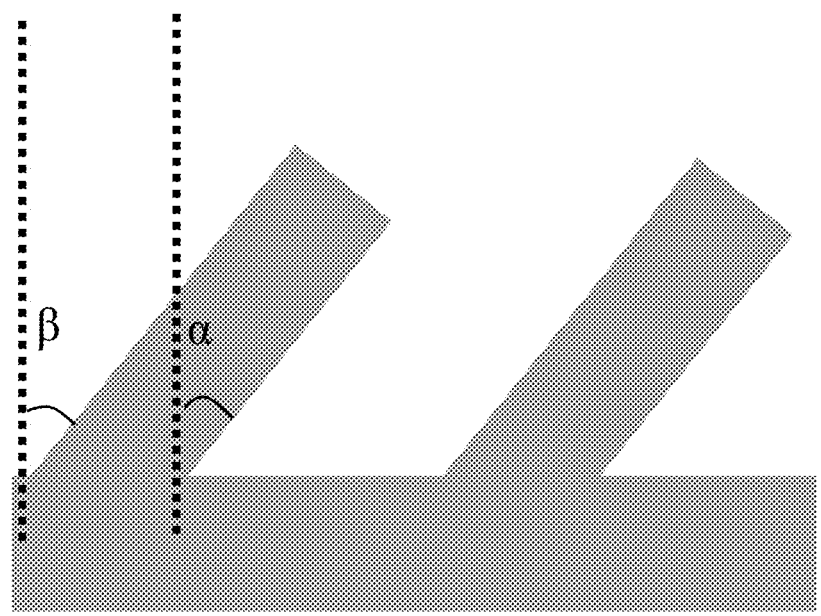

FIGS. 16A and 16B illustrate a non-slanted grating 16A and a slanted grating 16B in accordance with some embodiments. In FIG. 16A, W denotes the width of a ridge (e.g., a nanostructure), and p denotes the grating period. The duty cycle is the ratio between the width of a ridge W and the grating period p. In FIG. 16B, α denotes the angle for the leading edge of a slanted grating, and β denotes the angle for the trailing edge of the slanted grating. The slant angle (e.g., "Slant") is determined using the angle for the leading edge α and the angle for the trailing edge β, using the formula Slant=arctan[(tan(α)+tan(β))*0.5].

Figure 17A:
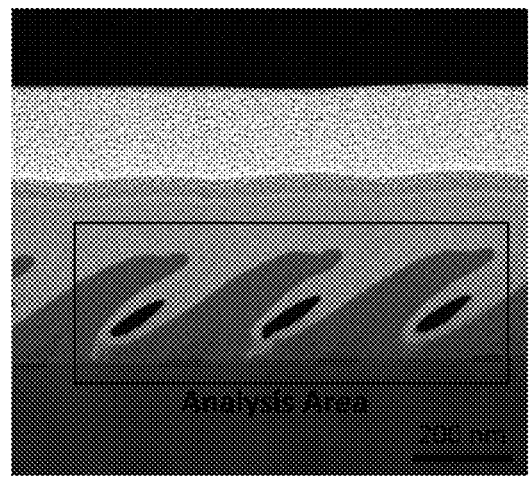
Figure 17B:
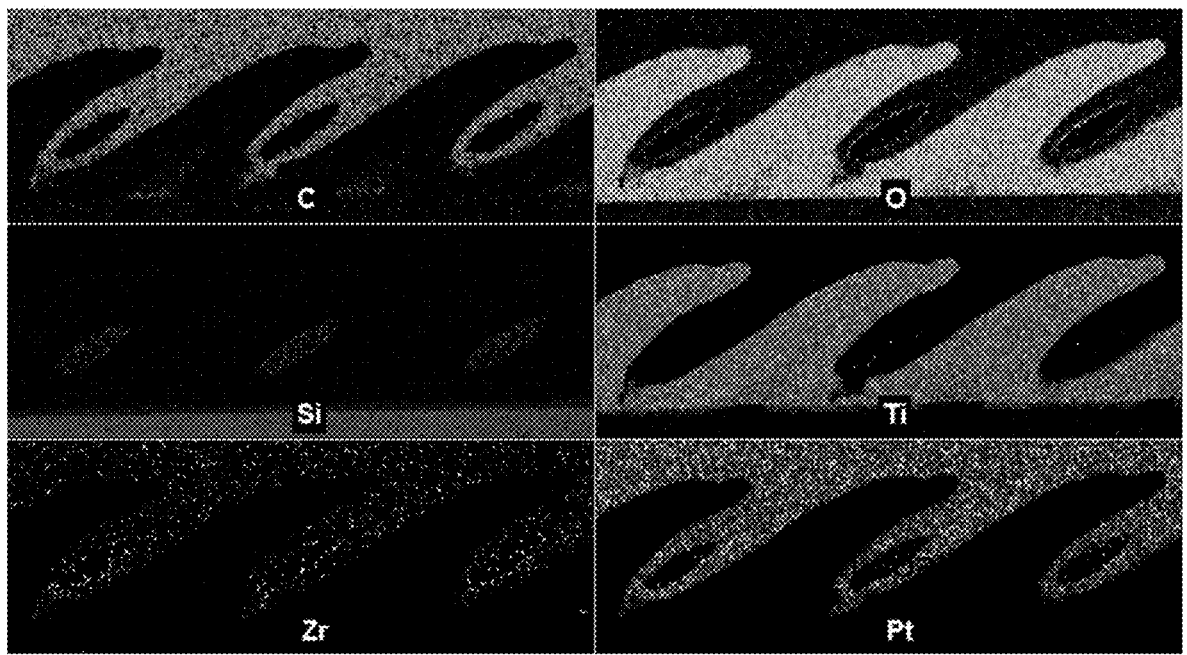

FIGS. 17A and 17B collectively illustrate the performance of an example method of fabricating a surface-relief structure according to certain embodiments. FIG. 17A is a transmission electron microscopy (TEM) image showing the cross-section of a surface-relief structure used for elemental analysis. The surface-relief structure was prepared using a mixture of UVA2 (comprising, e.g., an organic component comprising carbon and oxygen, and an inorganic component comprising silicon and oxygen) and titanium oxide nanoparticles (comprising, e.g., an inorganic shell comprising titanium and oxygen, and a ligand shell comprising carbon). The mixture was laminated, imprinted, and subjected to an $O_2$ ASH step (e.g., a burn step) prior to a titanium oxide ALD infiltration step at approximately 50° C. The top and bottom layers (light gray/white and black, respectively) indicate deposits resulting from sample preparation for cross-sectioning and imaging. The cross-section of the surface-relief structure shows damage throughout the majority of the nanostructures, as well as a small triangular portion in the center base of each nanostructure that exhibits a darker, denser appearance compared to the surrounding regions. The triangular portion indicates incomplete removal of the organic material during the burn step.

FIG. 17B illustrates the cross-section of the surface-relief structure prepared and post-processed as in FIG. 17A, analyzed for a variety of elemental compositions. As described above for FIG. 17A, the mixture used for the surface-relief structure comprised an organic matrix component comprising carbon, oxygen, and silicon, and a nanoparticles component comprising titanium, oxygen, and carbon. Elemental analysis revealed that the surface-relief structure comprised only trace amounts of carbon (top left panel) and silicon (middle left panel) throughout the structure, indicating near-complete removal of organic matrix in all regions except for the center base of each nanostructure. Oxygen (top right panel), provided by both the organic matrix and the nanoparticles, was also abundantly present. Finally, titanium (bottom left panel) was abundantly present throughout each nanostructure, due in part to the existing titanium oxide nanoparticles component and any subsequent titanium oxide infiltration deposited by ALD. Notably, the intensity of titanium and oxygen signals are diminished slightly in the center base of each nanostructure where incomplete burn was observed, indicating, without wishing to be bound by any particular theory, that the enhanced intensity of these signals in the surrounding regions of each nanostructure are due to successful titanium oxide infiltration during the ALD step, and not merely due to the existence of titanium oxide nanoparticles throughout the matrix. Additional elements zirconium and platinum were measured as a control to detect noise and nanolithography-coated structures, respectively.

Figure 18A:
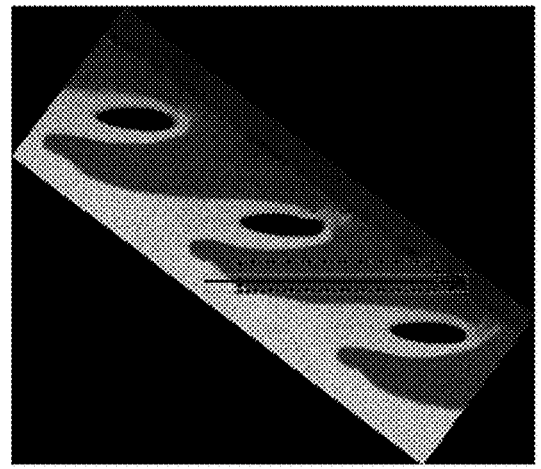
Figure 18B:
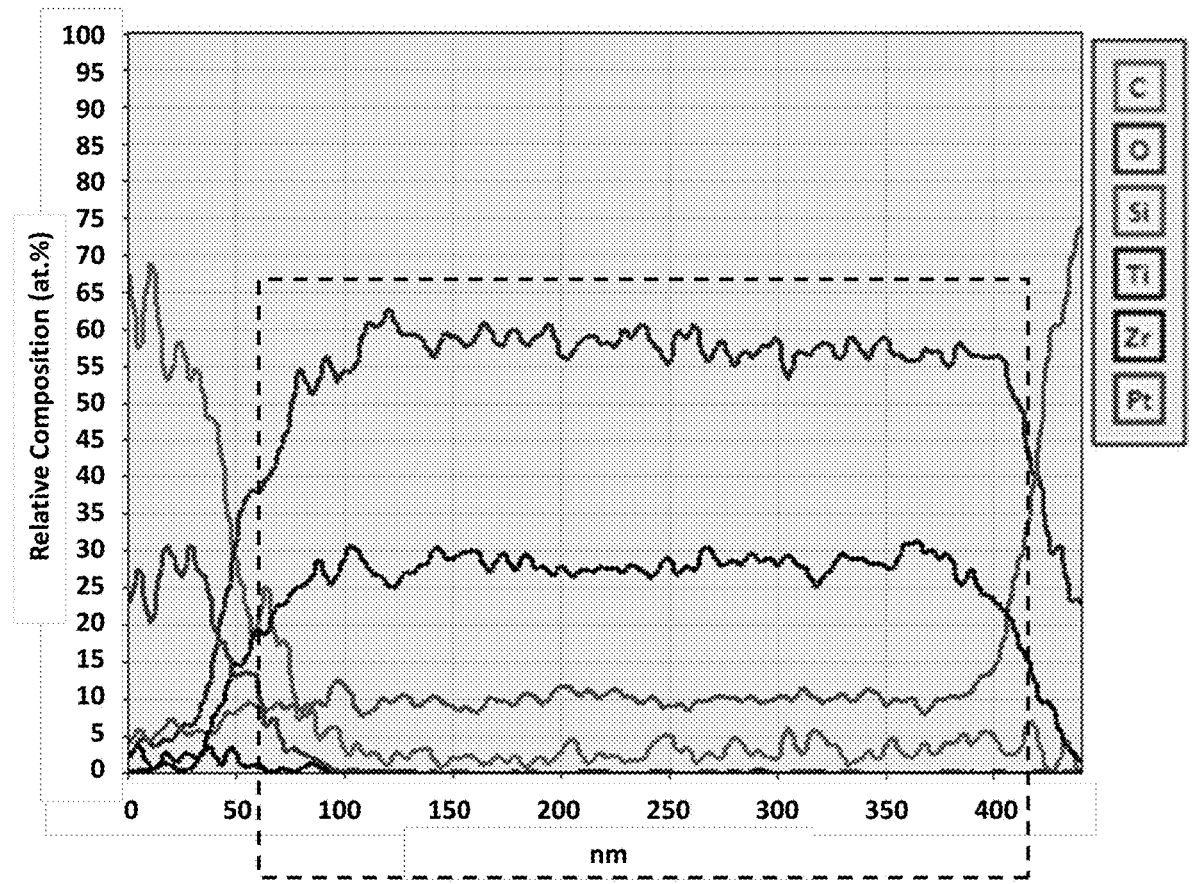

FIGS. 18A and 18B collectively illustrate the performance of an example method of fabricating a surface-relief structure according to certain embodiments. The elemental analysis performed in FIGS. 17A and 17B was plotted as an extracted line profile as percent relative composition across a demarcated cross-sectional region. FIG. 18A illustrates a rotated image of the slanted grating (e.g., the surface-relief structure) from FIG. 17A. The transverse arrow denotes the region across which elemental analysis was performed, while the white dotted box denotes the region corresponding to the respective surface-relief structure. Notably, for comparison, elemental analysis was performed for regions both within and extending beyond the surface-relief structure.

FIG. 18B is a plot showing the elemental compositions for regions within (black dotted box, between approximately 60 nm and 400 nm) and extending beyond the nanostructure, corresponding to the regions denoted in FIG. 17A (white dotted box and arrow, respectively). The nanostructure comprises high levels of oxygen and titanium (approximately 55% and 30%, respectively), moderate-to-low levels of silicon and carbon (approximately 10% and 5%, respectively). These results indicate the removal of most organic material, save trace amounts of carbon, which has been replaced by the inorganic titanium oxide matrix. The refractive index of the resulting inorganic surface-relief grating after the burn-and-replace method measured approximately 2.1 at 460 nm, highlighting the ability of the burn-and-replace method to produce ultra-high (e.g., higher than 2.0) refractive index surface-relief structures that are composed primarily of inorganic material and thus are more resistant to photocatalytic effects.

Figure 19A:
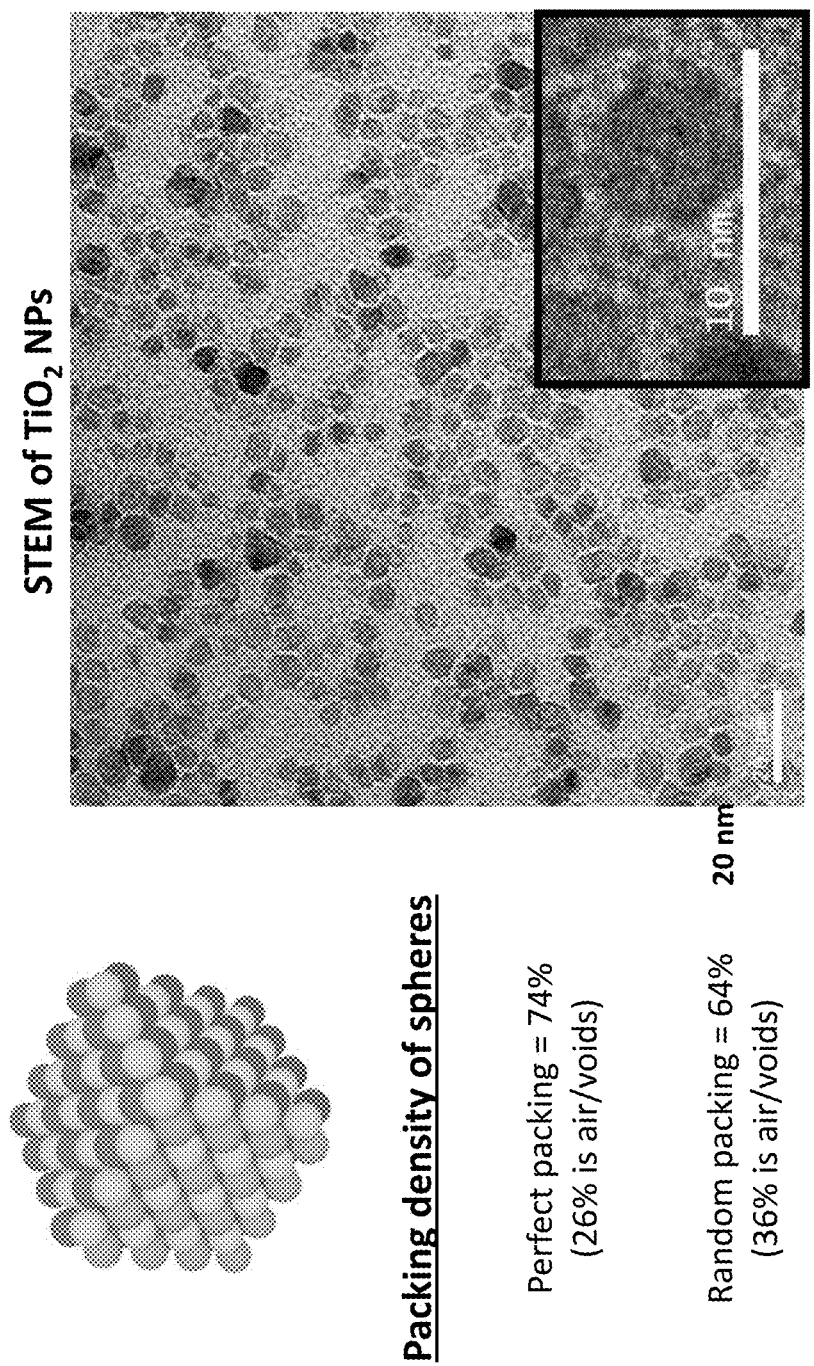

FIG. 19A illustrates perfect packing density and random packing density of nanoparticles in surface-relief structures according to certain embodiments. Perfect packing, or the maximum packing density possible for a plurality of spheres of uniform diameter in a 3-dimensional space (e.g., in a lattice structure), is a volume percentage of 74%. The remaining 26% of the volume is comprised of surrounding matrix (e.g., air voids, resin, etc.). Alternately, random packing achieves volume percentages of 64% and 36% for spheres and voids, respectively.

FIG. 19B shows two example calculations of the theoretical limits of refractive indices are given under varying packing conditions.

Figure 20:
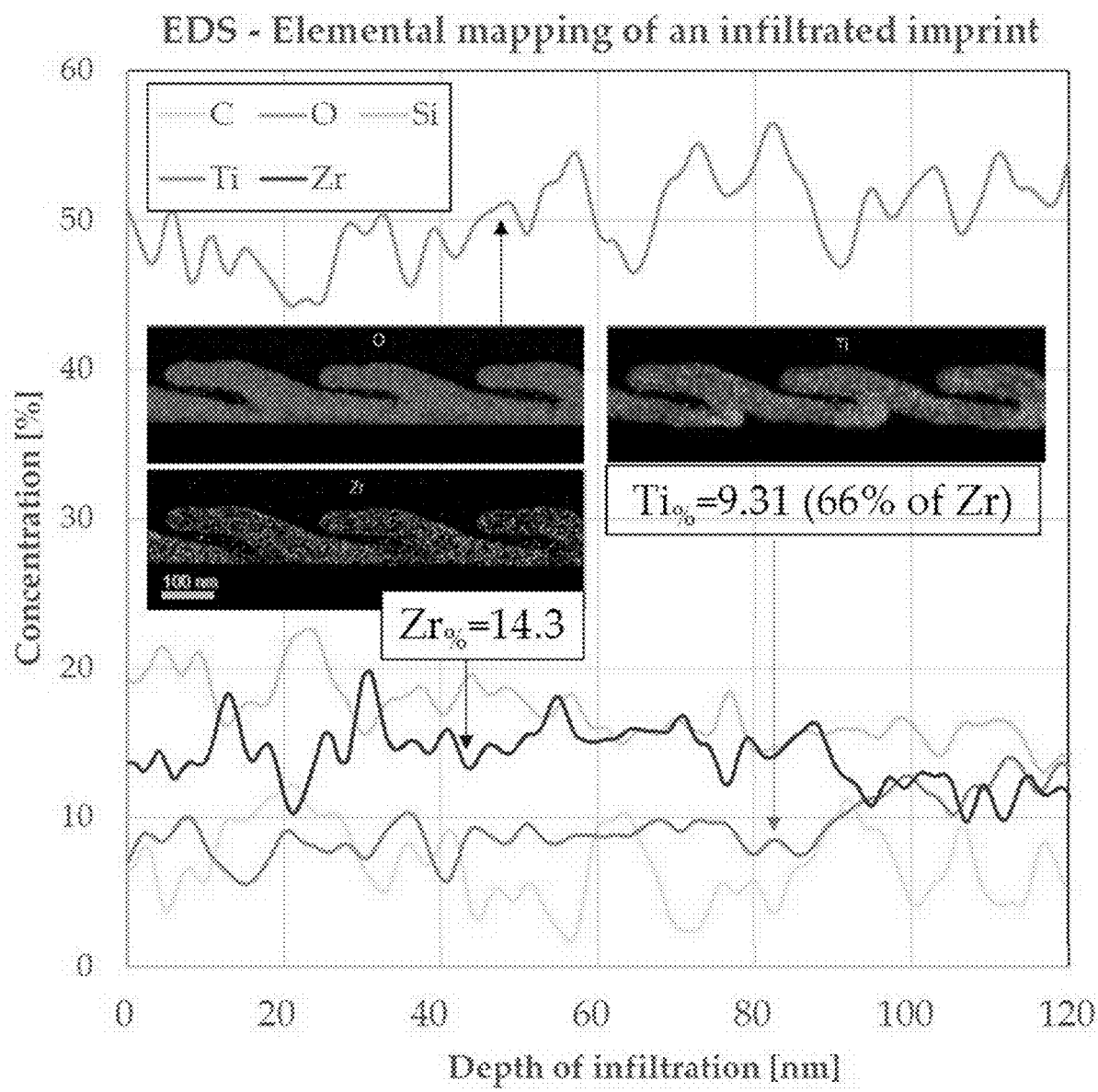

FIG. 20 illustrates an experimental validation of a theoretical model for nanoparticle packing density using energy dispersive spectroscopy (EDS) to measure infiltration, according to certain embodiments. Using the burn-and-replace method and Rytov's formula to estimate refractive index of a composition of nanoparticles (e.g., titanium oxide at 2.21) and surrounding matrix (e.g., an example resin at 1.6), it can be concluded that by replacing an existing surrounding matrix with a material having a higher refractive index (e.g., an inorganic matrix), it is possible to increase the overall refractive index of the total composition. To that end, a theoretical volume fraction of replacement material (e.g., inorganic matrix) deposited by atomic layer deposition (ALD) was estimated, in order to calculate the expected increase in refractive index.

Maximum refractive index estimations are typically based on the assumption that ALD growth cannot be thicker than 7.75% of the nanoparticle diameter. The volume fraction of a 7.75% ALD shell relative to the volume of the core is given by the formula $$\frac{V_{ALDshell}}{V_{core}} = \frac{(r*1.075)^3 - r^3}{r^3} = 24.2\%,$$

irrespective of the nanoparticle diameter.

Figure 21:
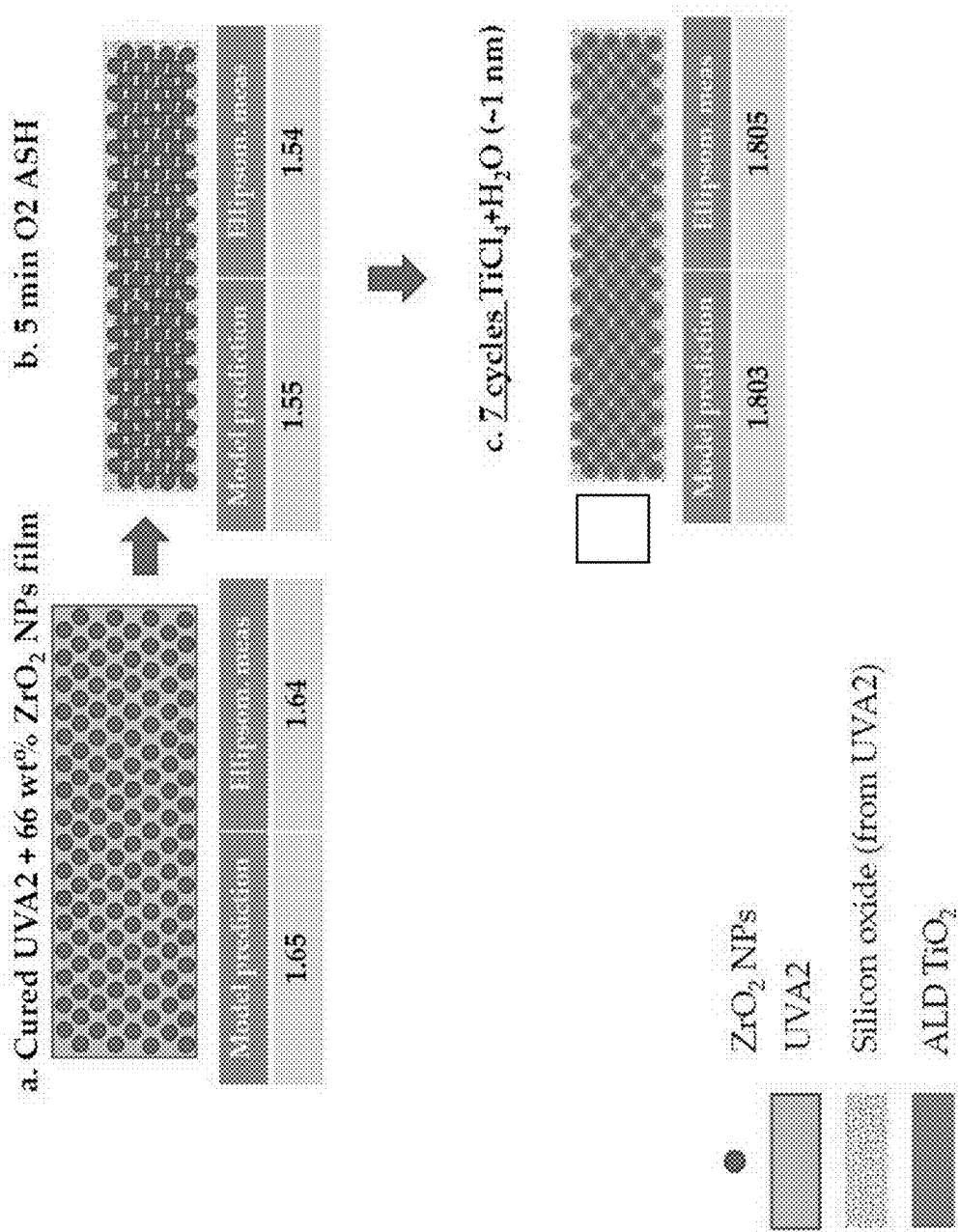

FIG. 21 illustrates an experimental validation of a theoretical model for nanoparticle packing density using ellipsometer measurements to determine refractive index, according to certain embodiments. An organic matrix UVA2 was combined with 66% by weight zirconium oxide nanoparticles and used to prepare a film. The film was cured and subjected to a 5 minute $O_2$ ASH step to remove the organic material, followed by 7 cycles of atomic layer deposition (ALD) of titanium tetrachloride ($TiCl_4$) plus $H_2O$ for a deposition layer of approximately 1 nm. The refractive index of the film at each step was theoretically estimated as well as experimentally measured using an ellipsometer. At each step, the model was found to match closely with the experimental data. For example, the predicted and the measured refractive index of the film prior to $O_2$ ASH was 1.65 and 1.64, respectively, the predicted and measured refractive index after $O_2$ ASH but prior to ALD was 1.55 and 1.54, respectively, and the predicted and measured refractive index after ALD was 1.803 and 1.805, respectively. Error for each comparison was less than 0.6%. The data illustrated in FIG. 21 provide a robust framework for the model to be used in designing and fabricating surface-relief structures for waveguides. Furthermore, the data experimentally demonstrates a refractive index increase from 1.64 to 1.80 using the burn-and-replace method for zirconium oxide nanoparticles and 7 ALD cycles.

FIG. 22 shows the data used as inputs for the theoretical model used in FIGS. 20-21C according to certain embodiments.

Figure 23A:
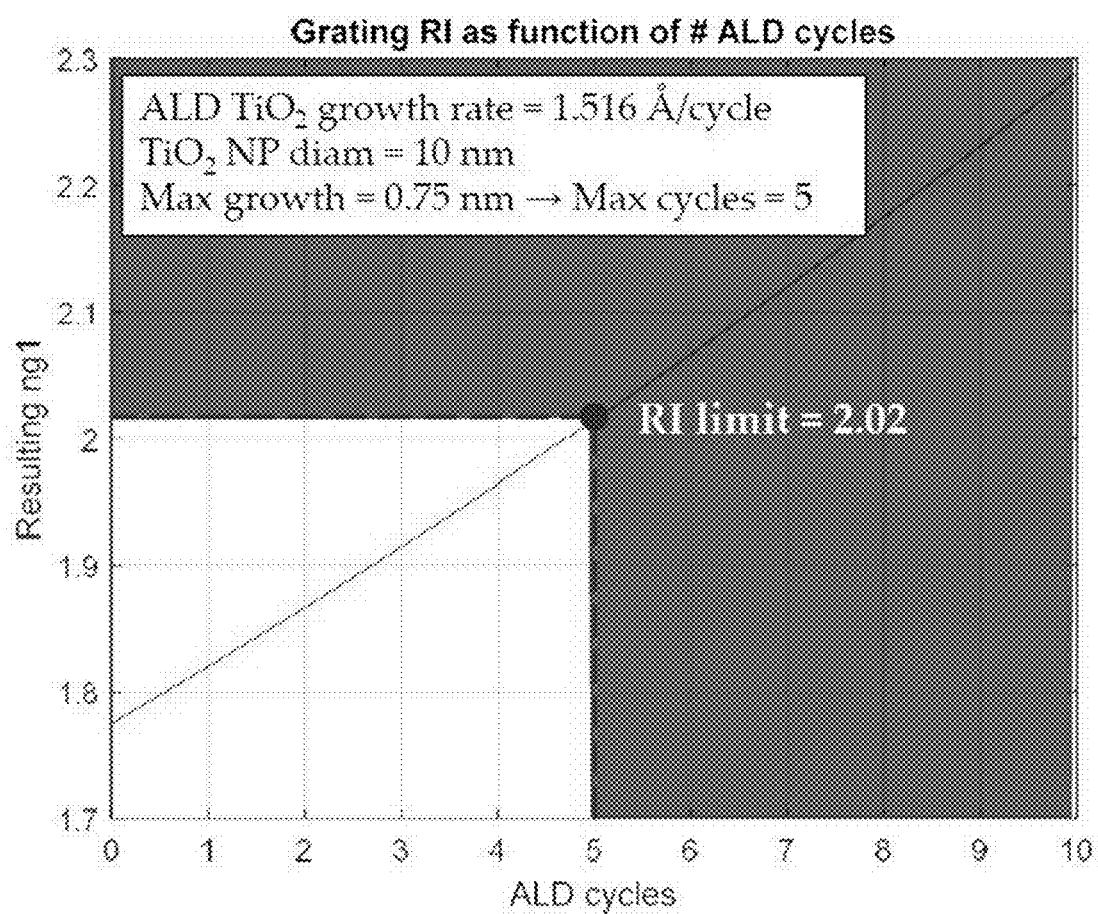
Figure 23B:
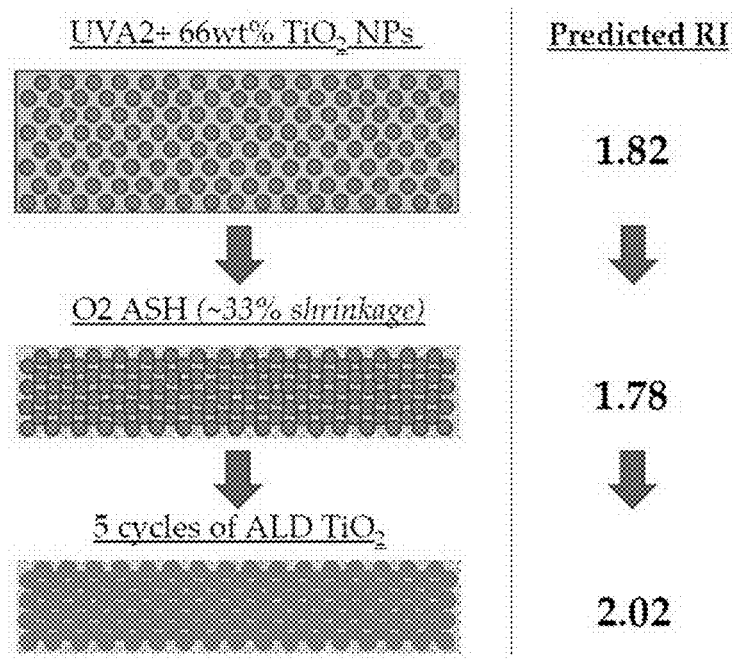

FIGS. 23A and 23B collectively illustrate the predicted refractive index of a surface-relief structure fabricated using $TiO_2$ nanoparticles, according to certain embodiments. Using the partially verified model described in FIG. 21, the estimation was calculated for titanium oxide nanoparticles with a diameter of 10 nm combined with UVA2 to a final ratio of 66% by weight, an expected ALD deposit growth rate of 1.516 Å/cycle, and an expected maximum growth of 0.75 nm over 5 cycles. Refractive index estimations were calculated for each step in the burn-and-replace method, including $O_2$ ASH and ALD, with approximately 33% shrinkage anticipated following the $O_2$ ASH step. The model predicted a maximum refractive index of 2.02 for a composite film after using the burn-and-replace method, increased from an expected 1.82. These results suggest the ability to use the burn-and-replace method to improve refractive index during the fabrication of surface-relief structures.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally and without limitation to nanoimprint materials with high refractive index for nanoimprinting surface-relief structures, such as slanted or non-slanted surface-relief gratings. The slanted surface-relief structures may be fabricated using many different nanofabrication techniques, including nanoimprint lithography (NIL) molding techniques. NIL molding may significantly reduce the cost of the slanted surface-relief structures. In NIL molding, a substrate may be coated with a layer of a NIL material, which may include a mixture of a base resin, high refractive index nanoparticles, solvent, and other additives. A NIL stamp with slanted structures may be pressed against the NIL material layer for molding a slanted grating in the NIL material layer. The NIL material layer may be cured subsequently using, for example, ultraviolet (UV) light and/or heat. The NIL mold may then be detached from the NIL material layer, and slanted structures may be formed in the NIL material layer. As described herein, the slanted structures may be further processed to substantially remove the organic material within to produce slanted structures which are substantially inorganic, for example ceramic structures.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

Definitions

Unless defined otherwise, all technical and scientific terms used herein have the same meaning as is commonly understood by one of skill in the art to which this disclosure belongs. All patents and publications referred to herein are incorporated by reference in their entireties.

As used herein, the terms "crosslinkable moiety" or "polymerizable moiety" refer to a chemical group capable of participating in a crosslinking or polymerization reaction, at any level, for example, initiation, propagation, etc. Crosslinkable or polymerizable moieties include, but are not limited to, addition crosslinkable or polymerizable moieties and condensation crosslinkable or polymerizable moieties. Crosslinkable or polymerizable moieties include, but are not limited to, double bonds, triple bonds, and the like.

As used herein, the term "inhibitor" refers to one or more compositions, compounds, molecules, etc., that are capable of inhibiting or substantially inhibiting the polymerization of the polymerizable component when the photoinitiating light source is on or off. Polymerization inhibitors typically react very quickly with radicals and effectively stop a polymerization reaction. Inhibitors cause an inhibition time during which little to no photopolymer forms, e.g., only very small chains. Typically, photopolymerization occurs only after nearly 100% of the inhibitor is reacted.

As used herein, the term "oligomer" refers to a polymer having a limited number of repeating units, for example, but without limitation, approximately 30 repeat units or less, or any large molecule able to diffuse at least about 100 nm in approximately 2 minutes at room temperature when dissolved in an article of the present disclosure. Such oligomers may contain one or more crosslinkable or polymerizable groups whereby the crosslinkable or polymerizable groups may be the same or different from other possible monomers in the crosslinkable or polymerizable component. Furthermore, when more than one crosslinkable or polymerizable group is present on the oligomer, they may be the same or different. Additionally, oligomers may be dendritic. Oligomers are considered herein to be photoactive monomers, although they are sometimes referred to as "photoactive oligomer(s)".

As used herein, the terms "photo acid generators," "photo base generators," and "photo radical generators," refer to one or more compositions, compounds, molecules, etc., that, when exposed to a light source, generate one or more compositions, compounds, molecules, etc., that are acidic, basic, or a free radical.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes, shapes and dimensions may employ the described arrangements.

Unless otherwise stated, the chemical structures depicted herein are intended to include compounds which differ only in the presence of one or more isotopically enriched atoms. For example, compounds where one or more hydrogen atoms is replaced by deuterium or tritium, or where one or more carbon atoms is replaced by $^{13}$C- or $^{14}$C-enriched carbons, are within the scope of this disclosure.

"Alkyl" refers to a straight or branched hydrocarbon chain radical consisting solely of carbon and hydrogen atoms, containing no unsaturation, having from one to ten carbon atoms (e.g., $(C_{1-10})$alkyl or $C_{1-10}$ alkyl). Whenever it appears herein, a numerical range such as "1 to 10" refers to each integer in the given range—e.g., "1 to 10 carbon atoms" means that the alkyl group may consist of 1 carbon atom, 2 carbon atoms, 3 carbon atoms, etc., up to and including 10 carbon atoms, although the definition is also intended to cover the occurrence of the term "alkyl" where no numerical range is specifically designated. Typical alkyl groups include, but are in no way limited to, methyl, ethyl, propyl, isopropyl, n-butyl, isobutyl, sec-butyl isobutyl, tertiary butyl, pentyl, isopentyl, neopentyl, hexyl, septyl, octyl, nonyl and decyl. The alkyl moiety may be attached to the rest of the molecule by a single bond, such as for example, methyl (Me), ethyl (Et), n-propyl (Pr), 1-methylethyl (isopropyl), n-butyl, n-pentyl, 1,1-dimethylethyl (t-butyl) and 3-methylhexyl. Unless stated otherwise specifically in the specification, an alkyl group is optionally substituted by one or more of substituents which are independently heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$ where each R$^a$ is independently hydrogen, fluoroalkyl, carbocyclyl, carbocyclylalkyl, aryl, aralkyl, heterocycloalkyl, heterocycloalkylalkyl, heteroaryl or heteroarylalkyl.

"Alkenyl" refers to a straight or branched hydrocarbon chain radical group consisting solely of carbon and hydrogen atoms, containing at least one double bond, and having from two to ten carbon atoms (i.e., $(C_{2-10})$alkenyl or $C_{2-10}$ alkenyl). Whenever it appears herein, a numerical range such as "2 to 10" refers to each integer in the given range—e.g., "2 to 10 carbon atoms" means that the alkenyl group may consist of 2 carbon atoms, 3 carbon atoms, etc., up to and including 10 carbon atoms. The alkenyl moiety may be attached to the rest of the molecule by a single bond, such as for example, ethenyl (i.e., vinyl), prop-1-enyl (i.e., allyl), but-1-enyl, pent-1-enyl and penta-1,4-dienyl. Unless stated otherwise specifically in the specification, an alkenyl group is optionally substituted by one or more substituents which are independently alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(N-R$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Alkynyl" refers to a straight or branched hydrocarbon chain radical group consisting solely of carbon and hydrogen atoms, containing at least one triple bond, having from two to ten carbon atoms (i.e., (C$_{2-10}$)alkynyl or C$_{2-10}$ alkynyl). Whenever it appears herein, a numerical range such as "2 to 10" refers to each integer in the given range—e.g., "2 to 10 carbon atoms" means that the alkynyl group may consist of 2 carbon atoms, 3 carbon atoms, etc., up to and including 10 carbon atoms. The alkynyl may be attached to the rest of the molecule by a single bond, for example, ethynyl, propynyl, butynyl, pentynyl and hexynyl. Unless stated otherwise specifically in the specification, an alkynyl group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(N-R$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Carboxaldehyde" refers to a —(C═O)H radical.

"Carboxyl" refers to a —(C═O)OH radical.

"Cyano" refers to a —CN radical.

"Cycloalkyl" refers to a monocyclic or polycyclic radical that contains only carbon and hydrogen, and may be saturated, or partially unsaturated. Cycloalkyl groups include groups having from 3 to 10 ring atoms (i.e. (C$_{3-10}$)cycloalkyl or C$_{3-10}$ cycloalkyl). Whenever it appears herein, a numerical range such as "3 to 10" refers to each integer in the given range—e.g., "3 to 10 carbon atoms" means that the cycloalkyl group may consist of 3 carbon atoms, etc., up to and including 10 carbon atoms. Illustrative examples of cycloalkyl groups include, but are not limited to the following moieties: cyclopropyl, cyclobutyl, cyclopentyl, cyclopentenyl, cyclohexyl, cyclohexenyl, cycloheptyl, cyclooctyl, cyclononyl, cyclodecyl, norbornyl, and the like. Unless stated otherwise specifically in the specification, a cycloalkyl group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(N-R$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

The term "alkoxy" refers to the group —O-alkyl, including from 1 to 8 carbon atoms of a straight, branched, cyclic configuration and combinations thereof attached to the parent structure through an oxygen. Examples include, but are not limited to, methoxy, ethoxy, propoxy, isopropoxy, cyclopropyloxy and cyclohexyloxy. "Lower alkoxy" refers to alkoxy groups containing one to six carbons.

The term "substituted alkoxy" refers to alkoxy wherein the alkyl constituent is substituted (i.e., —O-(substituted alkyl)). Unless stated otherwise specifically in the specification, the alkyl moiety of an alkoxy group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, —N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Amino" or "amine" refers to a —N(R$^a$)$_2$ radical group, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl, unless stated otherwise specifically in the specification. When a —N(R$^a$)$_2$ group has two R$^a$ substituents other than hydrogen, they can be combined with the nitrogen atom to form a 4-, 5-, 6- or 7-membered ring. For example, —N(R$^a$)$_2$ is intended to include, but is not limited to, 1-pyrrolidinyl and 4-morpholinyl. Unless stated otherwise specifically in the specification, an amino group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Aromatic" or "aryl" or "Ar" refers to an aromatic radical with six to ten ring atoms (e.g., C$_6$-C$_{10}$ aromatic or C$_6$-C$_{10}$ aryl) which has at least one ring having a conjugated pi electron system which is carbocyclic (e.g., phenyl, fluorenyl, and naphthyl). Bivalent radicals formed from substituted benzene derivatives and having the free valences at ring atoms are named as substituted phenylene radicals. Bivalent radicals derived from univalent polycyclic hydrocarbon radicals whose names end in "-yl" by removal of one hydrogen atom from the carbon atom with the free valence are named by adding "-idene" to the name of the corresponding univalent radical, e.g., a naphthyl group with two points of attachment is termed naphthylidene. Whenever it appears herein, a numerical range such as "6 to 10" refers to each integer in the given range; e.g., "6 to 10 ring atoms" means that the aryl group may consist of 6 ring atoms, 7 ring atoms, etc., up to and including 10 ring atoms. The term includes monocyclic or fused-ring polycyclic (i.e., rings which share adjacent pairs of ring atoms) groups. Unless stated otherwise specifically in the specification, an aryl moiety is optionally substituted by one or more substituents which are independently alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Aralkyl" or "arylalkyl" refers to an (aryl)alkyl-radical where aryl and alkyl are as disclosed herein and which are optionally substituted by one or more of the substituents described as suitable substituents for aryl and alkyl respectively.

"Ester" refers to a chemical radical of formula —COOR, where R is selected from the group consisting of alkyl, cycloalkyl, aryl, heteroaryl (bonded through a ring carbon) and heteroalicyclic (bonded through a ring carbon). The procedures and specific groups to make esters are known to those of skill in the art and can readily be found in seminal sources such as Greene and Wuts, Protective Groups in Organic Synthesis, 3$^{rd}$ Ed., John Wiley & Sons, New York, N.Y., 1999, which is incorporated herein by reference in its entirety. Unless stated otherwise specifically in the specification, an ester group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Halo," "halide," or, alternatively, "halogen" is intended to mean fluoro, chloro, bromo or iodo. The terms "haloalkyl," "haloalkenyl," "haloalkynyl," and "haloalkoxy" include alkyl, alkenyl, alkynyl and alkoxy structures that are substituted with one or more halo groups or with combinations thereof. For example, the terms "fluoroalkyl" and "fluoroalkoxy" include haloalkyl and haloalkoxy groups, respectively, in which the halo is fluorine.

"Heteroalkyl," "heteroalkenyl," and "heteroalkynyl" refer to optionally substituted alkyl, alkenyl and alkynyl radicals and which have one or more skeletal chain atoms selected from an atom other than carbon, e.g., oxygen, nitrogen, sulfur, phosphorus or combinations thereof. A numerical range may be given—e.g., C$_1$-C$_4$ heteroalkyl which refers to the chain length in total, which in this example is 4 atoms long. A heteroalkyl group may be substituted with one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Heteroaryl" or "heteroaromatic" or "HetAr" or "Het" refers to a 5- to 18-membered aromatic radical (e.g., C$_5$-C$_{13}$ heteroaryl) that includes one or more ring heteroatoms selected from nitrogen, oxygen and sulfur, and which may be a monocyclic, bicyclic, tricyclic or tetracyclic ring system. Whenever it appears herein, a numerical range such as "5 to 18" refers to each integer in the given range—e.g., "5 to 18 ring atoms" means that the heteroaryl group may consist of 5 ring atoms, 6 ring atoms, etc., up to and including 18 ring atoms. Bivalent radicals derived from univalent heteroaryl radicals whose names end in "-yl" by removal of one hydrogen atom from the atom with the free valence are named by adding "-idene" to the name of the corresponding univalent radical—e.g., a pyridyl group with two points of attachment is a pyridylidene. A N-containing "heteroaromatic" or "heteroaryl" moiety refers to an aromatic group in which at least one of the skeletal atoms of the ring is a nitrogen atom. The polycyclic heteroaryl group may be fused or non-fused. The heteroatom(s) in the heteroaryl radical are optionally oxidized. One or more nitrogen atoms, if present, are optionally quaternized. The heteroaryl may be attached to the rest of the molecule through any atom of the ring(s). Examples of heteroaryls include, but are not limited to, azepinyl, acridinyl, benzimidazolyl, benzindolyl, 1,3-benzodioxolyl, benzofuranyl, benzooxazolyl, benzo[d]thiazolyl, benzothiadiazolyl, benzo[b][1,4]dioxepinyl, benzo[b][1,4]oxazinyl, 1,4-benzodioxanyl, benzonaphthofuranyl, benzoxazolyl, benzodioxolyl, benzodioxinyl, benzoxazolyl, benzopyranyl, benzopyranonyl, benzofuranyl, benzofuranonyl, benzofurazanyl, benzothiazolyl, benzothienyl(benzothiophenyl), benzothieno[3,2-d]pyrimidinyl, benzotriazolyl, benzo[4,6]imidazo[1,2-a]pyridinyl, carbazolyl, cinnolinyl, cyclopenta[d]pyrimidinyl, 6,7-dihydro-5H-cyclopenta[4,5] thieno[2,3-d]pyrimidinyl, 5,6-dihydrobenzo[h]quinazolinyl, 5,6-dihydrobenzo[h]cinnolinyl, 6,7-dihydro-5H-benzo[6,7] cyclohepta[1,2-c]pyridazinyl, dibenzofuranyl, dibenzothiophenyl, furanyl, furazanyl, furanonyl, furo[3,2-c]pyridinyl, 5,6,7,8,9,10-hexahydrocycloocta[d]pyrimidinyl, 5,6,7,8,9,10-hexahydrocycloocta[d]pyridazinyl, 5,6,7,8,9,10-hexahydrocycloocta[d]pyridinyl, isothiazolyl, imidazolyl, indazolyl, indolyl, indazolyl, isoindolyl, indolinyl, isoindolinyl, isoquinolyl, indolizinyl, isoxazolyl, 5,8-methano-5,6,7,8-tetrahydroquinazolinyl, naphthyridinyl, 1,6-naphthyridinonyl, oxadiazolyl, 2-oxoazepinyl, oxazolyl, oxiranyl, 5,6, 6a,7,8,9,10,10a-octahydrobenzo[h]quinazolinyl, 1-phenyl-1H-pyrrolyl, phenazinyl, phenothiazinyl, phenoxazinyl, phthalazinyl, pteridinyl, purinyl, pyranyl, pyrrolyl, pyrazolyl, pyrazolo[3,4-d]pyrimidinyl, pyridinyl, pyrido[3,2-d] pyrimidinyl, pyrido[3,4-d]pyrimidinyl, pyrazinyl, pyrimidinyl, pyridazinyl, pyrrolyl, quinazolinyl, quinoxalinyl, quinolinyl, isoquinolinyl, tetrahydroquinolinyl, 5,6,7,8-tetrahydroquinazolinyl, 5,6,7,8-tetrahydrobenzo[4,5]thieno[2, 3-d]pyrimidinyl, 6,7,8,9-tetrahydro-5H-cyclohepta[4,5]thieno[2,3-d]pyrimidinyl, 5,6,7,8-tetrahydropyrido[4,5-c]pyridazinyl, thiazolyl, thiadiazolyl, thiapyranyl, triazolyl, tetrazolyl, triazinyl, thieno[2,3-d]pyrimidinyl, thieno[3,2-d]pyrimidinyl, thieno[2,3-c]pyridinyl, and thiophenyl (i.e., thienyl). Unless stated otherwise specifically in the specification, a heteroaryl moiety is optionally substituted by one or more substituents which are independently: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

Substituted heteroaryl also includes ring systems substituted with one or more oxide (—O—) substituents, such as, for example, pyridinyl N-oxides.

"Heteroarylalkyl" refers to a moiety having an aryl moiety, as described herein, connected to an alkylene moiety, as described herein, wherein the connection to the remainder of the molecule is through the alkylene group.

"Heterocycloalkyl" refers to a stable 3- to 18-membered non-aromatic ring radical that comprises two to twelve carbon atoms and from one to six heteroatoms selected from nitrogen, oxygen and sulfur. Whenever it appears herein, a numerical range such as "3 to 18" refers to each integer in the given range—e.g., "3 to 18 ring atoms" means that the heterocycloalkyl group may consist of 3 ring atoms, 4 ring atoms, etc., up to and including 18 ring atoms. Unless stated otherwise specifically in the specification, the heterocycloalkyl radical is a monocyclic, bicyclic, tricyclic or tetracyclic ring system, which may include fused or bridged ring systems. The heteroatoms in the heterocycloalkyl radical may be optionally oxidized. One or more nitrogen atoms, if present, are optionally quaternized. The heterocycloalkyl radical is partially or fully saturated. The heterocycloalkyl may be attached to the rest of the molecule through any atom of the ring(s). Examples of such heterocycloalkyl radicals include, but are not limited to, dioxolanyl, thienyl[1,3]dithianyl, decahydroisoquinolyl, imidazolinyl, imidazolidinyl, isothiazolidinyl, isoxazolidinyl, morpholinyl, octahydroindolyl, octahydroisoindolyl, 2-oxopiperazinyl, 2-oxopiperidinyl, 2-oxopyrrolidinyl, oxazolidinyl, piperidinyl, piperazinyl, 4-piperidonyl, pyrrolidinyl, pyrazolidinyl, quinuclidinyl, thiazolidinyl, tetrahydrofuryl, trithianyl, tetrahydropyranyl, thiomorpholinyl, thiamorpholinyl, 1-oxothiomorpholinyl, and 1,1-dioxo-thiomorpholinyl. Unless stated otherwise specifically in the specification, a heterocycloalkyl moiety is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Heterocycloalkyl" also includes bicyclic ring systems wherein one non-aromatic ring, usually with 3 to 7 ring atoms, contains at least 2 carbon atoms in addition to 1-3 heteroatoms independently selected from oxygen, sulfur, and nitrogen, as well as combinations comprising at least one of the foregoing heteroatoms; and the other ring, usually with 3 to 7 ring atoms, optionally contains 1-3 heteroatoms independently selected from oxygen, sulfur, and nitrogen and is not aromatic.

"Nitro" refers to the —NO$_2$ radical.

"Oxa" refers to the —O— radical.

"Oxo" refers to the =O radical.

"Moiety" refers to a specific segment or functional group of a molecule. Chemical moieties are often recognized chemical entities embedded in or appended to a molecule.

"Substituted" means that the referenced group may have attached one or more additional groups, radicals or moieties individually and independently selected from, for example, acyl, alkyl, alkylaryl, cycloalkyl, aralkyl, aryl, carbohydrate, carbonate, heteroaryl, heterocycloalkyl, hydroxy, alkoxy, aryloxy, mercapto, alkylthio, arylthio, cyano, halo, carbonyl, ester, thiocarbonyl, isocyanato, thiocyanato, isothiocyanato, nitro, oxo, perhaloalkyl, perfluoroalkyl, phosphate, silyl, sulfinyl, sulfonyl, sulfonamidyl, sulfoxyl, sulfonate, urea, and amino, including mono- and di-substituted amino groups, and protected derivatives thereof. The substituents themselves may be substituted, for example, a cycloalkyl substituent may itself have a halide substituent at one or more of its ring carbons. The term "optionally substituted" means optional substitution with the specified groups, radicals or moieties.

"Sulfanyl" refers to groups that include —S-(optionally substituted alkyl), —S-(optionally substituted aryl), —S-(optionally substituted heteroaryl) and —S-(optionally substituted heterocycloalkyl).

Compounds of the present disclosure also include crystalline and amorphous forms of those compounds, including, for example, polymorphs, pseudopolymorphs, solvates, hydrates, unsolvated polymorphs (including anhydrates), conformational polymorphs, and amorphous forms of the compounds, as well as mixtures thereof. "Crystalline form" and "polymorph" are intended to include all crystalline and amorphous forms of the compound, including, for example, polymorphs, pseudopolymorphs, solvates, hydrates, unsolvated polymorphs (including anhydrates), conformational polymorphs, and amorphous forms, as well as mixtures thereof, unless a particular crystalline or amorphous form is referred to.

In some embodiments, the disclosure provides a nanoimprint lithography (NIL) grating comprising a substantially inorganic material, for example, without limitation, a metal oxide or a ceramic material, the material having a relative amount of carbon of about 10% or less. In some embodiments, the relative amount of carbon in the material is about 9% or less, about 8% or less, about 7% or less, about 6% or less, about 5% or less, about 4% or less, about 3% or less, about 2% or less, or about 1% or less. In some embodiments, the material is substantially free of organic material. In some embodiments, the material comprises one or more of titanium oxide, zirconium oxide, hafnium oxide, tungsten oxide, zinc tellurium, gallium phosphide, or any combination or derivative thereof. In some embodiments, the grating has a duty cycle ranging from 10% to 90%. In some embodiments, the grating has a duty cycle ranging from 30% to 90%. In some embodiments, the grating has a duty cycle ranging from 35% to 90%. In some embodiments, the grating is a non-slanted grating. In some embodiments, the grating is a slanted grating. In some embodiments, a slant angle ranges from more than 0° to about 70°. In some embodiments, a slant angle is greater than 30°. In some embodiments, a slant angle is greater than 35°. In some embodiments, the grating has a depth from 30 nm to 450 nm. In some embodiments, the grating has a depth from 50 nm to 350 nm. In some embodiments, the grating has a depth from 75 nm to 250 nm. In some embodiments, the grating has a depth greater than 100 nm and lower than 500 nm. In some embodiments, the grating has an aspect ratio from 0.5:1 to 6:1. In some embodiments, the grating has an aspect ratio from 1:1 to 5:1. In some embodiments, the grating has an aspect ratio greater than 3:1 and lower than 8:1. In some embodiments, the material has a refractive index ranging from 1.90 to 2.25. In some embodiments, the refractive index is measured at 460 nm.

In some embodiments, the disclosure provides a method of forming an NIL grating described herein, the method comprising imprinting an NIL precursor material using a NIL process. In some embodiments, the disclosure provides a process for making an NIL grating described herein, the process comprising: providing a precursor material comprising a base resin component and a plurality of nanoparticles; imprinting the precursor material into a first precursor NIL grating; optionally subjecting the first precursor NIL grating to additional processing steps to generate one or more subsequent precursor NIL gratings; and subjecting the first precursor NIL grating or the one or more subsequent precursor NIL gratings to at least an increased temperature. In some embodiments, the base resin component is UV curable. In some embodiments, the base resin component is light-sensitive. In some embodiments, the base resin component comprises an organic material. In some embodiments, the base resin component comprises one or more crosslinkable monomers, one or more polymerizable monomers, or both. In some embodiments, the crosslinkable monomers or the polymerizable monomers comprise one or more crosslinkable or polymerizable moieties. In some embodiments, the crosslinkable or polymerizable moieties are selected from an ethylenically unsaturated group, an oxirane ring, and a heterocyclic group. In some embodiments, the crosslinkable or polymerizable moieties are selected from vinyl, allyl, epoxide, acrylate, and methacrylate. In some embodiments, the crosslinkable or polymerizable moieties are selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate. In some embodiments, the crosslinkable monomers or the polymerizable monomers comprise one or more linking groups selected from —$C_{1-10}$ alkyl-, —O—$C_{1-10}$ alkyl-, —$C_{1-10}$ alkenyl-, —O—$C_{1-10}$ alkenyl-, —$C_{1-10}$ cycloalkenyl-, —O—$C_{1-10}$ cycloalkenyl-, —$C_{1-10}$ alkynyl-, —O—$C_{1-10}$ alkynyl-, —$C_{1-10}$ aryl-, —O—$C_{1-10}$-, -aryl-, —O—, —S—, —C(O)—, C(O)O—, —OC(O)—, —OC(O)O—, —N($R^b$)—, —C(O)N($R^b$)—, —N($R^b$)C(O)—, —OC(O)N($R^b$)—, —N($R^b$)C(O)O—, —SC(O)N($R^b$)—, N($R^b$)C(O)S—, —N($R^b$)C(O)N($R^b$)—, —N($R^b$)C(N$R^b$)N($R^b$)—, N($R^b$)S(O)$_w$—, S(O)$_w$N($R^b$)—, —S(O)$_w$O—, —OS(O)$_w$—, —OS(O)$_w$O—, —O(O)P(O$R^b$)O—, (O)P(O—)$_3$, —O(S)P (O$R^b$)O—, and (S)P(O—)$_3$, wherein w is 1 or 2, and $R^b$ is independently hydrogen, optionally substituted alkyl, or optionally substituted aryl. In some embodiments, the base resin component comprises one or more fluorinated compounds. In some embodiments, the base resin component further comprises one or more solvents. In some embodiments, the one or more solvents are selected from 2-(1-methoxy)propyl acetate, propylene glycol monomethyl ether acetate, propylene glycol methyl ether, ethyl acetate, xylene, and toluene. In some embodiments, the one or more solvents is ethyl lactate. In some embodiments, the base resin component further comprises one or more of a photo radical generator, a photo acid generator, or both. In some embodiments, the base resin component further comprises one or more inhibitors. In some embodiments, the base resin component includes silicon.

In some embodiments, the base resin component comprises one or more resins. In some embodiments, the base resin component comprises an electromagnetic radiation sensitive material. In some embodiments, the base resin component is light-sensitive. For example, in some embodiments, a light-sensitive material comprises a photoinitiator and/or a photoactive polymerizable material (e.g., a monomer, polymer, and/or a combination thereof). The photoinitiator causes light-initiated crosslinking or polymerization of the photoactive polymerizable material (e.g., light-initiated curing) upon exposure to a wavelength of light that activates the photoinitiator (e.g., a photoinitiating light source). In some embodiments, the light-sensitive material comprises a combination of components, some of which individually are not light-sensitive, yet in combination are capable of activating the photoactive monomer or polymer (e.g., a dye/amine, a sensitizer/iodonium salt, a dye/borate salt, etc.). In some embodiments, a light-sensitive material comprises a single photoinitiator or a combination of two or more photoinitiators. For example, in some embodiments, two or more photoinitiators are used to allow light-initiated crosslinking or polymerization of the photoactive monomer or polymer upon exposure to two or more different wavelengths of light. In some embodiments, a light-sensitive material comprises a photoactive polymerizable material that comprises one or more functional groups that undergo curing. In some embodiments, a light-sensitive material comprises one or more photoactive polymerizable materials that are also photoinitiators (e.g., N-methylmaleimide, derivatized acetophenones, etc.).

In some embodiments, the light-sensitive base resin component undergoes a process upon exposure to one or more wavelengths of light that changes one or more properties of the base resin component. In some embodiments, the light-sensitive base resin component undergoes a crosslinking and/or polymerizing process that hardens the base resin component upon exposure to one or more wavelengths of light (e.g., curing). For example, referring to FIG. 8B, in some embodiments, curing is used to set a soft material into a rigid material, such as in a desired shape (e.g., in the shape of a mold). In some embodiments, the photoinitiating light source is a wavelength of light that is in the visible light spectrum. In some embodiments, the photoinitiating light source is a wavelength of light that is ultraviolet light (UV). In some embodiments, the base resin component is chemically curable, heat curable, electron beam curable, and/or light curable. In some embodiments, the base resin component is UV curable.

In some embodiments, the base resin component is cured for a duration that is between 1 second and 10 seconds, between 10 seconds and 30 seconds, between 30 seconds and 1 minute, between 1 minute and 2 minutes, between 2 minutes and 5 minutes, between 5 minutes and 10 minutes, between 10 minutes and 30 minutes, between 30 minutes and 1 hour, or more than 1 hour. In some embodiments, the base resin component is cured for about 10 seconds, about 20 seconds, about 30 seconds, about 40 seconds, about 50 seconds, or about 1 minute.

In some embodiments, the curing is performed at room temperature (e.g., between 15 and 25° C.). For example, in some embodiments, the NIL precursor material and/or the base resin component is flowable or in liquid form (e.g., a liquid) at room temperature, thus allowing the NIL precursor material to be molded or imprinted at an imprinting temperature close to room temperature. In other words, in some such embodiments, the NIL precursor can be molded or imprinted without heat treatment to the NIL precursor material and/or to the substrate upon which the NIL precursor material is applied. In some alternative embodiments, heat is applied to the NIL precursor material and/or to the substrate during other aspects of the NIL molding process, including the curing (e.g., crosslinking or polymerization) of the NIL precursor material. In some embodiments, the curing comprises a temperature between 25 and 40° C., between 40 and 80° C., between 80 and 120° C., between 120 and 200° C., or higher than 200° C. In some embodiments, the curing comprises a temperature between 100° C. and 150° C., between 100° C. and 140° C., or between 110° C. and 140° C. Additionally, in some embodiments, thermal treatment is implemented during the imprinting of the NIL precursor material so as to further reduce the viscosity of the NIL precursor material to facilitate the flow of the NIL precursor material inside the mold.

In some embodiments, the base resin component comprises a mixture of one or more resins. In some embodiments, the base resin component further comprises additives (e.g., for modifying the properties of the NIL precursor material) and solvent (e.g., for facilitating the mixing of the various components). In some such embodiments, the base resin component is generated by mixing the various components together. In some embodiments, the base resin component comprises a first component comprising a first one or more resins and a second component comprising a second one or more resins, a nanoparticles component, one or more radical and/or acid generators, one or more crosslinking agents, one or more optional additives, and/or one or more solvents, where the first component is a solid at a respective temperature prior to mixing but becomes liquid at the respective temperature after mixing with the second component. In some such embodiments, the viscosity is measured after mixing the first and second components in the base resin component.

In some embodiments, the base resin component comprises one or more organic resins that are carbon-based and/or comprise hydrogen, sulfur, oxygen, nitrogen, or various other elements in the one or more resins. In some embodiments, the base resin component comprises acrylate, methyl acrylate, vinyl (e.g., olefin or heterocyclic) groups, and/or a mixture of such.

In some embodiments, the base resin component comprises one or more reactive molecules, monomers, oligomers, and/or polymers. In some embodiments, the base resin component comprises of 1, 2, 3, 4, 5, 6, 7, 8, 9, 10, or more than 10 unique types of reactive molecules, monomers, oligomers, and/or polymers. Specifically, in some embodiments, the base resin component comprises one or more crosslinkable monomers, one or more polymerizable monomers, or both. In some embodiments, the crosslinkable monomers or the polymerizable monomers comprise one or more crosslinkable or polymerizable moieties. In some embodiments, the base resin component comprises no less than 2 unique types of crosslinkable or polymerizable moieties.

In some embodiments, the crosslinkable or polymerizable moieties are selected from an ethylenically unsaturated group, an oxirane ring, and a heterocyclic group. In some embodiments, the crosslinkable or polymerizable moieties are selected from vinyl, allyl, epoxide, acrylate, and methacrylate. In some embodiments, the crosslinkable or polymerizable moieties are selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

Although the base resin materials described herein can generally be cured by UV-light or light having wavelengths ranging from about 254 nm to about 415 nm or other curing methods (e.g., electron beam curing, etc.), the base resin materials having different functional groups may be cured or cross-linked using different cross-linking mechanisms and/or under different operating conditions, and thus may be selected based on the various processing parameters for NIL molding the slanted grating.

In some embodiments, the crosslinkable or polymerizable moieties are selected from

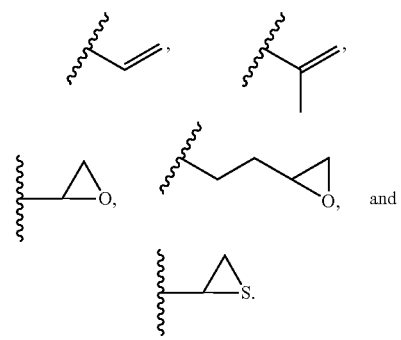

In some embodiments, the crosslinkable or polymerizable moieties are selected from

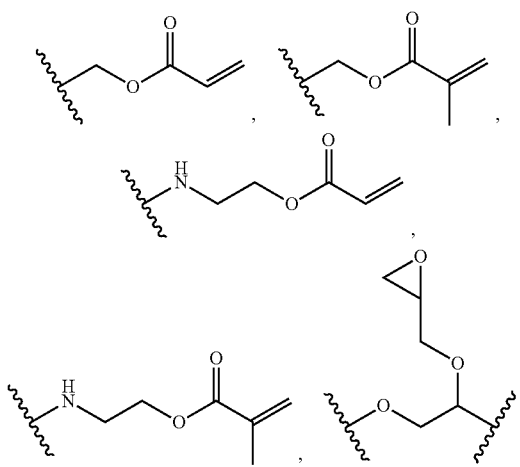

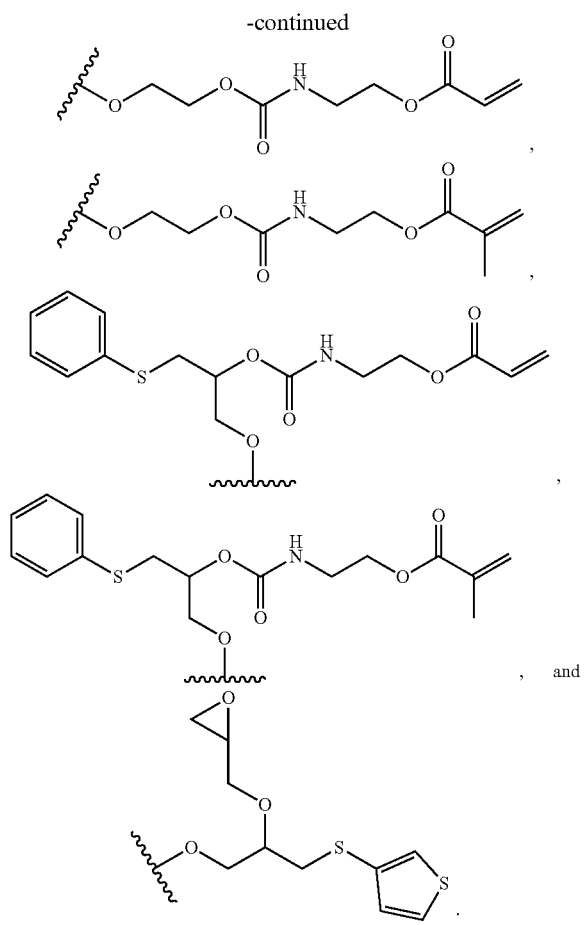
,

In some embodiments, the crosslinkable monomers or the polymerizable monomers comprise one or more moieties selected from optionally substituted alkyl, optionally substituted heteroalkyl, optionally substituted alkenyl, optionally substituted alkynyl, optionally substituted cycloalkyl, optionally substituted heterocycloalkyl, optionally substituted aryl, optionally substituted arylalkyl, optionally substituted heteroaryl, and optionally substituted heteroarylalkyl. In some embodiments, the crosslinkable monomers or the polymerizable monomers comprise one or more moieties selected from fluorene, cardo fluorene, spiro fluorene, thianthrene, thiophosphate, anthraquinone, and lactam. In some embodiments, the crosslinkable monomers or the polymerizable monomers comprise one or more linking groups selected from —$C_{1-10}$ alkyl-, —O—$C_{1-10}$ alkyl-, —$C_{1-10}$ alkenyl-, —O—$C_{1-10}$ alkenyl-, —$C_{1-10}$ cycloalkenyl-, —O—$C_{1-10}$ cycloalkenyl-, —$C_{1-10}$ alkynyl-, —O—$C_{1-10}$ alkynyl-, —$C_{1-10}$ aryl-, —O—$C_{1-10}$—, -aryl-, —O—, —S—, —C(O)—, —C(O)O—, —OC(O)—, —OC(O)O—, —N($R^b$)—, —C(O)N($R^b$)—, —N($R^b$)C(O)—, —OC(O)N($R^b$)—, —N($R^b$)C(O)O—, —SC(O)N($R^b$)—, —N($R^b$)C(O)S—, —N($R^b$)C(O)N($R^b$)—, —N($R^b$)C(N$R^b$)N($R^b$)—, —N($R^b$)S(O)$_w$—, S(O)$_w$N($R^b$)—, —S(O)$_w$O—, —OS(O)$_w$—, —OS(O)$_w$O—, —O(O)P(O$R^b$)O—, (O)P(O—)$_3$, —O(S)P(O$R^b$)O—, and (S)P(O—)$_3$, where w is 1 or 2, and $R^b$ is independently hydrogen, optionally substituted alkyl, or optionally substituted aryl.

In some embodiments, the crosslinkable monomers or the polymerizable monomers comprise one or more terminal groups selected from optionally substituted thiophenyl, optionally substituted thiopyranyl, optionally substituted thienothiophenyl, and optionally substituted benzothiophenyl. In some embodiments, the base resin component comprises one or more derivatives of bisfluorene, dithiolane, thianthrene, biphenol, o-phenylphenol, phenoxy benzyl, bisphenol A, bisphenol F, benzyl, or phenol. In some embodiments, the base resin component comprises one or more of (2,7-bis[(2-acryloyloxyethyl)-sulfanyl]thianthrene), benzyl methacrylate, 1,6-hexanediol diacrylate, 1,4-butanediol diacrylate, acryloxypropylsilsesquioxane, or methylsilsesquioxane.

In some embodiments, the base resin component comprises one or more of trimethylolpropane (EO)n triacrylate, caprolactone acrylate, polypropylene glycol monomethacrylate, cyclic trimethylolpropane formal acrylate, phenoxy benzyl acrylate, 3,3,5-trimethyl cyclohexyl acrylate, isobornyl acrylate, o-phenylphenol EO acrylate, 4-tert-butylcyclohexyl acrylate, benzyl acrylate, benzyl methacrylate, biphenylmethyl acrylate, lauryl acrylate, lauryl methacrylate, tridecyl acrylate, lauryl tetradecyl methacrylate, isodecyl acrylate, isodecyl methacrylate, phenol (EO) acrylate, phenoxyethyl methacrylate, phenol (EO)2 acrylate, phenol (EO)4 acrylate, tetrahydrofurfuryl acrylate, tetrahydrofurfuryl methacrylate, nonyl phenol (PO)2 acrylate, nonyl phenol (EO)4 acrylate, nonyl phenol (EO)8 acrylate, ethoxy ethoxy ethyl acrylate, stearyl acrylate, stearyl methacrylate, methoxy PEG600 methacrylate, 1,6-hexanediol diacrylate, 1,6-hexanediol dimethacrylate, 1,6-hexanediol (EO)n diacrylate, polypropylene glycol 400 diacrylate, 1,4-butanediol dimethacrylate, polypropylene glycol 700 (EO)6 dimethacrylate, 1,6-Hexanediol (EO)n diacrylate, hydroxy pivalic acid neopentyl glycol diacrylate, bisphenol A (EO)10 diacrylate, bisphenol A (EO)10 dimethacrylate, neopentyl glycol dimethacrylate, neopentyl glycol (PO)2 diacrylate, tripropylene glycol diacrylate, ethylene glycol dimethacrylate, dipropylene glycol diacrylate, bisphenol A (EO)30 diacrylate, bisphenol A (EO)30 dimethacrylate, diethylene glycol dimethacrylate, triethylene glycol diacrylate, triethylene glycol dimethacrylate, tetraethylene glycol dimethacrylate, bisphenol A (EO)4 diacrylate, bisphenol A (EO)4 dimethacrylate, bisphenol A (EO)3 diacrylate, bisphenol A (EO)3 dimethacrylate, 1,3-butylene glycol dimethacrylate, tricyclodecane dimethanol diacrylate, tetraethylene glycol diacrylate, polyethylene glycol 400 diacrylate, polyethylene glycol 400 dimethacrylate, polyethylene glycol 200 diacrylate, polyethylene glycol 200 dimethacrylate, polyethylene glycol 300 diacrylate, polyethylene glycol 600 diacrylate, polyethylene glycol 600 dimethacrylate, bisphenol F (EO)4 diacrylate, trimethylolpropane triacrylate, trimethylolpropane trimethacrylate, trimethylolpropane (EO)3 triacrylate, trimethylolpropane (EO)15 triacrylate, trimethylolpropane (EO)6 triacrylate, trimethylolpropane (EO)9 triacrylate, glycerine (PO)3 triacrylate, pentaerythritol triacrylate, trimethylolpropane (PO)3 triacrylate, tris(2-hydroxyethyl)isocyanurate triacrylate, pentaerythritol (EO)n tetraacrylate, ditrimethylolpropane tetraacrylate, pentaerythritol tetraacrylate, dipentaerythritol pentaacrylate, and dipentaerythritol hexaacrylate.

In some embodiments, the base resin component comprises one or more of a phosphate methacrylate, an amine acrylate, an acrylated amine synergist, a carboxylethyl acrylate, a modified epoxy acrylate, a bisfluorene diacrylate, a modified bisphenol fluorene diacrylate, a modified bisphenol fluorene type, a butadiene acrylate, an aromatic difunctional acrylate, an aliphatic multifunctional acrylate, a polyester acrylate, a trifunctional polyester acrylate, a tetrafunctional polyester acrylate, a phenyl epoxy acrylate, a bisphenol A epoxy acrylate, a water soluble acrylate, an aliphatic alkyl epoxy acrylate, a bisphenol A epoxy methacrylate, a soybean oil epoxy acrylate, a difunctional polyester acrylate, a trifunctional polyester acrylate, a tetrafunctional polyester acrylate, a chlorinated polyester acrylate, a hexafunctional polyester acrylate, an aliphatic difunctional acrylate, an aliphatic difunctional methacrylate, an aliphatic trifunctional acrylate, an aliphatic trifunctional methacrylate, an aromatic difunctional acrylate, an aromatic tetrafunctional acrylate, an aliphatic tetrafunctional acrylate, an aliphatic hexafunctional acrylate, an aromatic hexafunctional acrylate, an acrylic acrylate, a polyester acrylate, a sucrose benzoate, a caprolactone methacrylate, a caprolactone acrylate, a phosphate methacrylate, an aliphatic multifunctional acrylate, a phenol novolac epoxy acrylate, a cresol novolac epoxy acrylate, an alkali strippable polyester acrylate, a melamine acrylate, a silicone polyester acrylate, a silicone urethane acrylate, a dendritic acrylate, an aliphatic tetrafunctional methacrylate, a water dispersion urethane acrylate, a water soluble acrylate, an aminated polyester acrylate, a modified epoxy acrylate, or a trifunctional polyester acrylate.

In some embodiments, the base resin component comprises one or more of:

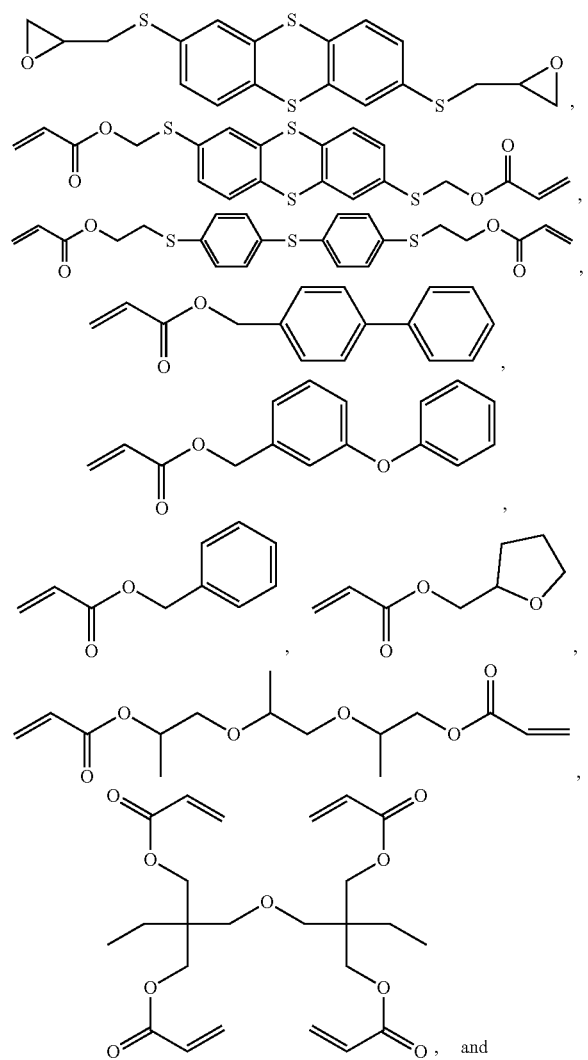

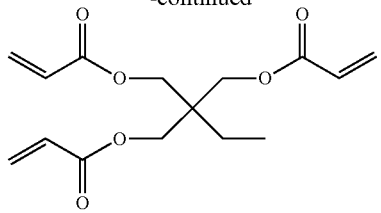

In some embodiments, the base resin component comprises one or more of:

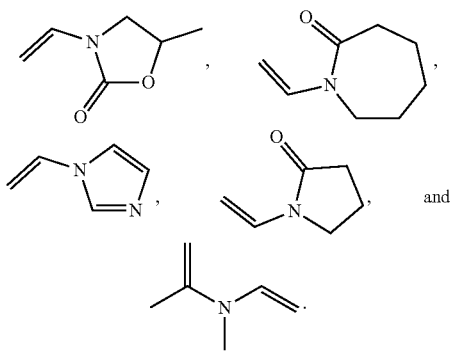

In some embodiments, the base resin component comprises one or more fluorinated compounds. In some embodiments, the one or more fluorinated compounds are selected from: 2,2,3,3,4,4,5,5,6,6,7,7-dodecafluoroheptyl acrylate, 3,3,4,4,5,5,6,6,7,7,8,8,9,9,10,10,11,11,12,12,12-heneicosafluorododecyl acrylate, 3,3,4,4,5,5,6,6,7,7,8,8,9,9,10,10,10-heptadecafluorodecyl methacrylate, 2,2,3,3,4,4,4-heptafluorobutyl acrylate, 2,2,3,3,4,4,4-heptafluorobutyl methacrylate, 2,2,3,3,4,4,4-hexafluorobutyl acrylate, 2,2,3,4,4,4-hexafluorobutyl methacrylate, 1,1,1,3,3,3-hexafluoroisopropyl acrylate, 1,1,1,3,3,3-hexafluoroisopropyl methacrylate, 2,2,3,3,4,4,5,5-octafluoropentyl acrylate, 2,2,3,3,4,4,5,5-octafluoropentyl methacrylate, 2,2,3,3,3-pentafluoropropyl acrylate, 2,2,3,3,3-pentafluoropropyl methacrylate, 1H,1H,2H,2H-perfluorodecyl acrylate, 2,2,3,3-tetrafluoropropyl methacrylate, 3,3,4,4,5,5,6,6,7,7,8,8,8-tridecafluorooctyl acrylate, 3,3,4,4,5,5,6,6,7,7,8,8,8-tridecafluorooctyl methacrylate, 2,2,2-trifluoroethyl methacrylate, and 2-[(1',1',1'-trifluoro-2'-(trifluoromethyl)-2'-hydroxy)propyl]-3-norbornyl methacrylate.

In some embodiments, the one or more resins in the base resin component are provided as commercially available compounds. In some embodiments, the one or more resins in the base resin component are synthesized by various methods. Specifically, in some embodiments, the one or more resins in the base resin component are synthesized such that the resulting resins comprise the desired parameters disclosed herein (e.g., refractive index, viscosity, functional groups, etc.).

In some embodiments, the base resin component further comprises one or more solvents. In some embodiments, the one or more solvents are selected from 2-(1-methoxy)propyl acetate, propylene glycol monomethyl ether acetate, propylene glycol methyl ether, ethyl acetate, ethyl lactate, xylene, and toluene.

In some embodiments, the base resin component is mixed with one or more solvents prior to the application of the NIL precursor material and/or the base resin component to a substrate (e.g., a spin-coating step), such that the addition of solvent decreases the viscosity of the NIL precursor material and/or the base resin component to allow an even application onto the substrate (e.g., a film). In some embodiments, the solvents are removed from the NIL precursor material after the spin-coating step. In some embodiments, the percentage of solvent remaining in the base resin component after the spin-coating step and removal of the solvent is less than 5%.

In some embodiments, the base resin component further comprises one or more of a photo radical generator, a photo acid generator, or both. In some embodiments, depending on the crosslinking functional group or groups that the base resin component comprises, the base resin component is crosslinked or polymerized via radical photopolymerization (e.g., free radical photopolymerization or controlled radical photopolymerization), acid photopolymerization, ionic photopolymerization (e.g., cationic photopolymerization or anionic photopolymerization), and/or a mixture of such. For example, a base resin component comprising an ethylenically unsaturated group can be crosslinked or polymerized via radical photopolymerization (e.g., free radical photopolymerization). To facilitate the polymerization of a base resin component containing the ethylenically unsaturated group, the NIL precursor material further includes one or more photo radical generators (PRGs). Under UV radiation, the PRGs generate radicals that initiate the polymerization or crosslinking process of the ethylenically unsaturated group of the base resin component molecules. In another example, a base resin component comprising an oxirane ring can be crosslinked or polymerized via ionic photopolymerization (e.g., cationic photopolymerization). To facilitate the polymerization of the base resin component comprising the oxirane ring, the NIL precursor material further includes one or more photo acid generators (PAGs). Under UV radiation, the PAGs generate cations or acid that initiate the polymerization or crosslinking process of the oxirane ring of the base resin component molecules.

In some embodiments, the various base resin materials described herein are generally flowable or in liquid form, and thus allow the NIL material mixture to be molded or imprinted at an imprinting temperature close to room temperature, which may include a temperature from about 15° C. to about 50° C. In some embodiments, the various base resin materials described herein may generally allow the NIL material mixture to be molded or imprinted without applying heat to the NIL material mixture or the substrate upon which the NIL material mixture is applied, although thermal processing may be involved in other operations (e.g., polymerization) of the NIL molding process. In some embodiments, thermal treatment may nonetheless be implemented during molding so as to further reduce the viscosity of the NIL material mixture to facilitate the flow of the NIL material mixture inside the mold.

In some embodiments, the base resin component further comprises one or more inhibitors. In some embodiments, the one or more inhibitors are selected from monomethyl ether hydroquinone and 4-tert-butylcatechol. The one or more inhibitors refers to one or more compositions, compounds, molecules, etc., that are capable of inhibiting or substantially inhibiting the crosslinking or polymerization of the crosslinkable or polymerizable component when the photoinitiating light source is on or off. In some embodiments, the one or more inhibitors stabilize the base resin component to prevent crosslinking or polymerization prior to the curing.

The base resin components comprising one or more organic resins or organic elements embodied herein are not intended to exclude further embodiments of base resin components comprising inorganic or metal elements. Rather, in some embodiments, the organic base resin components described herein include carbon elements as well as other non-carbon elements (e.g., hydrogen, sulfur, oxygen, nitrogen, etc.). In some embodiments, the organic base resin includes one or more derivatives from bisfluorene, dithiolane, thianthrene, biphenol, o-phenylphenol, phenoxy benzyl, bisphenol A, bisphenol F, benzyl, phenol, and the like. The organic base resin may have a refractive index greater than or about 1.45, greater than or about 1.5, greater than or about 1.55, greater than or about 1.57, greater than or about 1.58, or greater than or about 1.6. For example, the organic base resin may include a refractive index ranging from 1.45 to 1.8, from 1.5 to 1.8, from 1.55 to 1.8, from 1.57 to 1.8, from 1.58 to 1.77, from 1.58 to 1.73, or from 1.6 to 1.73 in various embodiments.

Additionally, in some embodiments, the base resin component comprises silicone-based base resin components that include an inorganic silicon-oxygen backbone chain. For example, in some embodiments, the base resin component further comprises one or more siloxane derivative compounds. In some embodiments, the base resin component further comprises one or more surfactants. In some implementations, a base resin component includes a surfactant that comprises a main chain of a siloxane skeleton comprising an inorganic silicon-oxygen backbone chain (e.g., X-12-2430C fluorine contained type), a high number of functional groups and at least one fluorine. In some such embodiments, the surfactant provides increased benefits to the base resin component, including but not limited to increased durability against heat and light, high hardness, anti-stain properties, and/or water and oil repellency. In some embodiments, the weight percentage (wt. %) of the surfactant to the base resin component is between 0.1% and 5%. In some embodiments, the one or more surfactants are selected from a fluorinated surfactant, a crosslinkable surfactant, and a non-crosslinkable surfactant. In some embodiments, the base resin does not include silicone-based base resin components that include an inorganic silicon-oxygen backbone chain.

In some embodiments, the one or more surfactants is a crosslinkable, fluorinated acrylic (e.g., 2,2,3,3,4,4,5,5,6,6,7,7-Dodecafluoroheptyl acrylate; 3,3,4,4,5,5,6,6,7,7,8,8,9,9,10,10,11,11,12,12,12-Heneicosafluorododecyl acrylate; 3,3,4,4,5,5,6,6,7,7,8,8,9,9,10,10,10-Heptadecafluorodecyl methacrylate containing MEHQ as inhibitor; 2,2,3,3,4,4,4-Heptafluorobutyl acrylate; 2,2,3,3,4,4,4-Heptafluorobutyl methacrylate; 2,2,3,4,4,4-Hexafluorobutyl acrylate; 2,2,3,4,4,4-Hexafluorobutyl methacrylate; 1,1,1,3,3,3-Hexafluoroisopropyl acrylate; 1,1,1,3,3,3-Hexafluoroisopropyl methacrylate; 2,2,3,3,4,4,5,5-Octafluoropentyl acrylate containing 100 ppm monomethyl ether hydroquinone as inhibitor; 2,2,3,3,4,4,5,5-Octafluoropentyl methacrylate containing 100 ppm MEHQ as inhibitor; 2,2,3,3,3-Pentafluoropropyl acrylate containing 100 ppm 4-tert-butylcatechol as inhibitor; 2,2,3,3,3-Pentafluoropropyl methacrylate containing 100 ppm 4-tert-butylcatechol as inhibitor; 1H,1H,2H,2H-Perfluorodecyl acrylate containing 100 ppm tert-butylcatechol as inhibitor; 2,2,3,3-Tetrafluoropropyl methacrylate; 3,3,4,4,5,5,6,6,7,7,8,8-Tridecafluorooctyl acrylate containing inhibitor; 3,3,4,4,5,5,6,6,7,7,8,8-Tridecafluorooctyl methacrylate containing 100 ppm 4-tert-butylcatechol as inhibitor; 2,2,2-Trifluoroethyl methacrylate containing 50-200 ppm MEHQ as inhibitor; and/or 2-[(1', 1',1'-Trifluoro-2'-(trifluoromethyl)-2'-hydroxy)propyl]-3-norbornyl methacrylate).

In some embodiments, a silicone-based resin has a refractive index that is lower than the refractive index of an organic-based resin. In some embodiments, a silicone-based resin has a refractive index of 1.55 or lower. In some such embodiments, the refractive index of the silicone-based resin is measured at 589 nm. In some embodiments, the base resin component does not include silicon.

In some embodiments, the plurality of nanoparticles comprises one or more of titanium oxide, zirconium oxide, hafnium oxide, tungsten oxide, zinc tellurium, gallium phosphide, or any combination or derivative thereof. In some embodiments, the plurality of nanoparticles comprises titanium oxide nanoparticles. In some embodiments, the plurality of nanoparticles comprises zirconium oxide nanoparticles. In some embodiments, the plurality of nanoparticles comprises a mixture of titanium oxide nanoparticles and zirconium oxide nanoparticles. In some embodiments, the plurality of nanoparticles comprises a plurality of surface-modified nanoparticles, a plurality of capped nanoparticles, or both. In some embodiments, the surface-modified nanoparticles, the capped nanoparticles, or both, comprise a substantially inorganic core, and a substantially organic shell. In some embodiments, the substantially organic shell comprises one or more crosslinkable or polymerizable moieties. In some embodiments, the one or more crosslinkable or polymerizable moieties are linked to the substantially inorganic core. In some embodiments, the crosslinkable or polymerizable moieties comprise one or more of an ethylenically unsaturated group, an oxirane ring, or a heterocyclic group. In some embodiments, the crosslinkable or polymerizable moieties comprise one or more of vinyl, allyl, epoxide, acrylate, and methacrylate. In some embodiments, the crosslinkable or polymerizable moieties comprise one or more of optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate. In some embodiments, the crosslinkable or polymerizable moieties comprise one or more linking groups selected from —Si(—O—)$_3$, alkyl-, alkyl-, —C$_{1-10}$ alkenyl-, alkenyl-, —C$_{1-10}$ cycloalkenyl-, cycloalkenyl-, —C$_{1-10}$ alkynyl-, alkynyl-, —C$_{1-10}$ aryl-, —O—C$_{1-10}$—, -aryl-, —O—, —S—, —C(O)—, C(O)O—, —OC(O)—, —OC(O)O—, —N(R$^b$)—, —C(O)N(R$^b$)—, —N(R$^b$)C(O)—, —OC(O)N(R$^b$)—, —N(R$^b$)C(O)O—, —SC(O)N(R$^b$)—, —N(R$^b$)C(O)S—, N(R$^b$)C(O)N(R$^b$)—, —N(R$_b$)C(NR$_b$)N(R$_b$)—, —N(R$^b$)S(O)$_w$—, S(O)$_w$N(R$_b$)—, —S(O)$_w$O—, —OS(O)$_w$O—, —O(O)P(OR$^b$)O—, (O)P(O—)$_3$, —O(S)P(OR$^b$)O—, and (S)P(O—)$_3$, wherein w is 1 or 2, and R$^b$ is independently hydrogen, optionally substituted alkyl, or optionally substituted aryl. In some embodiments, the substantially organic shell comprises one or more of an organosilane or a corresponding organosilanyl substituent, an organoalcohol or a corresponding organoalkoxy substituent, or an organocarboxylic acid or a corresponding organocarboxylate substituent. In some embodiments, the organosilane is selected from n-propyltrimethoxysilane, n-propyltriethoxysilane, n-octyltrimethoxysilane, n-octyltriethoxysilane, phenylrimethoxysilane, 2-methoxy(polyethyleneoxy)propyltrimethoxysilane, methoxy(triethyleneoxy)propyltrimethoxysilane, 3-aminopropyltrimethoxysilane, 3-mercaptopropyltrimethoxysilane, 3-(methacryloyloxy) propyl trimethoxysilane, 3-isocyanatopropyltriethoxysilane, 3-isocyanatopropyltrimethoxysilane, and glycidoxypropyltrimethoxysilane. In some embodiments, the organoalcohol is selected from heptanol, hexanol, octanol, benzyl alcohol, phenol, ethanol, propanol, butanol, oleylalcohol, dodecylalcohol, octadecanol and triethylene glycol monomethyl ether. In some embodiments, the organocarboxylic acid is selected from octanoic acid, acetic acid, propionic acid, 2-2-(2-methoxyethoxy)ethoxyacetic acid, oleic acid, and benzoic acid. In some embodiments, the substantially organic shell comprises one or more of 3-(methacryloyloxy)propyl trimethoxysilane, 3-(methacryloyloxy)propyl dimethoxysilyl, or 3-(methacryloyloxy)propyl methoxysiloxyl. In some embodiments, the diameter of a substantially inorganic core ranges from about 1 nm to about 25 nm. In some embodiments, the diameter of a substantially inorganic core is selected from about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm. In some embodiments, the diameter of a substantially inorganic core is measured by transmission electron microscopy (TEM). In some embodiments, the diameter of a surface-modified nanoparticle, a capped nanoparticle, or both, including a substantially organic shell, ranges from about 5 nm to about 100 nm. In some embodiments, the diameter of a surface-modified nanoparticle, a capped nanoparticle, or both, including a substantially organic shell, ranges from about 10 nm to about 50 nm. In some embodiments, the diameter of a surface-modified nanoparticle, a capped nanoparticle, or both, including a substantially organic shell, is selected from about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm, about 26 nm, about 27 nm, about 28 nm, about 29 nm, about 30 nm, about 31 nm, about 32 nm, about 33 nm, about 34 nm, about 35 nm, about 36 nm, about 37 nm, about 38 nm, about 39 nm, about 40 nm, about 41 nm, about 42 nm, about 43 nm, about 44 nm, about 45 nm, about 46 nm, about 47 nm, about 48 nm, about 49 nm, about 50 nm, about 51 nm, about 52 nm, about 53 nm, about 54 nm, about 55 nm, about 56 nm, about 57 nm, about 58 nm, about 59 nm, about 60 nm, about 61 nm, about 62 nm, about 63 nm, about 64 nm, about 65 nm, about 66 nm, about 67 nm, about 68 nm, about 69 nm, about 70 nm, about 71 nm, about 72 nm, about 73 nm, about 74 nm, about 75 nm, about 76 nm, about 77 nm, about 78 nm, about 79 nm, about 80 nm, about 81 nm, about 82 nm, about 83 nm, about 84 nm, about 85 nm, about 86 nm, about 87 nm, about 88 nm, about 89 nm, about 90 nm, about 91 nm, about 92 nm, about 93 nm, about 94 nm, about 95 nm, about 96 nm, about 97 nm, about 98 nm, about 99 nm, and about 100 nm. In some embodiments, the diameter of a surface-modified nanoparticle, a capped nanoparticle, or both, including a substantially organic shell, is measured by dynamic light scattering (DLS). In some embodiments, the volume fraction of the substantially inorganic core in the surface-modified nanoparticles, the capped nanoparticles, or both, ranges from about 60% to about 90%. In some embodiments, the volume fraction of the substantially inorganic core in the surface-modified nanoparticles, the capped nanoparticles, or both, is selected from about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, and about 90%. In some embodiments, the volume fraction of the substantially organic shell in the surface-modified nanoparticles, the capped nanoparticles, or both, ranges from about 10% to about 40%. In some embodiments, the volume fraction of the substantially organic shell in the surface-modified nanoparticles, the capped nanoparticles, or both, is selected from about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, and about 40%. In some embodiments, the refractive index of the plurality of nanoparticles ranges from 2.00 to 2.61. In some embodiments, the refractive index of the plurality of nanoparticles is selected from about 2.00, about 2.01, about 2.02, about 2.03, about 2.04, about 2.05, about 2.06, about 2.07, about 2.08, about 2.09, about 2.10, about 2.11, about 2.12, about 2.13, about 2.14, about 2.15, about 2.16, about 2.17, about 2.18, 2.19, about 2.20, about 2.21, about 2.22, about 2.23, about 2.24, about 2.25, about 2.26, about 2.27, about 2.28, about 2.29, about 2.30, about 2.31, about 2.32, about 2.33, about 2.34, about 2.35, about 2.36, about 2.37, about 2.38, about 2.39, about 2.40, about 2.41, about 2.42, about 2.43, about 2.44, about 2.45, about 2.46, about 2.47, about 2.48, about 2.49, about 2.50, about 2.51, about 2.52, about 2.53, about 2.54, about 2.55, about 2.56, about 2.57, about 2.58, about 2.59, about 2.60, and about 2.61. In some embodiments, the volume fraction of the plurality of nanoparticles in the precursor material ranges from about 50% to about 90%. In some embodiments, the volume fraction of the plurality of nanoparticles in the precursor material ranges from about 60% to about 80%.

In some embodiments, the NIL precursor material further includes nanoparticles for increasing the refractive index of the NIL precursor material. In some embodiments, the nanoparticles comprise one or more metal oxides having relatively high refractive indices. For example, in some embodiments, certain classes of inorganic nanoparticles such as zirconium oxide ($ZrO_x$), hafnium oxide ($HfO_x$), and/or titanium oxide ($TiO_x$ or $TiO_2$) may have higher refractive indices than the refractive index of the base resin component, such that the addition of the nanoparticles component to the NIL precursor material increases the overall refractive index of the NIL precursor material. In contrast, in some embodiments, certain classes of organic nanoparticles may have lower refractive indices than the refractive index of the base resin component.

In some embodiments, the weight percentage loading (wt. %) of the nanoparticles component to the NIL precursor material ranges from 40 wt. % to 95 wt. %, from 50 wt. % to 90 wt. %, or from 55 wt. % to 85 wt. %. In some embodiments, the weight percentage loading of the nanoparticles component to the NIL precursor material is about 55%, about 56%, about 57%, about 58%, about 59%, about 60%, about 61%, about 62%, about 63%, about 64%, about 65%, about 66%, is about 67%, about 68%, about 69%, about 70%, about 71%, about 72%, about 73%, about 74%, about 75%, about 76%, is about 77%, about 78%, about 79%, about 80%, about 81%, about 82%, about 83%, about 84%, or about 85%. In some embodiments, increasing the loading (e.g., the weight or mass percentage) of high refractive index nanoparticles further increases the refractive index of the NIL precursor material.

In some embodiments, the nanoparticles component comprises one or more of titanium oxide, zirconium oxide, hafnium oxide, tungsten oxide, zinc tellurium, gallium phosphide, or any combination or derivative thereof. In some embodiments, the nanoparticles component comprises titanium oxide nanoparticles. In some embodiments, the nanoparticles component comprises zirconium oxide nanoparticles. In some embodiments, the nanoparticles component comprises more than one type of nanoparticles to form a blend of nanoparticles. In some embodiments, the nanoparticles component comprises a mixture of titanium oxide nanoparticles and zirconium oxide nanoparticles. In some embodiments, the nanoparticles may have a refractive index between about 1.7 and about 3.4, between about 1.75 and about 3.4, or between about 1.8 and about 3.4.

In some embodiments, the nanoparticles component comprises a plurality of surface-modified nanoparticles, a plurality of capped nanoparticles, or both. In some embodiments, the surface-modified nanoparticles, the capped nanoparticles, or both, comprise a substantially inorganic core, and a substantially organic shell. FIG. 15 illustrates a cross-sectional view of an exemplary nanoparticle, showing the structure of the nanoparticle in accordance with some embodiments. In some such embodiments, the substantially inorganic core is represented by the inner circle, with a diameter indicated by $r_1$, and the substantially organic shell is represented by the outer circle, with a diameter indicated by $r_2=r_1+1$. For example, in FIG. 15, the substantially inorganic core comprises $TiO_2$.

In some embodiments, the substantially organic shell comprises one or more crosslinkable or polymerizable moieties. For example, FIG. 15 illustrates the substantially organic shell comprising a plurality of ligands. In some embodiments, the crosslinkable or polymerizable moieties are covalently bonded to the substantially organic shell of the surface-modified nanoparticles, the capped nanoparticles, or both. In some embodiments, the one or more crosslinkable or polymerizable moieties are linked to the substantially inorganic core.

In some embodiments, the nanoparticles component comprises one or more crosslinkable or polymerizable moieties (e.g., metal oxide ligands) capable of reacting with the crosslinkable or polymerizable moieties of the base resin component. In some embodiments, the reactivity of the crosslinkable or polymerizable moieties of the nanoparticles component with the corresponding crosslinkable or polymerizable moieties of the base resin component allows the nanoparticles to crosslink or polymerize with the base resin component during the curing step, resulting in a cured NIL material with high mechanic strength sufficient to withstand the various steps of the molding process (e.g., the delamination step). Conversely, in some embodiments, a NIL precursor material comprising a non-reactive nanoparticles component where the nanoparticles are suspended in but do not crosslink or polymerize with the base resin component, results in a cured NIL material with low mechanic strength and greater fragility.

In some such embodiments, the crosslinkable or polymerizable ligands are acrylate, methyl acrylate and derivatives, vinyl groups (e.g., olefin or heterocyclic) and derivatives, and/or a mixture of such.

For example, a nanoparticles component comprising an acrylate group can, in some embodiments, crosslink with a base resin component comprising an acrylate resin. A byproduct of nanoparticle synthesis is the presence of functional groups on the surface of the nanoparticle, such as the presence of —OH groups caused by hydrolysis and condensation during the synthesis of titanium oxide nanoparticles. These —OH groups can be functionalized with other functional groups (e.g., silane) that are subsequently bound to crosslinkable or polymerizable moieties (e.g., acrylate and/or methacrylate). By thus modifying the reactivity of the ligands present on the surface of the nanoparticles, the crosslinkable or polymerizable moieties of the nanoparticles (e.g., acrylate and/or methacrylate) are able to form covalent bonds with the crosslinkable or polymerizable moieties in the base resin component (e.g., acrylate and/or methacrylate) upon exposure to electromagnetic radiation (e.g., a wavelength of UV light).

In some embodiments, the functional groups that link the substantially organic shell of the nanoparticles with the crosslinkable or polymerizable moieties are selected depending on their reactivity (e.g., ability to form covalent bonds) with the crosslinkable or polymerizable moieties. In some embodiments, the crosslinkable or polymerizable moieties of the substantially organic shell of the nanoparticles are selected depending on their reactivity with the crosslinkable or polymerizable moieties of the base resin component. In some embodiments, the crosslinkable or polymerizable ligands comprise no less than 2 unique types of crosslinkable or polymerizable functional groups.

For example, in some embodiments, the crosslinkable or polymerizable moieties comprise one or more of an ethylenically unsaturated group, an oxirane ring, or a heterocyclic group. In some embodiments, the crosslinkable or polymerizable moieties comprise one or more of vinyl, allyl, epoxide, acrylate, and methacrylate.

In some embodiments, the crosslinkable or polymerizable moieties comprise one or more of optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

In some embodiments, the crosslinkable or polymerizable moieties comprise one or more linking groups selected from —Si(—O—)$_3$, —C$_{1-10}$ alkyl-, —O—C$_{1-10}$ alkyl-, —C$_{1-10}$ alkenyl-, —O—C$_{1-10}$ alkenyl-, —C$_{1-10}$ cycloalkenyl-, —O—C$_{1-10}$ cycloalkenyl-, —C$_{1-10}$ alkynyl-, —O—C$_{1-10}$ alkynyl-, —C$_{1-10}$ aryl-, —O—C$_{1-10}$—, -aryl-, —O—, —S—, —C(O)—, —C(O)O—, —OC(O)—, —OC(O)O—, —N(R$^b$)—, —C(O)N(R$^b$)—, —N(R$^b$)C(O)—, —OC(O)N(R$^b$)—, —N(R$^b$)C(O)O—, —SC(O)N(R$^b$)—, —N(R$^b$)C(O)S—, —N(R$_b$)C(O)N(R$^b$)—, —N(R$^b$)C(NR$^b$)N(R$^b$)—, —N(R$^b$)S(O)$_w$—, —S(O)$_w$N(R$^b$)—, —S(O)$_w$O—, —OS(O)$_w$—, —OS(O)$_w$O—, —O(O)P(OR$^b$)O—, (O)P(O—)$_3$, —O(S)P(OR$^b$)O—, and (S)P(O—)$_3$, where w is 1 or 2, and R$^b$ is independently hydrogen, optionally substituted alkyl, or optionally substituted aryl.

In some embodiments, the substantially organic shell comprises one or more of an organosilane or a corresponding organosilanyl substituent, an organoalcohol or a corresponding organoalkoxy substituent, or an organocarboxylic acid or a corresponding organocarboxylate substituent. In some embodiments, the organosilane is selected from n-propyltrimethoxysilane, n-propyltriethoxysilane, n-octyltrimethoxysilane, n-octyltriethoxysilane, phenylrimethoxysilane, 2-methoxy(polyethyleneoxy)propyltrimethoxysilane, methoxy(triethyleneoxy)propyltrimethoxysilane, 3-aminopropyltrimethoxysilane, 3-mercaptopropyltrimethoxysilane, 3-(methacryloyloxy)propyl trimethoxysilane, 3-isocyanatopropyltriethoxysilane, 3-isocyanatopropyltrimethoxysilane, and glycidoxypropyltrimethoxysilane. In some embodiments, the organoalcohol is selected from heptanol, hexanol, octanol, benzyl alcohol, phenol, ethanol, propanol, butanol, oleylalcohol, dodecylalcohol, octadecanol and triethylene glycol monomethyl ether. In some embodiments, the organocarboxylic acid is selected from octanoic acid, acetic acid, propionic acid, 2-2-(2-methoxyethoxy)ethoxyacetic acid, oleic acid, and benzoic acid.

In some embodiments, the substantially organic shell comprises one or more of 3-(methacryloyloxy)propyl trimethoxysilane, 3-(methacryloyloxy)propyl dimethoxysilyl, or 3-(methacryloyloxy)propyl methoxysiloxyl.

In some embodiments, the diameter of a substantially inorganic core ranges from about 1 nm to about 25 nm. For illustration, in FIG. 15, the diameter of a substantially inorganic core is represented by IT In some embodiments, the diameter of a substantially inorganic core is selected from about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm. In some embodiments, the diameter of a substantially inorganic core is between 0.1 nm to 1 nm. In some embodiments, the diameter of a substantially inorganic core is between 25 nm and 1 μm.

In some embodiments, the diameter of a substantially inorganic core is measured by transmission electron microscopy (TEM).

In some embodiments, the diameter of a surface-modified nanoparticle, a capped nanoparticle, or both, including a substantially organic shell, ranges from about 5 nm to about 100 nm. For example, in FIG. 15, the diameter of an exemplary nanoparticle including a substantially organic shell is represented by $r_2=r_1+l$. In some embodiments, the diameter of a surface-modified nanoparticle, a capped nanoparticle, or both, including a substantially organic shell, ranges from about 10 nm to about 50 nm. In some embodiments, the diameter of a surface-modified nanoparticle, a capped nanoparticle, or both, including a substantially organic shell, is between 0.1 nm and 5 nm. In some embodiments, the diameter of a surface-modified nanoparticle, a capped nanoparticle, or both, including a substantially organic shell, is between 100 nm and 1 μm.

In some embodiments, the diameter of a surface-modified nanoparticle, a capped nanoparticle, or both, including a substantially organic shell, is selected from about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm, about 26 nm, about 27 nm, about 28 nm, about 29 nm, about 30 nm, about 31 nm, about 32 nm, about 33 nm, about 34 nm, about 35 nm, about 36 nm, about 37 nm, about 38 nm, about 39 nm, about 40 nm, about 41 nm, about 42 nm, about 43 nm, about 44 nm, about 45 nm, about 46 nm, about 47 nm, about 48 nm, about 49 nm, about 50 nm, about 51 nm, about 52 nm, about 53 nm, about 54 nm, about 55 nm, about 56 nm, about 57 nm, about 58 nm, about 59 nm, about 60 nm, about 61 nm, about 62 nm, about 63 nm, about 64 nm, about 65 nm, about 66 nm, about 67 nm, about 68 nm, about 69 nm, about 70 nm, about 71 nm, about 72 nm, about 73 nm, about 74 nm, about 75 nm, about 76 nm, about 77 nm, about 78 nm, about 79 nm, about 80 nm, about 81 nm, about 82 nm, about 83 nm, about 84 nm, about 85 nm, about 86 nm, about 87 nm, about 88 nm, about 89 nm, about 90 nm, about 91 nm, about 92 nm, about 93 nm, about 94 nm, about 95 nm, about 96 nm, about 97 nm, about 98 nm, about 99 nm, and about 100 nm.

In some embodiments, the diameter of a surface-modified nanoparticle, a capped nanoparticle, or both, including a substantially organic shell, is measured by dynamic light scattering (DLS).

In some embodiments, the diameter of a substantially inorganic core or a nanoparticle (e.g., a surface-modified nanoparticle, a capped nanoparticle, or both, including a substantially organic shell), is measured by transmission electron microscopy (TEM), dynamic light scattering (DLS), laser diffraction, field flow fractionation, particle tracking analysis, size exclusion chromatography, centrifugal sedimentation, and atomic force microscopy, X-ray diffraction, hydrodynamic chromatography, static light scattering, multiangle light scattering, nephelometry, laser-induced breakdown detection, ultraviolet-visible spectroscopy, near-field scanning optical microscopy, confocal laser scanning microscopy, capillary electrophoresis, ultracentrifugation, cross-flow filtration, small-angle X-ray scattering, and differential mobility analysis. In some embodiments, the diameter and/or size of a substantially inorganic core or a nanoparticle (e.g., a surface-modified nanoparticle, a capped nanoparticle, or both, including a substantially organic shell), is calculated from physical properties such as settling velocity, diffusion rate or coefficient, and electrical mobility, or from measured parameters such as Feret diameter, Martin diameter and projected area diameters.

In some embodiments, the volume fraction of the substantially inorganic core in the surface-modified nanoparticles, the capped nanoparticles, or both, ranges from about 60% to about 90%. Referring to FIG. 15, in some embodiments, the volume fraction of the substantially inorganic core in the surface-modified nanoparticles, the capped nanoparticles, or both, is determined using Rytov's formula $\gamma_c = r_1^3/(r_1+l)^3$, where $\gamma_c$ is the volume fraction of the substantially inorganic core.

In some embodiments, the volume fraction of the substantially inorganic core in the surface-modified nanoparticles, the capped nanoparticles, or both, is selected from about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, and about 90%. In some embodiments, the volume fraction of the substantially inorganic core in the surface-modified nanoparticles, the capped nanoparticles, or both, is less than 60% or greater than 90%.

In some embodiments, the volume fraction of the substantially organic shell in the surface-modified nanoparticles, the capped nanoparticles, or both, ranges from about 10% to about 40%. Referring to FIG. 15, in some embodiments, the volume fraction of the substantially organic shell in the surface-modified nanoparticles, the capped nanoparticles, or both, is determined using Rytov's formula $$\gamma_l = \frac{l(l^2 + 3r_1 l + 3r_1^2)}{(r_1 + l)^3},$$

where $\gamma_l$ is the volume fraction of the substantially organic shell.

In some embodiments, the volume fraction of the substantially organic shell in the surface-modified nanoparticles, the capped nanoparticles, or both, is selected from about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, and about 40%. In some embodiments, the volume fraction of the substantially organic shell in the surface-modified nanoparticles, the capped nanoparticles, or both, is less than 10% or greater than 40%.

Referring to FIG. 15, in some embodiments, the second refractive index is determined using Rytov's formula $n_{NP} = \sqrt{\gamma_c n_c^2 + \gamma_l n_l^2}$, where $\gamma_c$ is the volume fraction of the substantially inorganic core, $\gamma_l$ is the volume fraction of the substantially organic shell, $n_{NP}$ is the refractive index of the nanoparticle, $n_c$ is the refractive index of the substantially inorganic core, and $n_l$ is the refractive index of the substantially organic shell.

For example, in some embodiments, given $n_c=2.5$, $n_l=1.5$, $r_1=5$ nm, and $l=0.5$ nm, then $\gamma_c=0.75$, $\gamma_l=0.25$, and $n_{NP}=2.29$. In some alternative embodiments, given $n_c=2.5$, $n_l=1.5$, $r_1=5$ nm, and $l=0.75$ nm, then $\gamma_c=0.66$, $\gamma_l=0.34$, and $n_{NP}=2.21$. In some alternative embodiments, given $n_c=2.5$, $n_l=1.5$, $r_1=5$ nm, and $l=1$ nm, then $\gamma_c=0.58$, $\gamma_l=0.42$, and $n_{NP}=2.14$. Further embodiments of nanoparticle refractive index calculations are provided in Table 25 below.

In some embodiments, the nanoparticles component is provided as commercially available nanoparticles. In some embodiments, the nanoparticles component is synthesized by various methods. Specifically, in some embodiments, the nanoparticles component is synthesized such that the resulting nanoparticles comprise the desired parameters disclosed herein (e.g., refractive index, size, functional groups, etc.). In some embodiments, the nanoparticles component in combination with the base resin component reduces shrinkage of the NIL precursor material after curing.

In some embodiments, the disclosure provides a process for making an NIL grating described herein, the process further comprising a precursor material curing step after the imprinting step, wherein the curing step comprises subjecting the first precursor NIL grating to a light source to generate a second precursor NIL grating.

In some embodiments, the disclosure provides a process for making an NIL grating described herein, the process further comprising subjecting the first precursor NIL grating or the second precursor NIL grating to oxidative conditions. In some embodiments, the disclosure provides a process for making an NIL grating described herein, the process further comprising subjecting the first precursor NIL grating or the second precursor NIL grating to a plasma source. In some embodiments, the disclosure provides a process for making an NIL grating described herein, the process further comprising subjecting the first precursor NIL grating or the second precursor NIL grating to oxygen plasma. In some embodiments, the subjecting the first precursor NIL grating or the second precursor NIL grating to oxidative conditions, a plasma source, or oxygen plasma, removes all or a portion of an organic material from the precursor NIL grating. In some embodiments, substantially all of the organic material is removed from the precursor NIL grating. In some embodiments, the subjecting the first precursor NIL grating or the second precursor NIL grating to oxidative conditions, a plasma source, or oxygen plasma, is performed for between about 1 and about 10 minutes. In some embodiments, the subjecting the first precursor NIL grating or the second precursor NIL grating to oxidative conditions, a plasma source, or oxygen plasma, is performed for between about 2 and about 5 minutes. In some embodiments, the subjecting the first precursor NIL grating or the second precursor NIL grating to oxidative conditions, a plasma source, or oxygen plasma, generates a third precursor NIL grating comprising a plurality of micro- or nanovoids. In some embodiments, the disclosure provides a process for making an NIL grating described herein, the process further comprising a metal oxide infiltration step. In some embodiments, the disclosure provides a process for making an NIL grating described herein, the process further comprising an atomic layer deposition (ALD) step. In some embodiments, the ALD step is a thermal reaction. In some embodiments, the disclosure provides a process for making an NIL grating described herein, the process further comprising a plasma reaction process step. In some embodiments, a portion of the plurality of micro- or nanovoids is infiltrated with titanium oxide, zirconium oxide, hafnium oxide, tungsten oxide, zinc tellurium, gallium phosphide, or any combination or derivative thereof. In some embodiments, the infiltration is performed at a temperature ranging from 30° C. to 500° C. In some embodiments, the infiltration is performed at a temperature ranging from 40° C. to 70° C. In some embodiments, the metal oxide infiltration step, the atomic layer deposition step, and/or the plasma reaction process step, are each independently performed for a number of cycles ranging between 1 and 20. In some embodiments, the metal oxide infiltration step, the atomic layer deposition step, and/or the plasma reaction process step, are each independently performed for a number of cycles ranging between 5 and 10.

In some embodiments, the NIL precursor material is applied or deposited for NIL molding by, for example, spin-coating, lamination, and/or ink injection on a substrate or waveguide to form a NIL material layer (e.g., a film). In some embodiments, the NIL material layer undergoes heat treatment prior to curing (e.g., post-apply bake). In some embodiments, the NIL material layer is molded (e.g., imprinted, using any of the NIL processes described herein) and/or cured (e.g., by light) to form a NIL-molded nanostructure, such as a slanted surface-relief grating. In some embodiments, the cured NIL material undergoes heat treatment after curing (e.g., post-exposure bake).

In some embodiments, the curing is achieved via a process where the base resin component is crosslinked and/or polymerized, and the curing causes the base resin component to undergo shrinkage. In some such embodiments, the extent of shrinkage is modulated by the formulation of the base resin such that, for example, a base resin component comprising smaller molecules results in increased shrinkage, and a base resin component comprising larger molecules (e.g., oligomers) and/or fillers (e.g., nanoparticles) results in decreased shrinkage. As a result, in some embodiments, the weight percentage of the nanoparticles component to the cured NIL material after curing is different from the weight percentage of the nanoparticles component to the NIL precursor material prior to curing. In some alternative embodiments, the weight percentage of the nanoparticles component to the cured NIL material is the same as the weight percentage of the nanoparticles component to the NIL precursor material before curing.

In some embodiments, exposing the NIL precursor material to a light source (e.g., a UV light source) causes a photocatalytic effect that degrades the base resin component (e.g., a base resin component comprising either a low refractive index or a high refractive index). For example, in some embodiments, photocatalytic degradation occurs in a NIL precursor material loaded with $TiO_2$ nanoparticles by a mechanism where the absorption of UV light by $TiO_2$ nanoparticles generates radicals that can attack the organic backbone of a cured organic polymer. In some embodiments, the refractive index of the NIL precursor material is higher than the third refractive index of the cured NIL material.

Figure 5:
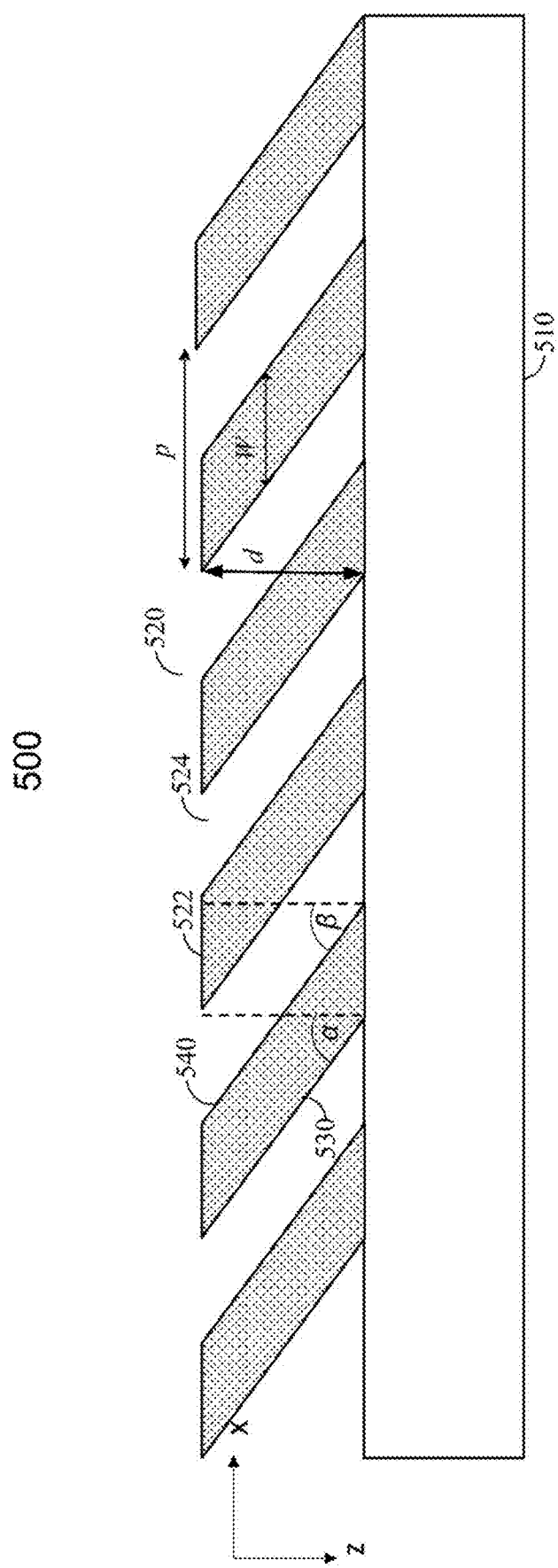
FIG. 5. illustrates an example slanted grating coupler in an example waveguide display according to certain embodiments.

In some embodiments, the grating is a slanted grating or a non-slanted grating. In some embodiments, the grating has a duty cycle ranging from 10% to 90%. For example, FIGS. 16A and 16B illustrate a slanted grating and a non-slanted grating, respectively. Furthermore, as illustrated in FIG. 5 and FIG. 16A, the duty cycle is a ratio between the width of a ridge (e.g., W) and the grating period (e.g., p). In some embodiments, the grating has a small or large duty cycle (e.g., below 30% or greater than 70%). In some embodiments, the grating has a duty cycle of less than 10%. In some embodiments, the grating has a duty cycle ranging from 30% to 90%. In some embodiments, the grating has a duty cycle ranging from 35% to 90%. In some embodiments, the grating has a duty cycle of greater than 90%.

In some embodiments, the grating period is between 100 nm and 1 µm. In some embodiments, the grating period ranges between 100 and 300 nm, 300 and 500 nm, 500 and 700 nm, or between 700 nm and 1 µm. In some embodiments, the grating period is less than 100 nm or greater than 1 µm.

In some embodiments, a slanted grating comprises at least one slant angle ranging from more than 0° to 70°. As illustrated in FIG. 5 and FIG. 16B, the slant angle (e.g., "Slant") is determined using the angle for the leading edge α and the angle for the trailing edge β, using the formula Slant=arctan[(tan(α)+tan(β))*0.5]. In some embodiments, the NIL-molded grating has a slant angle that is greater than 10°, 20°, 30°, 40°, 50°, 60°, 70°, or higher. In some embodiments, a slanted grating comprises at least one slant angle greater than 30°. In some embodiments, a slanted grating comprises at least one slant angle greater than 35°.

In some embodiments, the grating has a depth greater than 100 nm. In some embodiments, the grating has a depth ranging between 10 and 50 nm, between 50 and 100 nm, between 100 and 200 nm, between 200 and 500 nm, between 500 nm and 1 µm, or higher than 1 µm.

In some embodiments, the grating has an aspect ratio greater than 3:1. In some embodiments, the grating has an aspect ratio of about 1:1, about 4:3, about 3:2, about 16:9, about 2:1, about 21:9, about 3:1, about 4:1, about 5:1, about 6:1, about 7:1, about 8:1, about 9:1, or about 10:1.

In some embodiments, the NIL materials disclosed herein are used to fabricate other slanted or non-slanted structures. In some embodiments, the grating is assessed for imprintability and/or optical performance (e.g. haze, RI, absorption of resins, etc.) after spin-coating, curing, and/or delamination.

The disclosure also provides an optical component comprising any of the NIL gratings described herein. In some embodiments, the optical components include a diffractive optical element (e.g., a surface-relief grating) that allows light of projected images to be coupled into or out of the waveguide for optical display.

The disclosure also provides a method of forming any of the NIL gratings described herein, the method comprising imprinting the NIL precursor material using a NIL process.

The disclosure also provides a method of forming the optical component described herein, the method comprising imprinting the NIL precursor material using a NIL process. In some embodiments, the method of forming the NIL grating and/or the optical component described herein comprises any of the NIL processes described in the present disclosure and/or illustrated in FIGS. 6-9.

Figure 1:
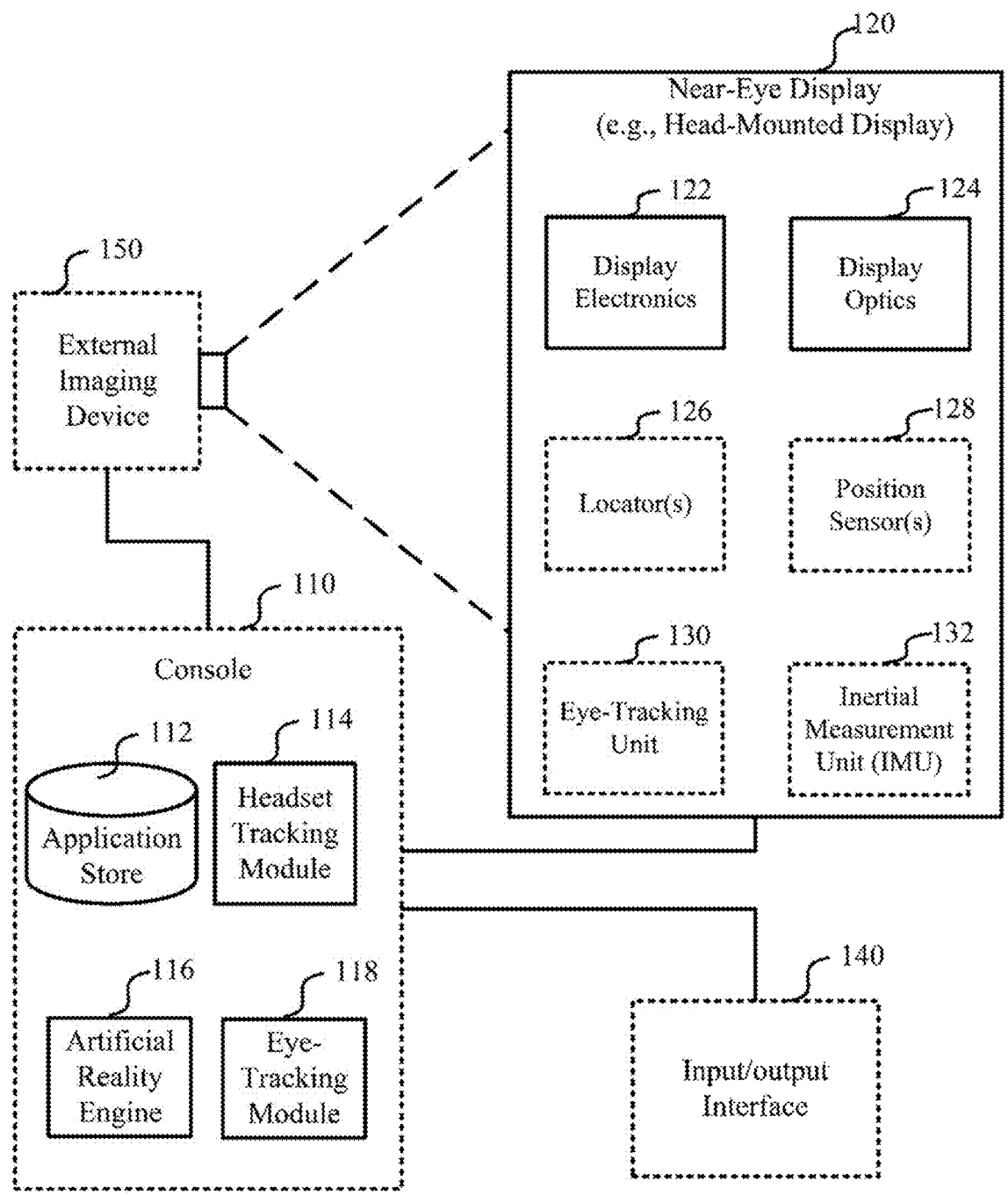
FIG. 1 is a simplified block diagram of an example artificial reality system environment including a near-eye display according to certain embodiments.

Next-generation artificial reality (e.g., augmented reality (AR), virtual reality (VR), or mixed reality (MR)) devices require a large field-of-view and high see-through quality. One way to achieve such performance is to use nanoimprinting lithography (NIL) to fabricate surface-relief gratings with a high refractive index. In some embodiments, the disclosure provides an optical component comprising an NIL grating described herein. FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form factor, including a pair of glasses. Some embodiments of near-eye display 120 are further described below with respect to FIGS. 2-4. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (mLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, chromatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120. Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light. In some embodiments, at least some of the functions of eye-tracking module 118 may be performed by eye-tracking unit 130.

Figure 2:
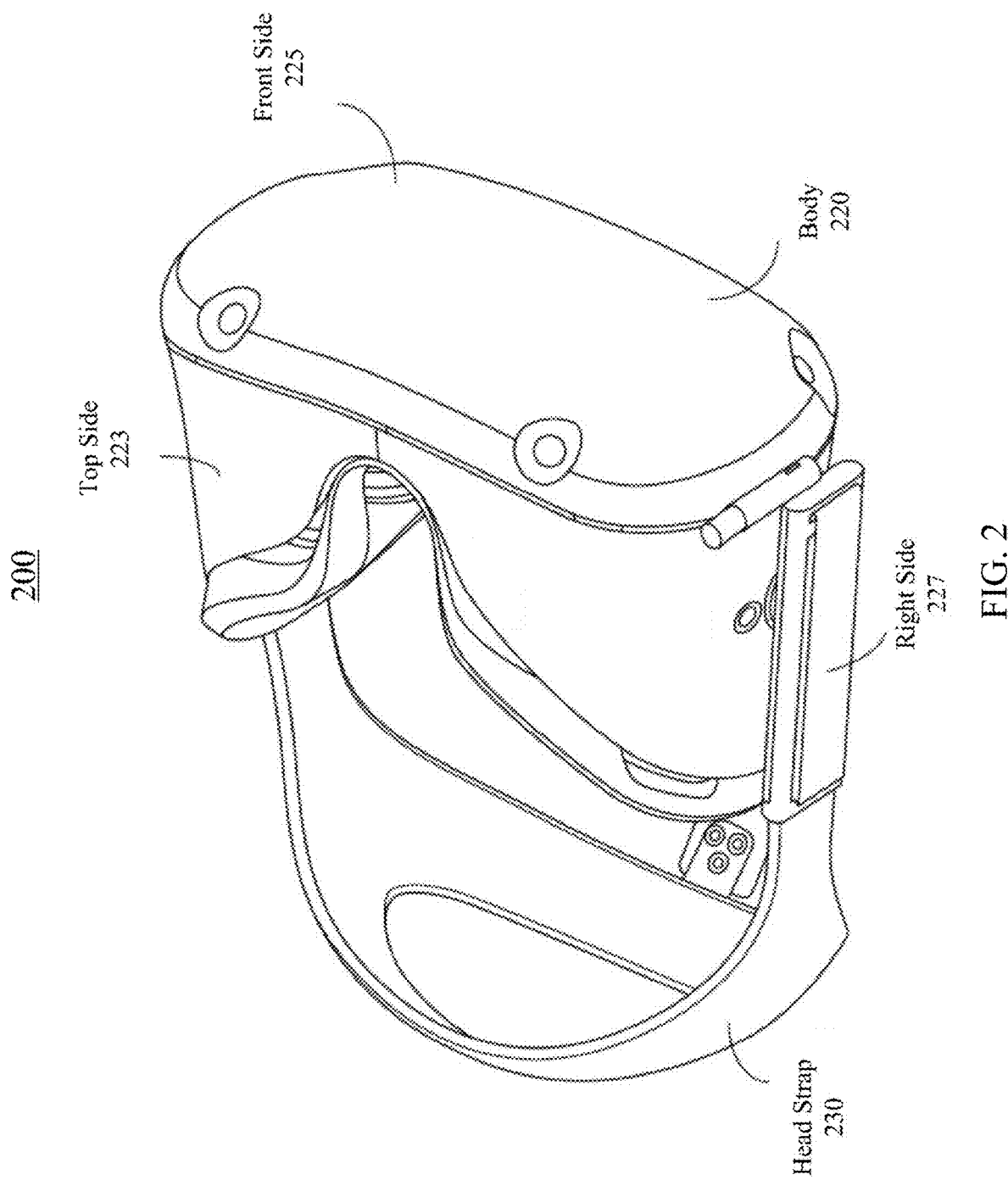
FIG. 2 is a perspective view of an example near-eye display in the form of a head-mounted display (HMD) device for implementing some of the examples disclosed herein.

FIG. 2 is a perspective view of an example of a near-eye display in the form of a head-mounted display (HMD) device 200 for implementing some of the examples disclosed herein. HMD device 200 may be a part of, e.g., a virtual reality (VR) system, an augmented reality (AR) system, a mixed reality (MR) system, or some combinations thereof. HMD device 200 may include a body 220 and a head strap 230. FIG. 2 shows a top side 223, a front side 225, and a right side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temples tips as shown in, for example, FIG. 2, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro light emitting diode (mLED) display, an active-matrix organic light emitting diode (AMOLED) display, a transparent organic light emitting diode (TOLED) display, some other display, or some combinations thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or some combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
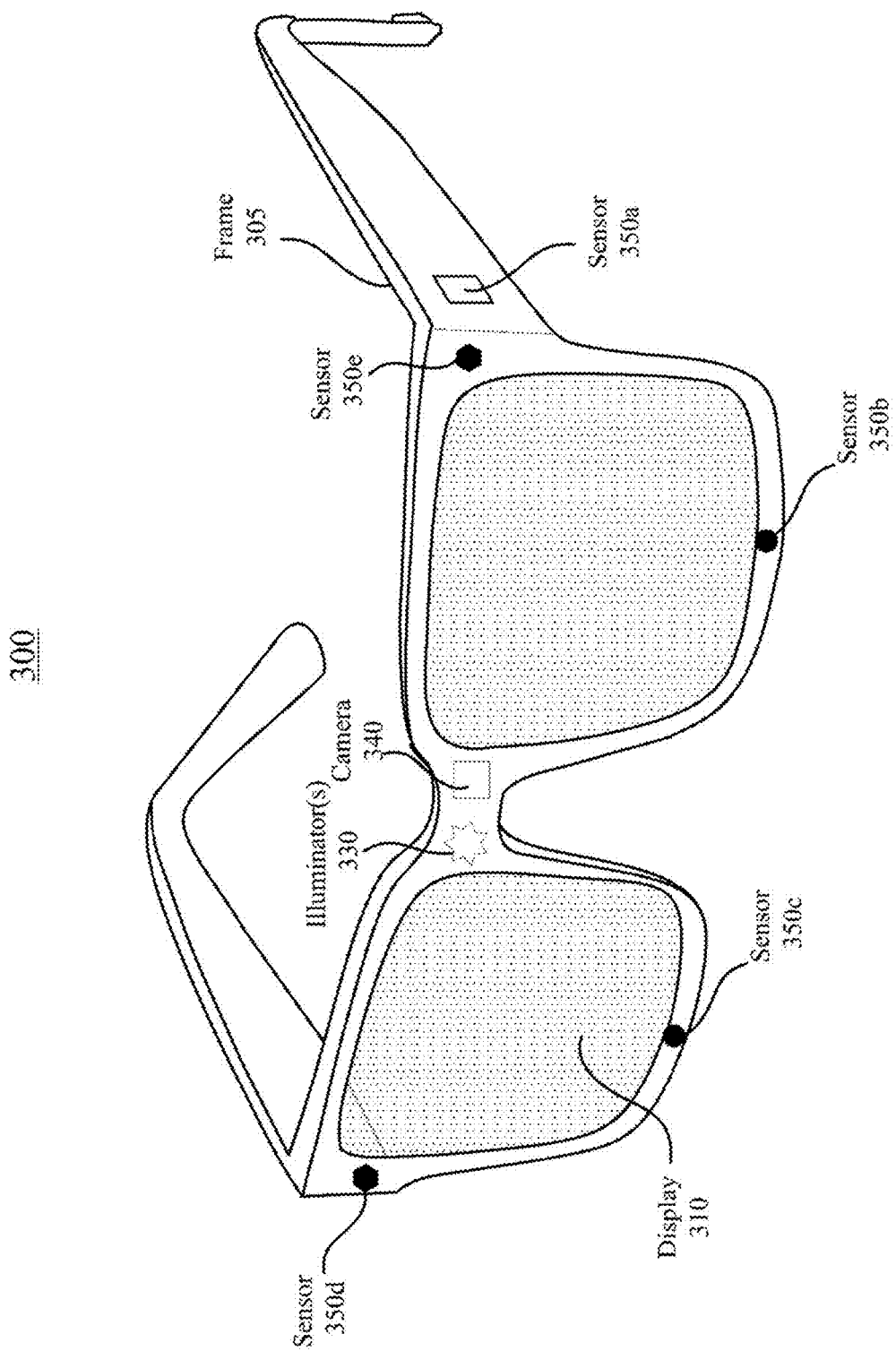
FIG. 3 is a perspective view of an example near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350$a$, 350$b$, 350$c$, 350$d$, and 350$e$ on or within frame 305. In some embodiments, sensors 350$a$-350$e$ may include one or more depth sensors, motion sensors, position sensors, inertial sensors, or ambient light sensors. In some embodiments, sensors 350$a$-350$e$ may include one or more image sensors configured to generate image data representing different fields of views in different directions. In some embodiments, sensors 350$a$-350$e$ may be used as input devices to control or influence the displayed content of near-eye display 300, and/or to provide an interactive VR/AR/MR experience to a user of near-eye display 300. In some embodiments, sensors 350$a$-350$e$ may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350$a$-350$e$ in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
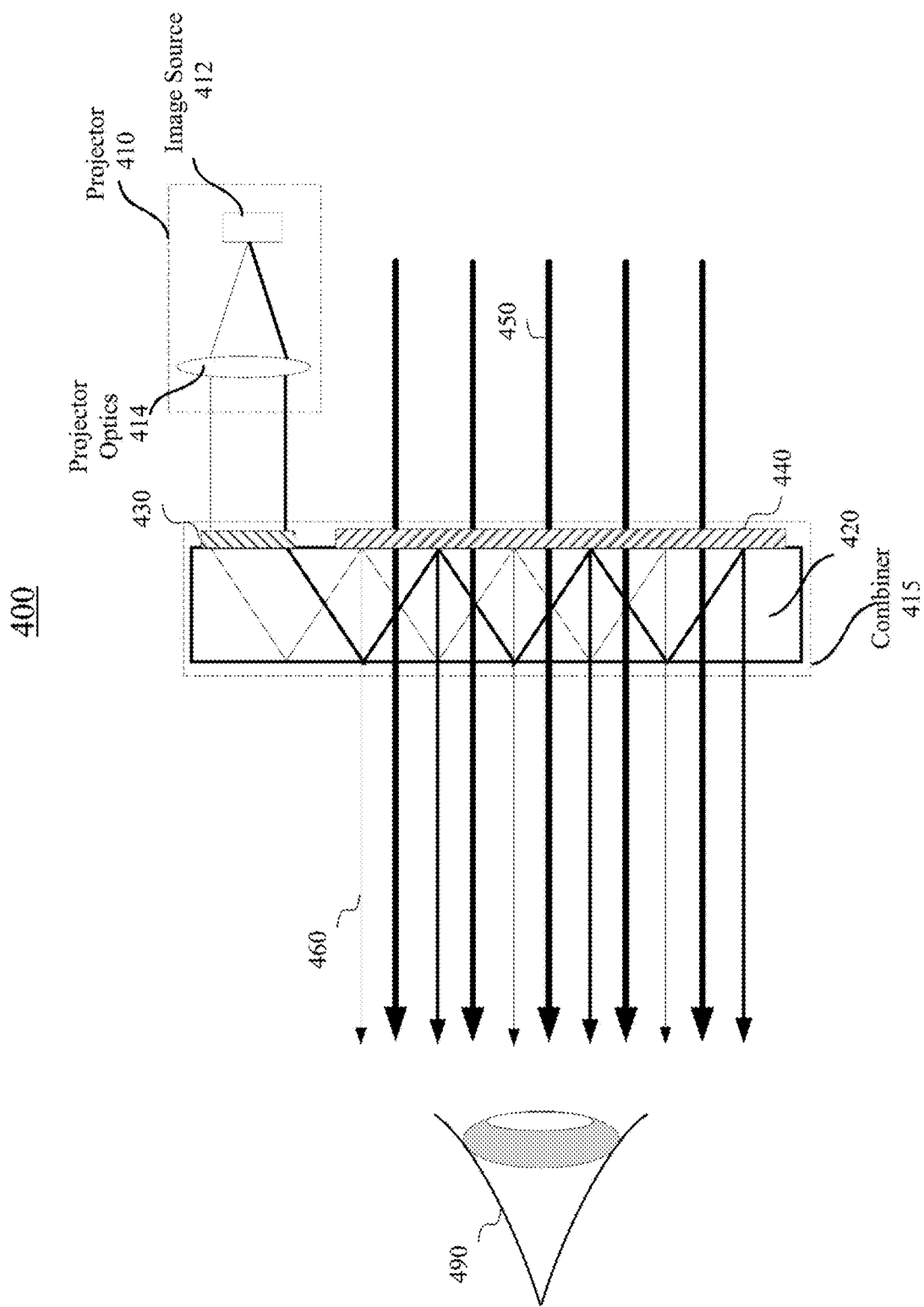
FIG. 4 illustrates an example optical see-through augmented reality system using a waveguide display according to certain embodiments.

FIG. 4 illustrates an example of an optical see-through augmented reality system 400 using a waveguide display according to certain embodiments. Augmented reality system 400 may include a projector 410 and a combiner 415. Projector 410 may include a light source or image source 412 and projector optics 414. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, and/or a light emitting diode. In some embodiments, image source 412 may include a plurality of light sources each emitting a monochromatic image light corresponding to a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Input coupler 430 may include a volume holographic grating, a diffractive optical element (DOE) (e.g., a surface-relief grating), or a refractive coupler (e.g., a wedge or a prism). Input coupler 430 may have a coupling efficiency of greater than 30%, 50%, 75%, 90%, or higher for visible light. As used herein, visible light may refer to light with a wavelength between about 380 nm to about 750 nm. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of substrate 420 may range from, for example, less than about 1 mm to about 10 mm or more. Substrate 420 may be transparent to visible light. A material may be "transparent" to a light beam if the light beam can pass through the material with a high transmission rate, such as larger than 50%, 40%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 420 may include or may be coupled to a plurality of output couplers 440 configured to extract at least a portion of the light guided by and propagating within substrate 420 from substrate 420, and direct extracted light 460 to an eye 490 of the user of augmented reality system 400. As input coupler 430, output couplers 440 may include grating couplers (e.g., volume holographic gratings or surface-relief gratings), other DOEs, prisms, etc. Output couplers 440 may have different coupling (e.g., diffraction) efficiencies at different locations. Substrate 420 may also allow light 450 from environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and virtual objects projected by projector 410.

FIG. 5 illustrates an example slanted grating 520 in an example waveguide display 500 according to certain embodiments. Waveguide display 500 may include slanted grating 520 on a waveguide 510, such as substrate 420. Slanted grating 520 may act as a grating coupler for coupling light into or out of waveguide 510. In some embodiments, slanted grating 520 may include a structure with a period p. For example, slanted grating 520 may include a plurality of ridges 522 and grooves 524 between ridges 522. Ridges 522 may be made of a material with a refractive index of $n_{g1}$, such as silicon containing materials (e.g., $SiO_2$, $Si_3N_4$, SiC, $SiO_xN_y$, or amorphous silicon), organic materials (e.g., polymers, spin on carbon (SOC) or amorphous carbon layer (ACL) or diamond like carbon (DLC)), inorganic metal oxide layers (e.g., $TiO_x$, $AlO_x$, $TaO_x$, $HfO_x$, etc.), or a combination thereof.

Each period of slanted grating 520 may include a ridge 522 and a groove 524, which may be an air gap or a region filled with a material with a refractive index $n_{g2}$. In some embodiments, the period p of the slanted grating may vary from one area to another on slanted grating 520, or may vary from one period to another (i.e., chirped) on slanted grating 520. The ratio between the width W of a ridge 522 and the grating period p may be referred to as the duty cycle. Slanted grating 520 may have a duty cycle ranging, for example, from about 10% to about 90% or greater. In some embodiments, the duty cycle may vary from period to period. In some embodiments, the depth d or height of ridges 522 may be greater than 50 nm, 100 nm, 200 nm, 300 nm, or higher.

Each ridge 522 may include a leading edge 530 with a slant angle α and a trailing edge 540 with a slant angle β. Slant angle α and slant angle β may be greater than 10°, 20°, 30°, 40°, 50°, 60°, 70°, or higher. In some embodiments, leading edge 530 and training edge 540 of each ridge 522 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle β may be less than 20%, 10%, 5%, 1%, or less.

In some implementations, grooves 524 between ridges 522 may be over-coated or filled with a material having a refractive index $n_{g2}$ higher or lower than the refractive index of the material of ridges 522. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill grooves 524. In some embodiments, a low refractive index material, such as silicon oxide, alumina, porous silica, or fluorinated low index monomer (or polymer), may be used to fill grooves 524. As a result, the difference between the refractive index of ridges 522 and the refractive index of grooves 524 may be greater than 0.1, 0.2, 0.3, 0.5, 1.0, or higher.

The slanted grating, such as slanted grating 520 shown in FIG. 5, may be fabricated using many different nanofabrication techniques. The nanofabrication techniques generally include a patterning process and a post-patterning (e.g., over-coating) process. The patterning process may be used to form slanted ridges of the slanted grating. There may be many different nanofabrication techniques for forming the slanted ridges. For example, in some implementations, the slanted grating may be fabricated using lithographic techniques including slanted etching. In some implementations, the slanted grating may be fabricated using nanoimprint lithography (NIL) molding techniques. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any pattering technique.

Techniques and processes for fabricating the slanted grating described below are for illustration purposes only and are not intended to be limiting. A person skilled in the art would understand that various modifications may be made to the techniques described below. For example, in some implementations, some operations described below may be omitted. In some implementations, additional operations may be performed to fabricate the slanted grating. Techniques disclosed herein may also be used to fabricate other slanted structures on various materials.

As described above, in some implementations, the slanted grating may be fabricated using NIL molding techniques. In NIL molding, a substrate may be coated with a NIL material layer. The NIL material may include an electromagnetic radiation sensitive material or, more specifically, a light-curable optical material. For example, the NIL material may include a light-sensitive base resin that includes a base polymer and a functional group for polymerization during photo-curing (e.g., UV-curing). The NIL material mixture may also include metal oxide nanoparticles (e.g., titanium oxide, zirconium oxide, etc.) for increasing the refractive index of the mixture. The mixture may also include some optional additives and solvent. In general, the base resin material, e.g., the base polymer and the functional group of the base resin material, the nanoparticle material, and/or the loading of the nanoparticles (i.e., weight percentage of the nanoparticles in the cured NIL material) can be selected to tune the refractive index of the moldable NIL material.

A NIL mold (e.g., a hard stamp, a soft stamp including a polymeric material, a hard-soft stamp, or any other working stamp) with a slanted structure may be pressed against the NIL material layer for molding a slanted surface-relief structure in the NIL material layer. A soft stamp (e.g., made of polymers) may offer more flexibility than a hard stamp during the molding and demolding processes. The NIL material layer may be cured subsequently using, for example, heat and/or ultraviolet (UV) light. The NIL mold may then be detached from the NIL material layer, and a slanted structure that is complementary to the slanted structure in the NIL mold may be formed in the NIL material layer.

In various embodiments, different generations of NIL stamps may be made and used as the working stamp to mold the slanted gratings. For example, in some embodiments, a master mold (which may be referred to as a generation 0 mold) may be fabricated (e.g., etched) in, for example, a semiconductor substrate, a quartz, or a metal plate. The master mold may be a hard stamp and may be used as the working stamp to mold the slanted grating directly, which may be referred to as hard stamp NIL or hard NIL. In such case, the slanted structure on the mold may be complimentary to the desired slanted structure of the slanted grating used as the grating coupler on a waveguide display.

In some embodiments, in order to protect the master NIL mold, the master NIL mold may be fabricated first, and a hybrid stamp (which may be referred to as generation 1 mold or stamp) may then be fabricated using the master NIL mold. The hybrid stamp may be used as the working stamp for nanoimprinting. The hybrid stamp may include a hard stamp, a soft stamp, or a hard-soft stamp. Nanoimprinting using a soft stamp may be referred to as soft stamp NIL or soft NIL. In some embodiments, the hybrid mold may include a plastic backplane with soft or hard patterned polymer (e.g., having a Young's modulus about 1 GPa). In some embodiments, the hybrid mold may include a glass backplane with soft or hard patterned polymer (e.g., having a Young's modulus about 1 GPa). In some embodiments, the hybrid mold may include a glass/plastic laminated backplane with soft or hard patterned polymer.

In some embodiments, a generation 2 hybrid mold may be made from the generation 1 mold, and may then be used as the working stamp for the nanoimprinting. In some embodiments, generation 3 hybrid molds, generation 4 hybrid molds, and the like, may be made and used as the working stamp. NIL molding may significantly reduce the cost of making the slanted surface-relief structures because the molding process may be much shorter than the etching process and no expensive reactive ion etching equipment may be needed.

Figure 6A:
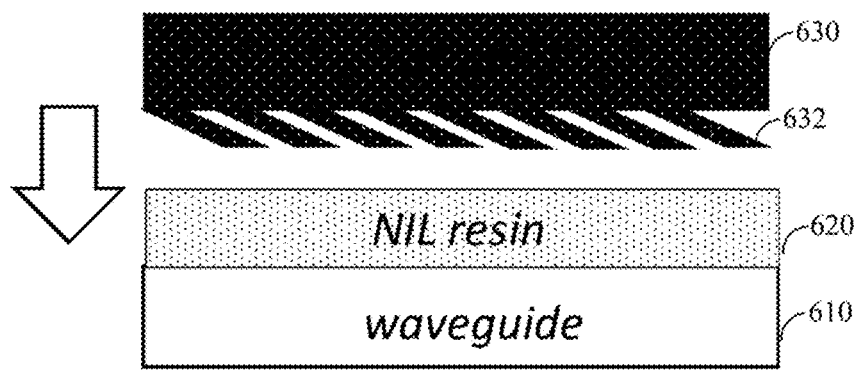
FIGS. 6A and 6B illustrate an example process for fabricating a slanted surface-relief grating by molding according to certain embodiments.
Figure 6B:
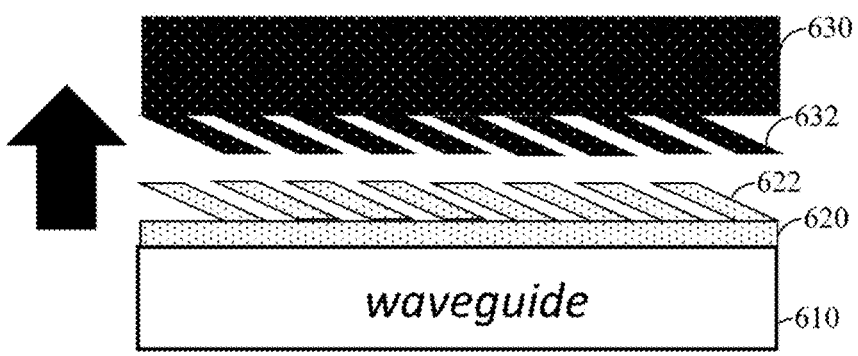

FIGS. 6A and 6B illustrate an example process for fabricating a slanted surface-relief grating by direct molding according to certain embodiments. In FIG. 6A, a waveguide 610 may be coated with a NIL material layer 620. NIL material layer 620 may be deposited on waveguide 610 by, for example, spin-coating, lamination, or ink injection. A NIL mold 630 with slanted ridges 632 may be pressed against NIL material layer 620 and waveguide 610 for molding a slanted grating in NIL material layer 620. NIL material layer 620 may be cured subsequently (e.g., cross-linked) using heat and/or ultraviolet (UV) light.

FIG. 6B shows the demolding process, during which NIL mold 630 is detached from NIL material layer 620 and waveguide 610. As shown in FIG. 6B, after NIL mold 630 is detached from NIL material layer 620 and waveguide 610, a slanted grating 622 that is complementary to slanted ridges 632 in NIL mold 630 may be formed in NIL material layer 620 on waveguide 610.

In some embodiments, a master NIL mold (e.g., a hard mold including a rigid material, such as Si, $SiO_2$, $Si_3N_4$, or a metal) may be fabricated first using, for example, slanted etching, micromachining, or 3-D printing. A soft stamp may be fabricated using the master NIL mold, and the soft stamp may then be used as the working stamp to fabricate the slanted grating. In such a process, the slanted grating structure in the master NIL mold may be similar to the slanted grating of the grating coupler for the waveguide display, and the slanted grating structure on the soft stamp may be complementary to the slanted grating structure in the master ML mold and the slanted grating of the grating coupler for the waveguide display. Compared with a hard stamp or hard mold, a soft stamp may offer more flexibility during the molding and demolding processes.

FIGS. 7A-7D illustrate an example process for fabricating a soft stamp used for making a slanted surface-relief grating according to certain embodiments. FIG. 7A shows a master mold 710 (e.g., a hard mold or hard stamp). Master mold 710 may include a rigid material, such as a semiconductor substrate (e.g., Si or GaAs), an oxide (e.g., $SiO_2$, $Si_3N_4$, $TiO_x$, $AlO_x$, $TaO_x$, or $HfO_x$), or a metal plate. Master mold 710 may be fabricated using, for example, a slanted etching process using reactive ion beams or chemically assisted reactive ion beams, a micromachining process, or a 3-D printing process. As shown in FIG. 7A, master mold 710 may include a slanted grating 720 that may in turn include a plurality of slanted ridges 722 with gaps 724 between slanted ridges 722.

FIG. 7B illustrates master mold 710 coated with a soft stamp material layer 730. Soft stamp material layer 730 may include, for example, a resin material or a curable polymer material. In some embodiments, soft stamp material layer 730 may include polydimethylsiloxane (PDMS) or another silicone elastomer or silicon-based organic polymer. In some embodiment, soft stamp material layer 730 may include ethylene tetrafluoroethylene (ETFE), perfluoropolyether (PFPE), or other fluorinated polymer materials. In some embodiments, soft stamp material layer 730 may be coated on master mold 710 by, for example, spin-coating or ink injection.

FIG. 7C illustrates a lamination process for laminating a soft stamp foil 740 onto soft stamp material layer 730. A roller 750 may be used to press soft stamp foil 740 against soft stamp material layer 730. The lamination process may also be a planarization process to make the thickness of soft stamp material layer 730 substantially uniform. After the lamination process, soft stamp foil 740 may be tightly or securely attached to soft stamp material layer 730.

FIG. 7D illustrates a delamination process, where a soft stamp including soft stamp foil 740 and attached soft stamp material layer 730 is detached from master mold 710. Soft stamp material layer 730 may include a slanted grating structure that is complementary to the slanted grating structure on master mold 710. Because the flexibility of soft stamp foil 740 and attached soft stamp material layer 730, the delamination process may be relatively easy compared with a demolding process using a hard stamp or mold. In some embodiments, a roller (e.g., roller 750) may be used in the delamination process to ensure a constant or controlled delamination speed. In some embodiments, roller 750 may not be used during the delamination. In some implementations, an anti-sticking layer may be formed on master mold 710 before soft stamp material layer 730 is coated on master mold 710. The anti-sticking layer may also facilitate the delamination process (e.g., between the slanted grating and the soft stamp 760). After the delamination of the soft stamp from master mold 710, the soft stamp may be used to mold the slanted grating on a waveguide of a waveguide display.

FIGS. 8A-8D illustrate an example process for fabricating a slanted surface-relief grating using a soft stamp according to certain embodiments. FIG. 8A shows a waveguide 810 coated with a NIL material layer 820. NIL material layer 820 may be deposited on waveguide 810 by, for example, spin-coating, lamination, or ink injection. A soft stamp 830 including slanted ridges 832 attached to a soft stamp foil 840 may be used for the imprint.

FIG. 8B shows the lamination of soft stamp 830 onto NIL material layer 820. Soft stamp 830 may be pressed against NIL material layer 820 and waveguide 810 using a roller 850, such that slanted ridges 832 may be pressed into NIL material layer 820. NIL material layer 820 may be cured subsequently. For example, NIL material layer 820 may be crosslinked using heat and/or ultraviolet (UV) light.

FIG. 8C shows the delamination of soft stamp 830 from NIL material layer 820. The delamination may be performed by lifting soft stamp foil 840 to detach slanted ridges 832 of soft stamp 830 from NIL material layer 820. NIL material layer 820 may now include a slanted grating 822, which may be used as the grating coupler or may be over-coated to form the grating coupler for the waveguide display. As described above, because of the flexibility of soft stamp 830, the delamination process may be relatively easy compared with a demolding process using a hard stamp or mold. In some embodiments, a roller (e.g., roller 850) may be used in the delamination process to ensure a constant or controlled delamination speed. In some embodiments, roller 850 may not be used during the delamination.

FIG. 8D shows an example imprinted slanted grating 822 formed on waveguide 810 using soft stamp 830. As described above, slanted grating 822 may include ridges and gaps between the ridges and thus may be over-coated with a material having a refractive index different from NIL material layer 820 to fill the gaps and form the grating coupler for the waveguide display.

In various embodiments, the period of the slanted grating may vary from one area to another on slanted grating 822, or may vary from one period to another (i.e., chirped) on slanted grating 822. Slanted grating 822 may have a duty cycle ranging, for example, from about 10% to about 90% or greater. In some embodiments, the duty cycle may vary from period to period. In some embodiments, the depth or height of the ridges of slanted grating 822 may be greater than 50 nm, 100 nm, 200 nm, 300 nm, or higher. The slant angles of the leading edges of the ridges of slanted grating 822 and the slant angles of the trailing edges of the ridges of slanted grating 822 may be greater than 10°, 20°, 30°, 40°, 50°, 60°, 70°, or higher. In some embodiments, the leading edge and training edge of each ridge of slanted grating 822 may be parallel to each other. In some embodiments, the difference between the slant angle of the leading edge of a ridge of slanted grating 822 and the slant angle of the trailing edge of the ridge of slanted grating 822 may be less than 20%, 10%, 5%, 1%, or less.

Figure 9:
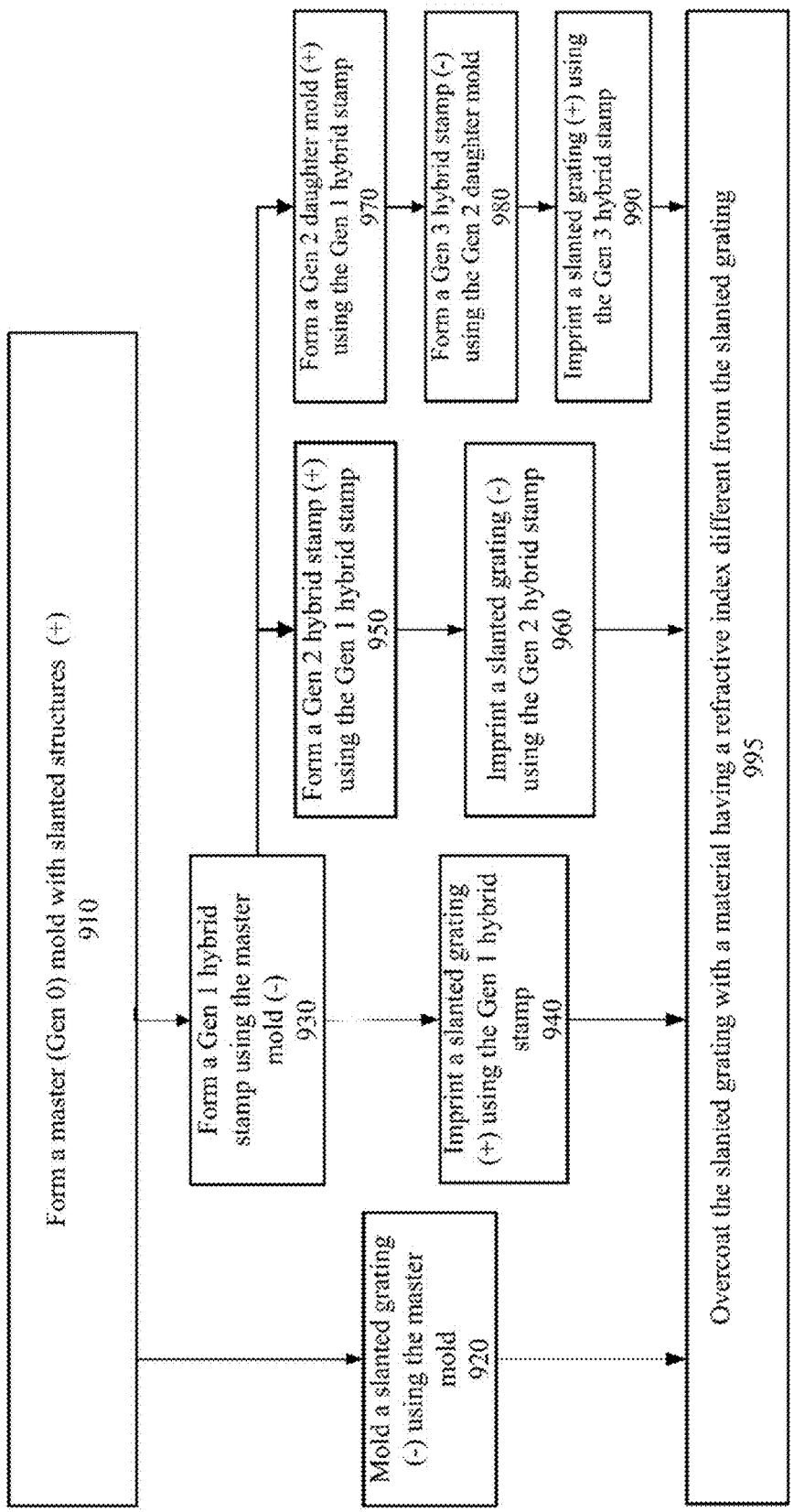
FIG. 9 is a simplified flow chart illustrating an example method of fabricating a slanted surface-relief grating using nanoimprint lithography according to certain embodiments.

FIG. 9 is a simplified flow chart 900 illustrating example methods of fabricating a slanted surface-relief grating using nanoimprint lithography according to certain embodiments. As described above, different generations of NIL stamps may be made and used as the working stamp to mold the slanted gratings. For example, in some embodiments, a master mold (i.e., generation 0 mold, which may be a hard mold) may be used as the working stamp to mold the slanted grating directly. In some embodiments, a hybrid stamp (e.g., a generation 1 hybrid mold or stamp) may be fabricated using the master mold and may be used as the working stamp for nanoimprinting. In some embodiments, a generation 2 hybrid mold (or stamp) may be made from the generation 1 mold, and may be used as the working stamp for the nanoimprinting. In some embodiments, a generation 3 mold, a generation 4 mold, and so on, may be made and used as the working stamp.

At block 910, a master mold with a slanted structure may be fabricated using, for example, a slanted etching process that uses reactive ion beams or chemically-assisted reactive ion beams, a micromachining process, or a 3-D printing process. The master mold may be referred to as the generation 0 (or Gen 0) mold. The master mold may include quartz, fused silica, silicon, other metal-oxides, or plastic compounds. The slanted structure of the master mold may be referred to as having a positive (+) tone. The master mold may be used as a working stamp for molding the slanted grating directly (i.e., hard NIL) at block 920. As described above, when the master mold is used as the working stamp, the slanted structure of the master mold may be complementary to the desired slanted grating. Alternatively, the master mold may be used to make a hybrid stamp as the working stamp for molding the slanted grating. The slanted structure of the hybrid stamp may be similar to the desired slanted grating or may be complementary to the desired slanted grating, depending on the generation of the hybrid stamp.

At block 920, a slanted grating may be molded in, for example, a moldable layer, such as a NIL material layer, using the master mold as described above with respect to, for example, FIGS. 6A and 6B. The moldable layer may be coated on a waveguide substrate. The master mold may be pressed against the moldable layer. The moldable layer may then be cured to fix the structure formed within the moldable layer by the master mold. The master mold may be detached from the moldable layer to form a slanted grating within the moldable layer. The slanted grating within the moldable layer may have a negative (−) tone compared with the slanted structure of the master mold.

Alternatively, at block 930, a hybrid stamp (e.g., a hard stamp, a soft stamp, or a hard-soft stamp) with a slanted structure may be fabricated using the master mold as described above with respect to, for example, FIGS. 7A-7D or the process described with respect to, for example, FIGS. 8A-8D. For example, the process of fabricating the hybrid stamp may include coating the master mold with a soft stamp material, such as a resin material described above. A soft stamp foil may then be laminated on the soft stamp material, for example, using a roller. The soft stamp foil and the attached soft stamp material may be securely attached to each other and may be detached from the master mold to form the soft stamp. The hybrid stamp fabricated at block 930 may be referred to as a generation 1 (or Gen 1) stamp. The slanted grating within the Gen 1 stamp may have a negative (−) tone compared with the slanted structure of the master mold.

At block 940, a slanted surface-relief grating may be imprinted using the Gen 1 stamp as described above with respect to, for example, FIGS. 8A-8D. For example, a waveguide substrate may be coated with a NIL material layer. The Gen 1 stamp may be laminated on the NIL material layer using, for example, a roller. After the NIL material layer is cured, the Gen 1 stamp may be delaminated from the NIL material layer to form a slanted grating within the NIL material layer. The slanted grating within the NIL material layer may have a positive tone.

Alternatively, in some embodiments, at block 950, a second generation hybrid stamp (Gen 2 stamp) may be fabricated using the Gen 1 stamp using a process similar to the process for fabricating the Gen 1 stamp as described above with respect to, for example, FIGS. 7A-8D. The slanted structure within the Gen 2 stamp may have a positive tone.

At block 960, a slanted surface-relief grating may be imprinted using the Gen 2 stamp as described above with respect to, for example, FIGS. 8A-8D. For example, a waveguide substrate may be coated with a NIL material layer. The Gen 2 stamp may be laminated on the NIL material layer using, for example, a roller. After the NIL material layer is cured, the Gen 2 stamp may be delaminated from the NIL material layer to form a slanted grating within the NIL material layer. The slanted grating within the NIL material layer may have a negative tone.

Alternatively, in some embodiments, at block 970, a second generation (Gen 2) daughter mold may be fabricated using the Gen 1 stamp using a process similar to the process for fabricating the Gen 1 stamp as described above with respect to, for example, FIGS. 7A-8D. The slanted structure within the Gen 2 daughter mold may have a positive tone.

At block 980, a third generation hybrid stamp (Gen 3 stamp) may be fabricated using the Gen 2 daughter mold using a process similar to the process for fabricating the Gen 1 stamp or the Gen 2 daughter mold as described above with respect to, for example, FIGS. 7A-8D. The slanted structure within the Gen 3 stamp may have a negative tone.

At block 990, a slanted surface-relief grating may be imprinted using the Gen 3 stamp as described above with respect to, for example, FIGS. 8A-8D. For example, a waveguide substrate may be coated with a NIL material layer. The Gen 3 stamp may be laminated on the NIL material layer using, for example, a roller. After the NIL material layer is cured, the Gen 3 stamp may be delaminated from the NIL material layer to form a slanted grating within the NIL material layer. The slanted grating within the NIL material layer may have a positive tone.

Even though not shown in FIG. 9, in some embodiments, a fourth generation hybrid stamp, a fifth generation hybrid stamp, and so on, may be fabricated using a similar process, and may be used as the working stamp for imprinting the slanted grating.

Optionally, at block 995, the slanted grating may be over-coated with a material having a refractive index different from the slanted grating (e.g., the NIL material layer). For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to over-coat the slanted grating and fill the gaps between the slanted grating ridges. In some embodiments, a low refractive index material, such as silicon oxide, magnesium fluoride, porous silica, or fluorinated low index monomer (or polymer), and the like, may be used to over-coat the slanted grating and fill the gaps between the slanted grating ridges.

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 14 is a simplified block diagram of an example electronic system 1400 of an example near-eye display (e.g., HMD device) for implementing some of the examples disclosed herein. Electronic system 1400 may be used as the electronic system of an HMD device or other near-eye displays described above. In this example, electronic system 1400 may include one or more processor(s) 1410 and a memory 1420. Processor(s) 1410 may be configured to execute instructions for performing operations at a number of components, and can be, for example, a general-purpose processor or microprocessor suitable for implementation within a portable electronic device. Processor(s) 1410 may be communicatively coupled with a plurality of components within electronic system 1400. To realize this communicative coupling, processor(s) 1410 may communicate with the other illustrated components across a bus 1440. Bus 1440 may be any subsystem adapted to transfer data within electronic system 1400. Bus 1440 may include a plurality of computer buses and additional circuitry to transfer data.

Memory 1420 may be coupled to processor(s) 1410. In some embodiments, memory 1420 may offer both short-term and long-term storage and may be divided into several units. Memory 1420 may be volatile, such as static random access memory (SRAM) and/or dynamic random access memory (DRAM) and/or non-volatile, such as read-only memory (ROM), flash memory, and the like. Furthermore, memory 1420 may include removable storage devices, such as secure digital (SD) cards. Memory 1420 may provide storage of computer-readable instructions, data structures, program modules, and other data for electronic system 1400. In some embodiments, memory 1420 may be distributed into different hardware modules. A set of instructions and/or code might be stored on memory 1420. The instructions might take the form of executable code that may be executable by electronic system 1400, and/or might take the form of source and/or installable code, which, upon compilation and/or installation on electronic system 1400 (e.g., using any of a variety of generally available compilers, installation programs, compression/decompression utilities, etc.), may take the form of executable code.

In some embodiments, memory 1420 may store a plurality of application modules 1422 through 1424, which may include any number of applications. Examples of applications may include gaming applications, conferencing applications, video playback applications, or other suitable applications. The applications may include a depth sensing function or eye tracking function. Application modules 1422-1424 may include particular instructions to be executed by processor(s) 1410. In some embodiments, certain applications or parts of application modules 1422-1424 may be executable by other hardware modules 1480. In certain embodiments, memory 1420 may additionally include secure memory, which may include additional security controls to prevent copying or other unauthorized access to secure information.

In some embodiments, memory 1420 may include an operating system 1425 loaded therein. Operating system 1425 may be operable to initiate the execution of the instructions provided by application modules 1422-1424 and/or manage other hardware modules 1480 as well as interfaces with a wireless communication subsystem 1430 which may include one or more wireless transceivers. Operating system 1425 may be adapted to perform other operations across the components of electronic system 1400 including threading, resource management, data storage control and other similar functionality.

Wireless communication subsystem 1430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1400 may include one or more antennas 1434 for wireless communication as part of wireless communication subsystem 1430 or as a separate component coupled to any portion of the system. Depending on desired functionality, wireless communication subsystem 1430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1430 may permit data to be exchanged with a network, other computer systems, and/or any other devices described herein. Wireless communication subsystem 1430 may include a means for transmitting or receiving data, such as identifiers of HMD devices, position data, a geographic map, a heat map, photos, or videos, using antenna(s) 1434 and wireless link(s) 1432. Wireless communication subsystem 1430, processor(s) 1410, and memory 1420 may together comprise at least a part of one or more of a means for performing some functions disclosed herein.

Embodiments of electronic system 1400 may also include one or more sensors 1490. Sensor(s) 1490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1490 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1400 may include a display module 1460. Display module 1460 may be a near-eye display, and may graphically present information, such as images, videos, and various instructions, from electronic system 1400 to a user. Such information may be derived from one or more application modules 1422-1424, virtual reality engine 1426, one or more other hardware modules 1480, a combination thereof, or any other suitable means for resolving graphical content for the user (e.g., by operating system 1425). Display module 1460 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1400 may include a user input/output module 1470. User input/output module 1470 may allow a user to send action requests to electronic system 1400. An action request may be a request to perform a particular action. For example, an action request may be to start or end an application or to perform a particular action within the application. User input/output module 1470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1400. In some embodiments, user input/output module 1470 may provide haptic feedback to the user in accordance with instructions received from electronic system 1400. For example, the haptic feedback may be provided when an action request is received or has been performed.

Electronic system 1400 may include a camera 1450 that may be used to take photos or videos of a user, for example, for tracking the user's eye position. Camera 1450 may also be used to take photos or videos of the environment, for example, for VR, AR, or MR applications. Camera 1450 may include, for example, a complementary metal-oxide-semiconductor (CMOS) image sensor with a few millions or tens of millions of pixels. In some implementations, camera 1450 may include two or more cameras that may be used to capture 3-D images.

In some embodiments, electronic system 1400 may include a plurality of other hardware modules 1480. Each of other hardware modules 1480 may be a physical module within electronic system 1400. While each of other hardware modules 1480 may be permanently configured as a structure, some of other hardware modules 1480 may be temporarily configured to perform specific functions or temporarily activated. Examples of other hardware modules 1480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1480 may be implemented in software.

In some embodiments, memory 1420 of electronic system 1400 may also store a virtual reality engine 1426. Virtual reality engine 1426 may execute applications within electronic system 1400 and receive position information, acceleration information, velocity information, predicted future positions, or some combination thereof of the HMD device from the various sensors. In some embodiments, the information received by virtual reality engine 1426 may be used for producing a signal (e.g., display instructions) to display module 1460. For example, if the received information indicates that the user has looked to the left, virtual reality engine 1426 may generate content for the HMD device that mirrors the user's movement in a virtual environment. Additionally, virtual reality engine 1426 may perform an action within an application in response to an action request received from user input/output module 1470 and provide feedback to the user. The provided feedback may be visual, audible, or haptic feedback. In some implementations, processor(s) 1410 may include one or more GPUs that may execute virtual reality engine 1426.

In various implementations, the above-described hardware and modules may be implemented on a single device or on multiple devices that can communicate with one another using wired or wireless connections. For example, in some implementations, some components or modules, such as GPUs, virtual reality engine 1426, and applications (e.g., tracking application), may be implemented on a console separate from the head-mounted display device. In some implementations, one console may be connected to or support more than one HMD.

In alternative configurations, different and/or additional components may be included in electronic system 1400. Similarly, functionality of one or more of the components can be distributed among the components in a manner different from the manner described above. For example, in some embodiments, electronic system 1400 may be modified to include other system environments, such as an AR system environment and/or an MR environment.

The following clauses describe certain embodiments.

Clause 1: a nanoimprint lithography (NIL) grating comprising a ceramic material having a relative amount of carbon of about 10% or less.

Clause 2a: the NIL grating of clause 1, wherein the relative amount of carbon in the ceramic material is about 9% or less, about 8% or less, about 7% or less, about 6% or less, about 5% or less, about 4% or less, about 3% or less, about 2% or less, or about 1% or less. Clause 2b: the NIL grating of clause 1, wherein the relative amount of carbon in the ceramic material is about 20% or less, about 19% or less, about 18% or less, about 17% or less, about 16% or less, about 15% or less, about 14% or less, about 13% or less, about 12% or less, about 11% or less, or about 10% or less.

Clause 3: the NIL grating of clause 1 or clause 2, wherein the ceramic material is substantially free of organic material.

Clause 4: the NIL grating of any one of clauses 1 to 3, wherein ceramic material comprises one or more of titanium oxide, zirconium oxide, hafnium oxide, tungsten oxide, zinc tellurium, gallium phosphide, or any combination or derivative thereof.

Clause 5a: the NIL grating of any one of clauses 1 to 4, wherein the grating has a duty cycle ranging from 10% to 90%. Clause 5b: the NIL grating of any one of clauses 1 to 4, wherein the grating has a duty cycle ranging from 15% to 90%. Clause 5c: the NIL grating of any one of clauses 1 to 4, wherein the grating has a duty cycle ranging from 20% to 90%. Clause 5d: the NIL grating of any one of clauses 1 to 4, wherein the grating has a duty cycle ranging from 25% to 90%.

Clause 6: the NIL grating of any one of clauses 1 to 4, wherein the grating has a duty cycle ranging from 30% to 90%.

Clause 7: the NIL grating of any one of clauses 1 to 4, wherein the grating has a duty cycle ranging from 35% to 90%.

Clause 8: the NIL grating of any one of clauses 1 to 7, wherein the grating is a non-slanted grating.

Clause 9: the NIL grating of any one of clauses 1 to 7, wherein the grating is a slanted grating.

Clause 10: the NIL grating of clause 9, wherein a slant angle ranges from more than 0° to about 70°.

Clause 11: the NIL grating of clause 9 or clause 10, wherein a slant angle is greater than 30°.

Clause 12a: the NIL grating of clause 9 or clause 10, wherein a slant angle is greater than 35°. Clause 12b: the NIL grating of clause 9 or clause 10, wherein a slant angle is greater than 40°. Clause 12c: the NIL grating of clause 9 or clause 10, wherein a slant angle is greater than 45°. Clause 12d: the NIL grating of clause 9 or clause 10, wherein a slant angle is greater than 50°. Clause 12e: the NIL grating of clause 9 or clause 10, wherein a slant angle is greater than 55°.

Clause 13: the NIL grating of any one of clauses 1 to 12, wherein the grating has a depth from 30 nm to 450 nm.

Clause 14. The NIL grating of any one of clauses 1 to 12, wherein the grating has a depth from 50 nm to 350 nm.

Clause 15. The NIL grating of any one of clauses 1 to 12, wherein the grating has a depth from 75 nm to 250 nm.

Clause 16. The NIL grating of any one of clauses 1 to 12, wherein the grating has a depth greater than 100 nm and lower than 500 nm.

Clause 17. The NIL grating of any one of clauses 1 to 16, wherein the grating has an aspect ratio from 0.5:1 to 6:1.

Clause 18. The NIL grating of any one of clauses 1 to 16, wherein the grating has an aspect ratio from 1:1 to 5:1.

Clause 19. The NIL grating of any one of clauses 1 to 16, wherein the grating has an aspect ratio greater than 3:1 and lower than 8:1.

Clause 20. The NIL grating of any one of clauses 1 to 19, wherein the ceramic material has a refractive index ranging from 1.90 to 2.25.

Clause 21. The NIL grating of any one of clauses 1 to 20, wherein the refractive index is measured at 460 nm.

Clause 22. A process for making the NIL grating of any one of clauses 1 to 21, comprising: providing a precursor material comprising a base resin component and a plurality of nanoparticles; imprinting the precursor material into a first precursor NIL grating; optionally subjecting the first precursor NIL grating to additional processing steps to generate one or more subsequent precursor NIL gratings; and subjecting the first precursor NIL grating or the one or more subsequent precursor NIL gratings to at least an increased temperature.

Clause 23. The process of clause 22, wherein the base resin component is UV curable.

Clause 24. The process of clause 22 or clause 23, wherein the base resin component is light-sensitive.

Clause 25. The process of any one of clauses 22 to 24, wherein the base resin component comprises an organic material.

Clause 26. The process of any one of clauses 22 to 25, wherein the base resin component comprises one or more crosslinkable monomers, one or more polymerizable monomers, or both.

Clause 27. The process of clause 26, wherein the crosslinkable monomers or the polymerizable monomers comprise one or more crosslinkable or polymerizable moieties.

Clause 28. The process of clause 27, wherein the crosslinkable or polymerizable moieties are selected from an ethylenically unsaturated group, an oxirane ring, and a heterocyclic group.

Clause 29. The process of clause 27, wherein the crosslinkable or polymerizable moieties are selected from vinyl, allyl, epoxide, acrylate, and methacrylate.

Clause 30. The process of clause 27, wherein the crosslinkable or polymerizable moieties are selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

Clause 31. The process of any one of clauses 26 to 30, wherein the crosslinkable monomers or the polymerizable monomers comprise one or more linking groups selected from —$C_{1-10}$ alkyl-, —O—$C_{1-10}$ alkyl-, —$C_{1-10}$ alkenyl-, —O—$C_{1-10}$ alkenyl-, —$C_{1-10}$ cycloalkenyl-, —O—$C_{1-10}$ cycloalkenyl-, —$C_{1-10}$ alkynyl-, —O—$C_{1-10}$ alkynyl-, —$C_{1-10}$ aryl-, —O—$C_{1-10}$—, -aryl-, —O—, —S—, —C(O)—, —C(O)O—, —OC(O)—, —OC(O)O—, —N($R^b$)—, —C(O)N($R^b$)—, —N($R^b$)C(O)—, —OC(O)N($R^b$)—, —N($R^b$)C(O)O—, —SC(O)N($R^b$)—, —N($R^b$)C(O)S—, —N($R^b$)C(O)N($R^b$)—, —(N$R^b$)C(N$R^b$)N($R^b$)—, —N($R^b$)S(O)$_w$—, —S(O)$_w$N($R^b$)—, —S(O)$_w$O—, —OS(O)$_w$—, —OS(O)$_w$O—, —O(O)P(O$R^b$)O—, (O)P(O—)$_3$, —O(S)P(O$R^b$)O—, and (S)P(O—)$_3$, wherein w is 1 or 2, and $R^b$ is independently hydrogen, optionally substituted alkyl, or optionally substituted aryl.

Clause 32. The process of any one of clauses 22 to 31, wherein the base resin component comprises one or more fluorinated compounds.

Clause 33. The process of any one of clauses 22 to 32, wherein the base resin component further comprises one or more solvents.

Clause 34. The process of clause 33, wherein the one or more solvents are selected from 2-(1-methoxy)propyl acetate, propylene glycol monomethyl ether acetate, propylene glycol methyl ether, ethyl acetate, xylene, and toluene.

Clause 35. The process of clause 33, wherein the one or more solvents is ethyl lactate.

Clause 36. The process of any one of clauses 22 to 35, wherein the base resin component further comprises one or more of a photo radical generator, a photo acid generator, or both.

Clause 37. The process of any one of clauses 22 to 36, wherein the base resin component further comprises one or more inhibitors.

Clause 38. The process of any one of clauses 22 to 37, wherein the base resin component includes silicon.

Clause 39. The process of any one of clauses 22 to 38, wherein the plurality of nanoparticles comprises one or more of titanium oxide, zirconium oxide, hafnium oxide, tungsten oxide, zinc tellurium, gallium phosphide, or any combination or derivative thereof.

Clause 40. The process of any one of clauses 22 to 38, wherein the plurality of nanoparticles comprises titanium oxide nanoparticles.

Clause 41. The process of any one of clauses 22 to 38, wherein the plurality of nanoparticles comprises zirconium oxide nanoparticles.

Clause 42. The process of any one of clauses 22 to 38, wherein the plurality of nanoparticles comprises a mixture of titanium oxide nanoparticles and zirconium oxide nanoparticles.

Clause 43. The process of any one of clauses 22 to 42, wherein the plurality of nanoparticles comprises a plurality of surface-modified nanoparticles, a plurality of capped nanoparticles, or both.

Clause 44. The process of clause 43, wherein the surface-modified nanoparticles, the capped nanoparticles, or both, comprise a substantially inorganic core, and a substantially organic shell.

Clause 45. The process of clause 44, wherein the substantially organic shell comprises one or more crosslinkable or polymerizable moieties.

Clause 46. The process of clause 45, wherein the one or more crosslinkable or polymerizable moieties are linked to the substantially inorganic core.

Clause 47. The process of clause 45 or clause 46, wherein the crosslinkable or polymerizable moieties comprise one or more of an ethylenically unsaturated group, an oxirane ring, or a heterocyclic group.

Clause 48. The process of clause 45 or clause 46, wherein the crosslinkable or polymerizable moieties comprise one or more of vinyl, allyl, epoxide, acrylate, and methacrylate.

Clause 49. The process of clause 45 or clause 46, wherein the crosslinkable or polymerizable moieties comprise one or more of optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

Clause 50. The process of clause 45 or clause 46, wherein the crosslinkable or polymerizable moieties comprise one or more linking groups selected from —Si(—O—)$_3$, —C$_{1-10}$ alkyl-, —O—C$_{1-10}$ alkyl-, —C$_{1-10}$ alkenyl-, —O—C$_{1-10}$ alkenyl-, —C$_{1-10}$ cycloalkenyl-, —O—C$_{1-10}$ cycloalkenyl-, —C$_{1-10}$ alkynyl-, —O—C$_{1-10}$ alkynyl-, —C$_{1-10}$ aryl-, —O—C$_{1-10}$—, -aryl-, —O—, —S—, —C(O)—, —C(O)O—, —OC(O)—, —OC(O)O—, —N(R$^b$)—, —C(O)N(R$^b$)—, —N(R$^b$)C(O)—, —OC(O)N(R$^b$)—, —N(R$^b$)C(O)O—, —SC(O)N(R$^b$)—, —N(R$^b$)C(O)S—, —N(R$^b$)C(O)N(R$^b$)—, —N(R$^b$)C(NR$^b$)N(R$^b$)—, —N(R$^b$)S(O)$_w$—, —S(O)$_w$N(R$^b$)—, —S(O)$_w$O—, —OS(O)$_w$—, —OS(O)$_w$O—, —O(O)P(OR$^b$)O—, (O)P(O—)$_3$, —O(S)P(OR$^b$)O—, and (S)P(O—)$_3$, wherein w is 1 or 2, and R$^b$ is independently hydrogen, optionally substituted alkyl, or optionally substituted aryl.

Clause 51. The process of any one of clauses 44 to 50, wherein the substantially organic shell comprises one or more of an organosilane or a corresponding organosilanyl substituent, an organoalcohol or a corresponding organoalkoxy substituent, or an organocarboxylic acid or a corresponding organocarboxylate substituent.

Clause 52. The process of clause 51, wherein the organosilane is selected from n-propyltrimethoxysilane, n-propyltriethoxysilane, n-octyltrimethoxysilane, n-octyltriethoxysilane, phenylrimethoxysilane, 2-methoxy(polyethyleneoxy)propyltrimethoxysilane, methoxy(triethyleneoxy)propyltrimethoxysilane, 3-aminopropyltrimethoxysilane, 3-mercaptopropyltrimethoxysilane, 3-(methacryloyloxy)propyl trimethoxysilane, 3-isocyanatopropyltriethoxysilane, 3-isocyanatopropyltrimethoxysilane, and glycidoxypropyltrimethoxysilane.

Clause 53. The process of clause 51, wherein the organoalcohol is selected from heptanol, hexanol, octanol, benzyl alcohol, phenol, ethanol, propanol, butanol, oleylalcohol, dodecylalcohol, octadecanol and triethylene glycol monomethyl ether.

Clause 54. The process of clause 51, wherein the organocarboxylic acid is selected from octanoic acid, acetic acid, propionic acid, 2-2-(2-methoxyethoxy)ethoxyacetic acid, oleic acid, and benzoic acid.

Clause 55. The process of any one of clauses 44 to 50, wherein the substantially organic shell comprises one or more of 3-(methacryloyloxy)propyl trimethoxysilane, 3-(methacryloyloxy)propyl dimethoxysilyl, or 3-(methacryloyloxy)propyl methoxysiloxyl.

Clause 56. The process of any one of clauses 44 to 55, wherein the diameter of a substantially inorganic core ranges from about 1 nm to about 25 nm.

Clause 57. The process of any one of clauses 44 to 55, wherein the diameter of a substantially inorganic core is selected from about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm.

Clause 58. The process of clause 56 or clause 57, wherein the diameter of a substantially inorganic core is measured by transmission electron microscopy (TEM).

Clause 59. The process of any one of clauses 44 to 58, wherein the diameter of a surface-modified nanoparticle, a capped nanoparticle, or both, including a substantially organic shell, ranges from about 5 nm to about 100 nm.

Clause 60. The process of any one of clauses 44 to 58, wherein the diameter of a surface-modified nanoparticle, a capped nanoparticle, or both, including a substantially organic shell, ranges from about 10 nm to about 50 nm.

Clause 61. The process of any one of clauses 44 to 58, wherein the diameter of a surface-modified nanoparticle, a capped nanoparticle, or both, including a substantially organic shell, is selected from about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, and about 25 nm, about 26 nm, about 27 nm, about 28 nm, about 29 nm, about 30 nm, about 31 nm, about 32 nm, about 33 nm, about 34 nm, about 35 nm, about 36 nm, about 37 nm, about 38 nm, about 39 nm, about 40 nm, about 41 nm, about 42 nm, about 43 nm, about 44 nm, about 45 nm, about 46 nm, about 47 nm, about 48 nm, about 49 nm, about 50 nm, about 51 nm, about 52 nm, about 53 nm, about 54 nm, about 55 nm, about 56 nm, about 57 nm, about 58 nm, about 59 nm, about 60 nm, about 61 nm, about 62 nm, about 63 nm, about 64 nm, about 65 nm, about 66 nm, about 67 nm, about 68 nm, about 69 nm, about 70 nm, about 71 nm, about 72 nm, about 73 nm, about 74 nm, about 75 nm, about 76 nm, about 77 nm, about 78 nm, about 79 nm, about 80 nm, about 81 nm, about 82 nm, about 83 nm, about 84 nm, about 85 nm, about 86 nm, about 87 nm, about 88 nm, about 89 nm, about 90 nm, about 91 nm, about 92 nm, about 93 nm, about 94 nm, about 95 nm, about 96 nm, about 97 nm, about 98 nm, about 99 nm, and about 100 nm.

Clause 62. The process of any one of clauses 59 to 61, wherein the diameter of a surface-modified nanoparticle, a capped nanoparticle, or both, including a substantially organic shell, is measured by dynamic light scattering (DLS).

Clause 63. The process of any one of clauses 44 to 62, wherein the volume fraction of the substantially inorganic core in the surface-modified nanoparticles, the capped nanoparticles, or both, ranges from about 60% to about 90%.

Clause 64. The process of any one of clauses 44 to 62, wherein the volume fraction of the substantially inorganic core in the surface-modified nanoparticles, the capped nanoparticles, or both, is selected from about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, and about 90%.

Clause 65. The process of any one of clauses 44 to 62, wherein the volume fraction of the substantially organic shell in the surface-modified nanoparticles, the capped nanoparticles, or both, ranges from about 10% to about 40%.

Clause 66. The process of any one of clauses 44 to 62, wherein the volume fraction of the substantially organic shell in the surface-modified nanoparticles, the capped nanoparticles, or both, is selected from about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, and about 40%.

Clause 67. The process of any one of clauses 22 to 66, wherein the refractive index of the plurality of nanoparticles ranges from 2.00 to 2.61.

Clause 68. The process of any one of clauses 22 to 66, wherein the refractive index of the plurality of nanoparticles is selected from about 2.00, about 2.01, about 2.02, about 2.03, about 2.04, about 2.05, about 2.06, about 2.07, about 2.08, about 2.09, about 2.10, about 2.11, about 2.12, about 2.13, about 2.14, about 2.15, about 2.16, about 2.17, about 2.18, 2.19, about 2.20, about 2.21, about 2.22, about 2.23, about 2.24, about 2.25, about 2.26, about 2.27, about 2.28, about 2.29, about 2.30, about 2.31, about 2.32, about 2.33, about 2.34, about 2.35, about 2.36, about 2.37, about 2.38, about 2.39, about 2.40, about 2.41, about 2.42, about 2.43, about 2.44, about 2.45, about 2.46, about 2.47, about 2.48, about 2.49, about 2.50, about 2.51, about 2.52, about 2.53, about 2.54, about 2.55, about 2.56, about 2.57, about 2.58, about 2.59, about 2.60, and about 2.61.

Clause 69. The process of any one of clauses 22 to 68, wherein the volume fraction of the plurality of nanoparticles in the precursor material ranges from about 50% to about 90%.

Clause 70. The process of any one of clauses 22 to 68, wherein the volume fraction of the plurality of nanoparticles in the precursor material ranges from about 60% to about 80%.

Clause 71. The process of any one of clauses 22 to 70, further comprising a precursor material curing step after the imprinting step, wherein the curing step comprises subjecting the first precursor NIL grating to a light source to generate a second precursor NIL grating.

Clause 72. The process of clause 71, further comprising subjecting the first precursor NIL grating or the second precursor NIL grating to oxidative conditions.

Clause 73. The process of clause 71, further comprising subjecting the first precursor NIL grating or the second precursor NIL grating to a plasma source.

Clause 74. The process of clause 71, further comprising subjecting the first precursor NIL grating or the second precursor NIL grating to oxygen plasma.

Clause 75. The process of any one of clauses 72 to 74, wherein the subjecting the first precursor NIL grating or the second precursor NIL grating to oxidative conditions, a plasma source, or oxygen plasma, removes all or a portion of an organic material from the precursor NIL grating.

Clause 76. The process of clause 75, wherein substantially all of the organic material is removed from the precursor NIL grating.

Clause 77. The process of any one of clauses 72 to 76, wherein the subjecting the first precursor NIL grating or the second precursor NIL grating to oxidative conditions, a plasma source, or oxygen plasma, is performed for between about 1 and about 10 minutes.

Clause 78. The process of any one of clauses 72 to 76, wherein the subjecting the first precursor NIL grating or the second precursor NIL grating to oxidative conditions, a plasma source, or oxygen plasma, is performed for between about 2 and about 5 minutes.

Clause 79. The process of any one of clauses 72 to 78, wherein the subjecting the first precursor NIL grating or the second precursor NIL grating to oxidative conditions, a plasma source, or oxygen plasma, generates a third precursor NIL grating comprising a plurality of micro- or nanovoids.

Clause 80. The process of any one of clauses 22 to 79, further comprising a metal oxide infiltration step.

Clause 81. The process of any one of clauses 22 to 79, further comprising an atomic layer deposition (ALD) step.

Clause 82. The process of clause 81, wherein the ALD step is a thermal reaction.

Clause 83. The process of clause 81 or clause 82, wherein the ALD step deposits a layer ranging from about 1 Å to about 5 nm.

Clause 84. The process of clause 81 or clause 82, wherein the ALD step deposits a layer ranging from about 0.5 nm to about 1.5 nm.

Clause 85. The process of any one of clauses 22 to 79, further comprising a plasma reaction process step.

Clause 86. The process of any one of clauses 79 to 85, wherein a portion of the plurality of micro- or nanovoids is infiltrated with titanium oxide, zirconium oxide, hafnium oxide, tungsten oxide, zinc tellurium, gallium phosphide, or any combination or derivative thereof.

Clause 87. The process of clause 86, wherein the infiltration is performed at a temperature ranging from about 30° C. to about 500° C.

Clause 88. The process of clause 86, wherein the infiltration is performed at a temperature ranging from about 40° C. to about 70° C.

Clause 89. The process of any one of clauses 80 to 88, wherein the metal oxide infiltration step, the atomic layer deposition step, and/or the plasma reaction process step, are each independently performed for a number of cycles ranging between 1 and about 20.

Clause 90. The process of any one of clauses 80 to 88, wherein the metal oxide infiltration step, the atomic layer deposition step, and/or the plasma reaction process step, are each independently performed for a number of cycles ranging between about 5 and about 10.

Clause 91. An optical component comprising the NIL grating of any one of clauses 1 to 21.

Clause 92. A method of forming the NIL grating of any one of clauses 1 to 21, the method comprising imprinting the NIL precursor material using a NIL process.

Clause 93: A process for making a nanoimprint lithography (NIL) grating comprising a ceramic material having a relative amount of carbon of about 10% or less, the process comprising: providing a precursor material comprising a base resin component and a plurality of nanoparticles, wherein (i) the base resin component is light-sensitive and comprises organic material and (ii) each respective nanoparticle in the plurality of nanoparticles comprises a substantially inorganic core and a substantially organic shell comprising one or more crosslinkable or polymerizable moieties; imprinting the precursor material into a precursor NIL grating; performing a curing step by subjecting the precursor NIL grating to a light source, thereby curing the precursor material; subjecting the precursor NIL grating to at least an increased temperature, such as for example subjecting the precursor NIL grating to oxidative conditions, wherein all or a portion of the organic material is removed from the precursor NIL grating; and infiltrating the precursor NIL grating with a ceramic material by performing an atomic layer deposition step, wherein the atomic layer deposition step infiltrates the precursor NIL grating with one or more inorganic material precursors and forms a deposition layer comprising the one or more inorganic materials, thereby making a NIL grating.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

EXAMPLES

Further described below are some examples of the NIL described herein, and related processes of making thereof. The examples are described for illustration purposes only and are not intended to be limiting. A person skilled in the art would understand that the composition of the various NIL materials may be varied and/or modified while achieving desired properties of the NIL materials, such as improved moldability or imprintability of the NIL material mixture, improved refractive index of the cured NIL material, low carbon content, etc. In some implementations, some components of the various NIL materials may be omitted or substituted, while additives or additional components may be included to modify the properties of the NIL material mixture and/or the final NIL material.

Shown in FIG. 1 is a simplified block diagram of an example artificial reality system environment including a near-eye display according to certain embodiments. FIG. 2 is a perspective view of an example near-eye display in the form of a head-mounted display (HMD) device for implementing some of the examples disclosed herein. FIG. 3 is a perspective view of an example near-eye display in the form of a pair of glasses for implementing some of the examples disclosed herein. FIG. 4 illustrates an example optical see-through augmented reality system using a waveguide display according to certain embodiments. FIG. 5. illustrates an example slanted grating coupler in an example waveguide display according to certain embodiments.

Shown in FIGS. 6A and 6B is an example process for fabricating a slanted surface-relief grating by molding according to certain embodiments. FIG. 6A shows a molding process. FIG. 6B shows a demolding process. FIGS. 7A-7D illustrate an example process for fabricating a soft stamp used to make a slanted surface-relief grating according to certain embodiments. FIG. 7A shows a master mold. FIG. 7B illustrates the master mold coated with a soft stamp material layer. FIG. 7C illustrates a lamination process for laminating a soft stamp foil onto the soft stamp material layer. FIG. 7D illustrates a delamination process, where the soft stamp including the soft stamp foil and the attached soft stamp material layer is detached from the master mold. FIGS. 8A-8D illustrate an example process for fabricating a slanted surface-relief grating using a soft stamp according to certain embodiments. FIG. 8A shows a waveguide coated with an imprint resin layer. FIG. 8B shows the lamination of the soft stamp onto the imprint resin layer. FIG. 8C shows the delamination of the soft stamp from the imprint resin layer. FIG. 8D shows an example of an imprinted slanted grating formed on the waveguide.

Shown in FIG. 9 is a simplified flow chart illustrating an example method of fabricating a slanted surface-relief grating using nanoimprint lithography according to certain embodiments.

Figure 10A:
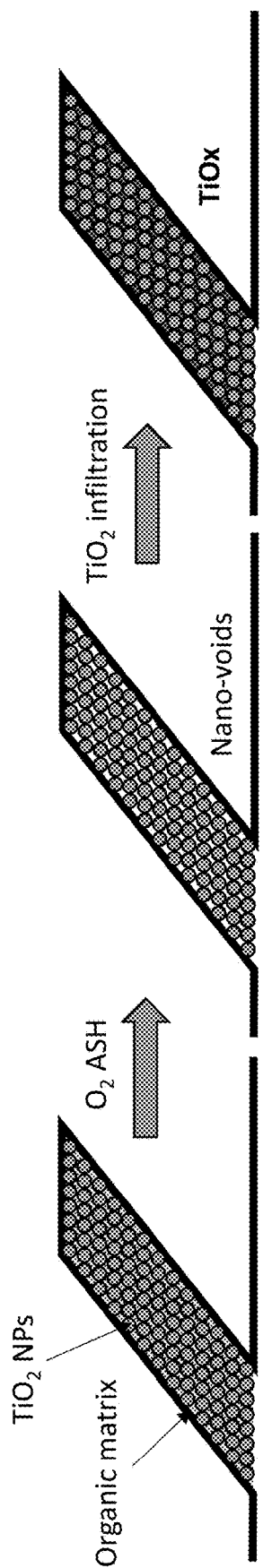
FIG. 10A illustrates a "burn-and-replace" method of fabricating a surface-relief structure according to certain embodiments. Fabrication of the surface-relief structure is performed by imprinting an organic or organic-inorganic matrix with high refractive index inorganic nanoparticles (e.g., titanium oxide ($TiO_2$)). Nanoparticles are mixed into the organic matrix at the highest possible loading or concentration that allows imprinting, and the mixture is imprinted (e.g., after cross-linking and lamination on a waveguide glass). A "burn" or "etch" step is performed to remove the organic matrix or resin, using oxygen plasma ("$O_2$ ASH"). The imprinted structure (e.g., wafer) is placed into a plasma tool that generates reactive oxygen species (e.g., $O_2$ radicals) in the form of a plasma (e.g., a gas) that infiltrates the structure and etches away the organic matrix within the imprinted structure, leaving a mesh or a lattice of nanoparticles interspersed with voids. The nanovoids are then optionally filled with an inorganic matrix (e.g., a high refraction index material such as titanium oxide) using atomic layer deposition (ALD) in thermal mode.

Shown in FIG. 10A is a "burn-and-replace" method of fabricating a surface-relief structure according to certain embodiments. Fabrication of the surface-relief structure is performed by imprinting an organic or organic-inorganic matrix with high refractive index inorganic nanoparticles (e.g., titanium oxide ($TiO_2$)). Nanoparticles are mixed into the organic matrix at the highest possible loading or concentration that allows imprinting, and the mixture is imprinted (e.g., after cross-linking and lamination on a waveguide glass). A "burn" or "etch" step is performed to remove the organic matrix or resin, using oxygen plasma ("$O_2$ ASH"). The imprinted structure (e.g., wafer) is placed into a plasma tool that generates reactive oxygen species (e.g., $O_2$ radicals) in the form of a plasma (e.g., a gas) that infiltrates the structure and etches away the organic matrix within the imprinted structure, leaving a mesh or a lattice of nanoparticles interspersed with voids. The nanovoids are then optionally filled with an inorganic matrix (e.g., a high refraction index material such as titanium oxide) using atomic layer deposition (ALD) in thermal mode. For example, in thermal mode ALD, an imprinted, etched structure is permeated by titanium oxide precursors, which are solidified by temperature treatment (e.g., approximately 50° C.). Titanium oxide is thus deposited around the nanoparticles within the lattice until the nanovoids are filled. In some alternative embodiments, ALD is performed using a plasma-enhanced reaction, rather than thermal mode, to deposit thin films of the inorganic matrix.

While the "burn-and-replace" method comprises additional steps of $O_2$ ASH and ALD over alternative methods of imprinting and curing, both $O_2$ ASH and ALD steps can be performed in batches, facilitating high-volume manufacturing. For example, in some embodiments, opposing sides of each imprinted wafer can be cheaply and rapidly processed in parallel for cassettes of up to 150 wafers at a time. In some embodiments, the method allows for a thin residual layer thickness in imprinted structures. In some embodiments, the method allows for refractive index tuning by modulating the amount of inorganic matrix (e.g., titanium oxide; RI=2.6) used to fill the nanovoids (e.g., by adjusting the proportion of nanoparticles and/or the extent of infiltration). By replacing the organic matrix in the imprinted structure with an inorganic matrix, the burn-and-replace method provides the ability to reach ultra-high refractive indices (e.g., higher than 2.0) of imprinted structures using any organic matrix with a refractive index of any value. Furthermore, the burn-and-replace method improves long-term stability of the surface-relief structure by obviating issues of robustness, reliability and/or yellowing due to photocatalytic sensitivity of the organic matrix to UV light or high-intensity display lights.

Figure 10C:
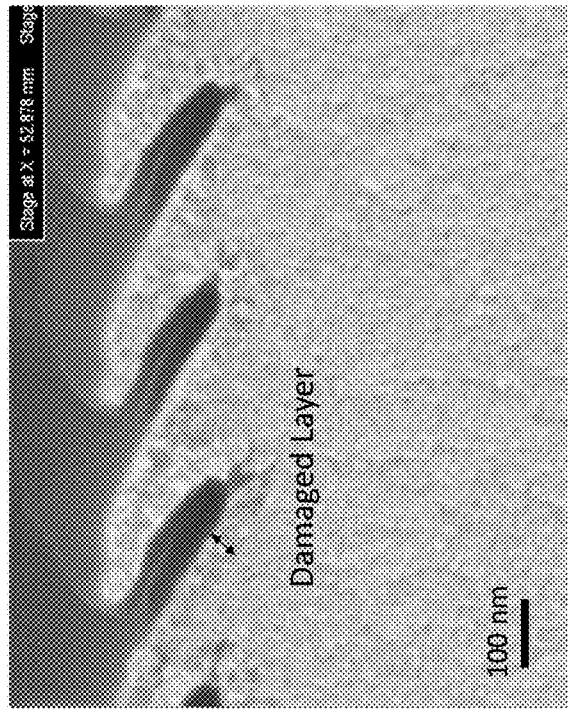
FIGS. 10B and C illustrate an example of a surface-relief structure after removal of organic matrix material by oxygen plasma ("$O_2$ ASH"), according to certain embodiments. Cross-sectional images illustrate an imprinted surface-relief structure before (FIG. 10B) and after (FIG. 10C) a 2 minute $O_2$ ASH step. The structure was prepared using a mixture of an organic-inorganic matrix UVA2, comprising an acrylate containing silicon and an ethyl lactate solvent, and zirconium oxide nanoparticles. Using an organic-inorganic matrix, the $O_2$ ASH step etches the organic portion of the matrix while leaving the inorganic portion of the matrix in place.
Figure 10B:
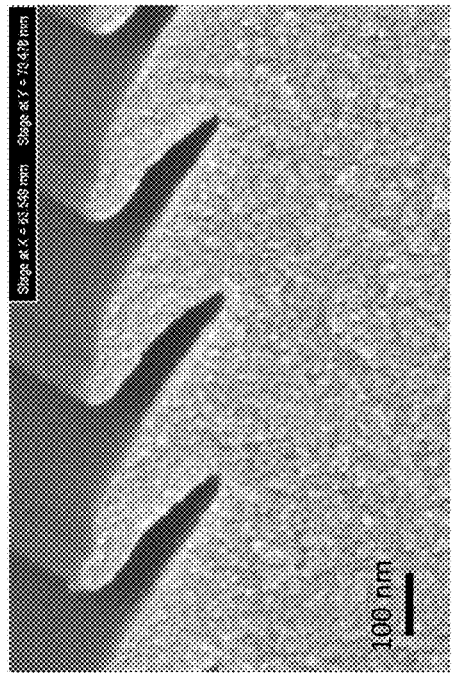

FIGS. 10B and C illustrate an example of a surface-relief structure after removal of organic matrix material by oxygen plasma ("$O_2$ ASH"), according to certain embodiments. Cross-sectional images illustrate an imprinted surface-relief structure before (FIG. 10B) and after (FIG. 10C) a 2 minute $O_2$ ASH step. The structure was prepared using a mixture of an organic-inorganic matrix UVA2, comprising an acrylate containing silicon and an ethyl lactate solvent, and zirconium oxide nanoparticles. Using an organic-inorganic matrix, the $O_2$ ASH step etches the organic portion of the matrix while leaving the inorganic portion of the matrix in place. The UVA2 matrix was loaded with 66% by weight zirconium oxide nanoparticles ("ZRPR"), with a final refractive index of 1.64. In FIG. 10C, a damaged layer is visible, denoted by the double-headed arrow. The damaged layer indicates the portion of the imprinted structure that was etched by the 2 minute $O_2$ ASH process. A porous or dappled appearance in the damaged layer indicates the presence of nanovoids following the removal of the organic component of the UVA2 matrix from the imprinted structure, compared to the neighboring region at the core of each nanostructure where a smooth appearance indicates incomplete plasma infiltration (e.g., an incomplete burn).

FIGS. 11A and 11B collectively illustrate an example of a surface-relief structure after removal of organic matrix material by oxygen plasma ($O_2$ ASH) and subsequent infiltration by inorganic matrix material, according to certain embodiments. In FIG. 11A, cross-sectional images illustrate an imprinted surface-relief structure before (left panel) and after (right panel) a 5 minute $O_2$ ASH step. The structure was prepared using a mixture of UVA2 and 66% by weight zirconium oxide nanoparticles, diluted to 20% in an ethyl lactate solvent prior to lamination. This dilution step allows for the preparation of a thinner film during the lamination step, such that the film can be easily imprinted leaving only a thin residual layer close to the substrate (e.g., a waveguide glass). The refractive index of the film, after evaporation of the solvent but before the $O_2$ ASH step, was 1.64.

The right panel of FIG. 11A illustrates a carbon-free, inorganic structure following a 5 minute $O_2$ ASH step. Whereas the longer burn step removes the organic matrix material throughout the interior of the nanostructure, the burn also results in shrinkage of the nanostructure that result from the introduction of nanovoids between the nanoparticles. Volumetric shrinkage was calculated by measuring the line width ("LW"), or the measurement of the width at the midpoint of the nanostructure, and the height of the nanostructure. LW and height measurements were taken before (LW: 190 nm (65%); height=167 nm) and after (LW: 144 nm (49%); height=148 nm) $O_2$ ASH, with a final shrinkage of 33%. In some embodiments, shrinkage of nanostructures can be modulated depending on the ratio of nanoparticles to matrix in the final resin composition.

In FIG. 11B, cross-sectional images illustrate the results of titanium oxide infiltration by ALD for nanostructures prepared by $O_2$ ASH as illustrated in FIG. 11A. Notably, a visual side-by-side comparison is inconclusive as to the extent of titanium oxide infiltration into the etched nanostructures. Other methods, such as elemental inspections, can be used to determine the extent of infiltration, assess the performance of the method and validate the results.

FIGS. 12A and 12B collectively illustrate the performance of an example method of fabricating a surface-relief structure according to certain embodiments. FIG. 12A is a transmission electron microscopy (TEM) image showing the cross-section of a surface-relief structure used for elemental analysis. The surface-relief structure was prepared using a mixture of UVA2 (comprising, e.g., an organic component comprising carbon and oxygen, and an inorganic component comprising silicon and oxygen) and zirconium oxide nanoparticles (comprising, e.g., an inorganic shell comprising zirconium and oxygen, and a ligand shell comprising carbon). The mixture was laminated, imprinted, and subjected to a titanium oxide infiltration step at approximately 50° C. without a prior $O_2$ ASH step (e.g., no burn step). The top and bottom layers (light gray/white and black, respectively) indicate deposits resulting from sample preparation for cross-sectioning and imaging.

FIG. 12B illustrates the cross-section of the surface-relief structure prepared and post-processed as in FIG. 12A, analyzed for a variety of elemental compositions. As described above for FIG. 12A, the mixture used for the surface-relief structure comprised an organic matrix component comprising carbon, oxygen, and silicon, and a nanoparticles component comprising zirconium, oxygen, and carbon. Elemental analysis revealed that the surface-relief structure comprised carbon (top left panel) and silicon (middle left panel) throughout the structure, indicating the presence of organic matrix. Oxygen (top right panel), provided by both the organic matrix and the nanoparticles, was also abundantly present. Finally, zirconium (bottom left panel) was abundantly present due to the high concentration of nanoparticles. Additional elements nitrogen and chlorine were measured as a control to detect noise, while elements iridium and platinum were also measured as a control. Titanium deposits were observed only on the surface of nanostructures, but not in the interior, which may suggest, without wishing to be bound by any particular theory, that the lack of a $O_2$ ASH burn step inhibited the efficacy of titanium oxide infiltration.

FIGS. 13A and 13B collectively illustrate the performance of an example method of fabricating a surface-relief structure according to certain embodiments. The elemental analysis performed in FIGS. 12A and 13B was plotted as an extracted line profile as percent relative composition across a demarcated cross-sectional region. FIG. 13A illustrates a rotated image of the slanted grating (e.g., the surface-relief structure) from FIG. 12A. The downward arrow denotes the region across which elemental analysis was performed, while the white dotted box denotes the region corresponding to the respective surface-relief structure. Notably, for comparison, elemental analysis was performed for regions both within and extending beyond the surface-relief structure.

FIG. 13B is a plot showing the elemental compositions for regions within (black dotted box, between approximately 50 nm and 250 nm) and extending beyond the nanostructure, corresponding to the regions denoted in FIG. 13A (white dotted box and arrow, respectively). The nanostructure comprises high levels of oxygen and carbon (approximately 45% and 30%, respectively), moderate levels of silicon and zirconium (approximately 15% and 10%, respectively), and negligible levels of titanium. These results indicate the presence of organic material and the lack of titanium oxide infiltration.

FIG. 14 is a simplified block diagram of an example electronic system of an example near-eye display according to certain embodiments.

FIG. 15 illustrates a cross-sectional view of an example nanoparticle, showing the structure of the nanoparticle in accordance with some embodiments. The inner sphere (light gray) represents a substantially inorganic core of the nanoparticle, having a radius indicated by $r_1$. The substantially inorganic core may be comprised of any inorganic material, including titanium oxide and/or zirconium oxide. The outer layer of the sphere (dark gray) represents a substantially organic shell, comprising one or more substantially organic ligands (e.g., crosslinkable or polymerizable moieties). The crosslinkable or polymerizable moieties may be covalently bonded to the substantially organic shell or linked to the substantially inorganic core of the nanoparticle. The radius of the nanoparticle, including both the substantially inorganic core and the substantially organic shell is represented by $r_2 = r_1 + l$.

The refractive index of a composite nanoparticle as illustrated in FIG. 15 can be estimated using the values for $r_1$, $r_2$ and the refractive indices of each component part of the nanoparticles applied to Rytov's formula $n_{NP} = \sqrt{\gamma_c n_c^2 + \gamma_l n_l^2}$, where $n_{NP}$ is the refractive index of the composite nanoparticle, $\gamma_c$ is the volume fraction of the substantially inorganic core $$\gamma_c = \frac{r_1^3}{(r_1 + l)^3},$$

$\gamma_l$ is the volume fraction of the substantially organic shell $$\gamma_l = \frac{l(l^2 + 3r_1 l + 3r_1^2)}{(r_1 + l)^3},$$

$n_c$ is the refractive index of the substantially inorganic core, and $n_l$ is the refractive index of the substantially organic shell.

For example, using Rytov's formula, the refractive index of a nanoparticle with a substantially inorganic core radius $r_1=5$ nm and a shell thickness $l=0.75$ nm has volume fractions of $\gamma_c=0.66$ and $\gamma_l=0.34$ for the core and the shell, respectively. Using these volume fractions and given refractive indices $n_c=2.5$ and $n_l=1.5$ for the inorganic core and the organic shell, respectively, then using Rytov's formula, the refractive index of the composite nanoparticle is $n_{NP}=2.21$.

Rytov's formula may be similarly applied to any composite nanoparticle to estimate the refractive index. For example, in a second example, given $n_c=2.5$, $n_l=1.5$, $r_1=5$ nm, and $l=0.5$ nm, then $\gamma_c=0.75$, $\gamma_l=0.25$, and $n_{NP}=2.29$. In a third example, given $n_c=2.5$, $n_l=1.5$, $r_1=5$ nm, and $l=1$ nm, then $\gamma_c=0.58$, $\gamma_l=0.42$, and $n_{NP}=2.14$.

FIGS. 16A and 16B illustrate a non-slanted grating 16A and a slanted grating 16B in accordance with some embodiments. In FIG. 16A, W denotes the width of a ridge (e.g., a nanostructure), and p denotes the grating period. The duty cycle is the ratio between the width of a ridge W and the grating period p. In FIG. 16B, $\alpha$ denotes the angle for the leading edge of a slanted grating, and $\beta$ denotes the angle for the trailing edge of the slanted grating. The slant angle (e.g., "Slant") is determined using the angle for the leading edge $\alpha$ and the angle for the trailing edge $\beta$, using the formula Slant=arctan[(tan($\alpha$)+tan($\beta$))*0.5].

FIGS. 17A and 17B collectively illustrate the performance of an example method of fabricating a surface-relief structure according to certain embodiments. FIG. 17A is a transmission electron microscopy (TEM) image showing the cross-section of a surface-relief structure used for elemental analysis. The surface-relief structure was prepared using a mixture of UVA2 (comprising, e.g., an organic component comprising carbon and oxygen, and an inorganic component comprising silicon and oxygen) and titanium oxide nanoparticles (comprising, e.g., an inorganic shell comprising titanium and oxygen, and a ligand shell comprising carbon). The mixture was laminated, imprinted, and subjected to an $O_2$ ASH step (e.g., a burn step) prior to a titanium oxide ALD infiltration step at approximately 50° C. The top and bottom layers (light gray/white and black, respectively) indicate deposits resulting from sample preparation for cross-sectioning and imaging. The cross-section of the surface-relief structure shows damage throughout the majority of the nanostructures, as well as a small triangular portion in the center base of each nanostructure that exhibits a darker, denser appearance compared to the surrounding regions. The triangular portion indicates incomplete removal of the organic material during the burn step.

FIG. 17B illustrates the cross-section of the surface-relief structure prepared and post-processed as in FIG. 17A, analyzed for a variety of elemental compositions. As described above for FIG. 17A, the mixture used for the surface-relief structure comprised an organic matrix component comprising carbon, oxygen, and silicon, and a nanoparticles component comprising titanium, oxygen, and carbon. Elemental analysis revealed that the surface-relief structure comprised only trace amounts of carbon (top left panel) and silicon (middle left panel) throughout the structure, indicating near-complete removal of organic matrix in all regions except for the center base of each nanostructure. Oxygen (top right panel), provided by both the organic matrix and the nanoparticles, was also abundantly present. Finally, titanium (bottom left panel) was abundantly present throughout each nanostructure, due in part to the existing titanium oxide nanoparticles component and any subsequent titanium oxide infiltration deposited by ALD. Notably, the intensity of titanium and oxygen signals are diminished slightly in the center base of each nanostructure where incomplete burn was observed, indicating, without wishing to be bound by any particular theory, that the enhanced intensity of these signals in the surrounding regions of each nanostructure are due to successful titanium oxide infiltration during the ALD step, and not merely due to the existence of titanium oxide nanoparticles throughout the matrix. Additional elements zirconium and platinum were measured as a control to detect noise and nanolithography-coated structures, respectively.

FIGS. 18A and 18B collectively illustrate the performance of an example method of fabricating a surface-relief structure according to certain embodiments. The elemental analysis performed in FIGS. 17A and 17B was plotted as an extracted line profile as percent relative composition across a demarcated cross-sectional region. FIG. 18A illustrates a rotated image of the slanted grating (e.g., the surface-relief structure) from FIG. 17A. The transverse arrow denotes the region across which elemental analysis was performed, while the white dotted box denotes the region corresponding to the respective surface-relief structure. Notably, for comparison, elemental analysis was performed for regions both within and extending beyond the surface-relief structure.

FIG. 18B is a plot showing the elemental compositions for regions within (black dotted box, between approximately 60 nm and 400 nm) and extending beyond the nanostructure, corresponding to the regions denoted in FIG. 17A (white dotted box and arrow, respectively). The nanostructure comprises high levels of oxygen and titanium (approximately 55% and 30%, respectively), moderate-to-low levels of silicon and carbon (approximately 10% and 5%, respectively). These results indicate the removal of most organic material, save trace amounts of carbon, which has been replaced by the inorganic titanium oxide matrix. The refractive index of the resulting inorganic surface-relief grating after the burn-and-replace method measured approximately 2.1 at 460 nm, highlighting the ability of the burn-and-replace method to produce ultra-high (e.g., higher than 2.0) refractive index surface-relief structures that are composed primarily of inorganic material and thus are more resistant to photocatalytic effects.

FIG. 19A illustrates perfect packing density and random packing density of nanoparticles in surface-relief structures according to certain embodiments. Perfect packing, or the maximum packing density possible for a plurality of spheres of uniform diameter in a 3-dimensional space (e.g., in a lattice structure), is a volume percentage of 74%. The remaining 26% of the volume is comprised of surrounding matrix (e.g., air voids, resin, etc.). Alternately, random packing achieves volume percentages of 64% and 36% for spheres and voids, respectively.

To determine the refractive index of a composite material comprising spheres and a surrounding matrix, Rytov's formula can be applied using the volume fractions of the spheres and voids, respectively, as in $n_{NP}=\sqrt{\gamma_c n_c^2 + \gamma_l n_l^2}$, where $n_{NP}$ is the refractive index of the composite material, $\gamma_c$ is the volume fraction of the spheres, $\gamma_l$ is the volume fraction of the voids, $n_c$ is the refractive index of the spheres, and $n_l$ is the refractive index of the voids. Two example calculations of the theoretical limits of refractive indices are given under varying packing conditions in FIG. 19B. In a first example, a thin film of perfectly packed nanoparticles is prepared (e.g., prepared by spin-coating or laminating), resulting in a lattice of nanoparticles having a maximum refractive index of 2.21 (as described in FIG. 15) and a surrounding matrix of air voids with a refractive index of 1. Using Rytov's formula, the refractive index of the resulting perfectly-packed film is 1.97. Alternately, in a second example, a thin film of randomly packed nanoparticles prepared under the same conditions has a refractive index of 1.87.

An experimental validation was performed using inorganic titanium oxide nanoparticles with a refractive index of 2.21. Nanoparticles were mixed with solvent only and the mixture was used to prepare a film. After evaporation of the solvent, the film was imaged and the refractive index was measured using an ellipsometer. The transmission electron microscopy (TEM) image shows the packing density of the resulting film, which indicates some regions of densely packed nanoparticles (e.g., perfect packing) interspersed with regions comprising large voids between nanoparticles (e.g., random packing). The refractive index of the film was determined to be 1.90, falling between the theoretical limits for perfect packing and random packing and validating observations that the film comprised a mixture of perfectly packed and randomly packed regions.

FIG. 20 illustrates an experimental validation of a theoretical model for nanoparticle packing density using energy dispersive spectroscopy (EDS) to measure infiltration, according to certain embodiments. Using the burn-and-replace method and Rytov's formula to estimate refractive index of a composition of nanoparticles (e.g., titanium oxide at 2.21) and surrounding matrix (e.g., an example resin at 1.6), it can be concluded that by replacing an existing surrounding matrix with a material having a higher refractive index (e.g., an inorganic matrix), it is possible to increase the overall refractive index of the total composition. To that end, a theoretical volume fraction of replacement material (e.g., inorganic matrix) deposited by atomic layer deposition (ALD) was estimated, in order to calculate the expected increase in refractive index.

Maximum refractive index estimations are typically based on the assumption that ALD growth cannot be thicker than 7.75% of the nanoparticle diameter. The volume fraction of a 7.75% ALD shell relative to the volume of the core is given by the formula $$\frac{V_{ALDshell}}{V_{core}} = \frac{(r*1.075)^3 - r^3}{r^3} = 24.2\%,$$

irrespective of the nanoparticle diameter.

For imperfect or random nanoparticle packing, as described and experimentally shown in FIG. 19, it was theorized that a volume greater than 24.2% could be infiltrated due to the increased presence of voids between nanoparticles. An experiment was performed using zirconium oxide nanoparticles with a core radio of 2.36 nm. Titanium oxide deposition onto the nanoparticles for 7 cycles of ALD was estimated to have a growth rate of 1.516 Å/cycle. The resulting nanoparticle shell was thus estimated to be 1.06 nm, comprising 67% volume relative to the nanoparticle core. The theoretical estimation of the volume percentage of titanium oxide to zirconium oxide was therefore 67%.

The actual volume fraction of the deposited titanium oxide to the zirconium oxide nanoparticles was subsequently experimentally determined by EDS and compared to the theoretical estimation. As shown in the cross-sectional plots and in the elemental mapping plots, titanium oxide infiltration into the nanostructures was clearly visible, though originally primarily composed to zirconium oxide nanoparticles. The percent concentration of zirconium was 14.3, while the percent concentration of titanium was 9.31, or 66% of the zirconium core. These measurements closely fit the estimated model and validate the ability of the presently disclosed method to increase the refractive index of the surface-relief structure above conventionally estimated limits.

FIG. 21 illustrates an experimental validation of a theoretical model for nanoparticle packing density using ellipsometer measurements to determine refractive index, according to certain embodiments. An organic matrix UVA2 was combined with 66% by weight zirconium oxide nanoparticles and used to prepare a film. The film was cured and subjected to a 5 minute $O_2$ ASH step to remove the organic material, followed by 7 cycles of atomic layer deposition (ALD) of titanium tetrachloride ($TiCl_4$) plus $H_2O$ for a deposition layer of approximately 1 nm. The refractive index of the film at each step was theoretically estimated as well as experimentally measured using an ellipsometer. At each step, the model was found to match closely with the experimental data. For example, the predicted and the measured refractive index of the film prior to $O_2$ ASH was 1.65 and 1.64, respectively, the predicted and measured refractive index after $O_2$ ASH but prior to ALD was 1.55 and 1.54, respectively, and the predicted and measured refractive index after ALD was 1.803 and 1.805, respectively. Error for each comparison was less than 0.6%. The data illustrated in FIG. 21 provide a robust framework for the model to be used in designing and fabricating surface-relief structures for waveguides. Furthermore, the data experimentally demonstrates a refractive index increase from 1.64 to 1.80 using the burn-and-replace method for zirconium oxide nanoparticles and 7 ALD cycles.

FIG. 22 shows the data used as inputs for the theoretical model used in FIGS. 20-21C according to certain embodiments.

FIGS. 23A and 23B collectively illustrate the predicted refractive index of a surface-relief structure fabricated using $TiO_2$ nanoparticles, according to certain embodiments. Using the partially verified model described in FIG. 21, the estimation was calculated for titanium oxide nanoparticles with a diameter of 10 nm combined with UVA2 to a final ratio of 66% by weight, an expected ALD deposit growth rate of 1.516 Å/cycle, and an expected maximum growth of 0.75 nm over 5 cycles. Refractive index estimations were calculated for each step in the burn-and-replace method, including $O_2$ ASH and ALD, with approximately 33% shrinkage anticipated following the $O_2$ ASH step. The model predicted a maximum refractive index of 2.02 for a composite film after using the burn-and-replace method, increased from an expected 1.82. These results suggest the ability to use the burn-and-replace method to improve refractive index during the fabrication of surface-relief structures.

The invention claimed is:

1. A nanoimprint lithography (NIL) grating comprising a ceramic material having a relative amount of carbon of about 10% or less.

2. The NIL grating of claim 1, wherein the relative amount of carbon in the ceramic material is about 9% or less, about 8% or less, about 7% or less, about 6% or less, about 5% or less, about 4% or less, about 3% or less, about 2% or less, or about 1% or less.

3. The NIL grating of claim 1, wherein the ceramic material is substantially free of organic material.

4. The NIL grating of claim 1, wherein ceramic material comprises one or more of titanium oxide, zirconium oxide, hafnium oxide, tungsten oxide, zinc tellurium, gallium phosphide, or any combination or derivative thereof.

5. The NIL grating of claim 1, wherein the grating has a duty cycle ranging from 10% to 90%.

6. The NIL grating of claim 1, wherein the grating has a duty cycle ranging from 30% to 90%.

7. The NIL grating of claim 1, wherein the grating is a non-slanted grating.

8. The NIL grating of claim 1, wherein the grating is a slanted grating.

9. The NIL grating of claim 8, wherein a slant angle ranges from more than 0° to about 70°.

10. The NIL grating of claim 8, wherein a slant angle is greater than 30°.

11. The NIL grating of claim 1, wherein the grating has a depth from 30 nm to 450 nm.

12. The NIL grating of claim 1, wherein the grating has a depth from 50 nm to 350 nm.

13. The NIL grating of claim 1, wherein the grating has a depth from 75 nm to 250 nm.

14. The NIL grating of claim 1, wherein the grating has a depth greater than 100 nm and lower than 500 nm.

15. The NIL grating of claim 1, wherein the grating has an aspect ratio from 0.5:1 to 6:1.

16. The NIL grating of claim 1, wherein the grating has an aspect ratio from 1:1 to 5:1.

17. The NIL grating of claim 1, wherein the grating has an aspect ratio greater than 3:1 and lower than 8:1.

18. The NIL grating of claim 1, wherein the ceramic material has a refractive index ranging from 1.90 to 2.25.

19. The NIL grating of claim 1, wherein the refractive index is measured at 460 nm.

20. An optical component comprising the NIL grating of claim 1.

* * * * *